United States Patent
Kong et al.

(10) Patent No.: US 12,156,413 B2
(45) Date of Patent: Nov. 26, 2024

(54) ORGANIC SOLAR CELLS AND METHODS OF MAKING THE SAME

(71) Applicants: NEW YORK UNIVERSITY, New York, NY (US); YALE UNIVERSITY, New Haven, CT (US)

(72) Inventors: Jaemin Kong, New Haven, CT (US); Francisco Antonio, New Haven, CT (US); Andre Taylor, Brooklyn, NY (US)

(*) Notice: Subject to any disclaimer, the term of this patent is extended or adjusted under 35 U.S.C. 154(b) by 0 days.

(21) Appl. No.: 16/831,146

(22) Filed: Mar. 26, 2020

(65) Prior Publication Data

US 2020/0313104 A1 Oct. 1, 2020

Related U.S. Application Data

(60) Provisional application No. 62/824,083, filed on Mar. 26, 2019.

(51) Int. Cl.
| | |
|---|---|
| *H10K 30/30* | (2023.01) |
| *H01L 31/0236* | (2006.01) |
| *H01L 31/048* | (2014.01) |
| *H01L 31/18* | (2006.01) |
| *H10K 30/20* | (2023.01) |
| *H10K 30/50* | (2023.01) |
| *H10K 30/82* | (2023.01) |

(52) U.S. Cl.
CPC ....... *H10K 30/30* (2023.02); *H01L 31/02363* (2013.01); *H01L 31/1864* (2013.01); *H10K 30/20* (2023.02); *H10K 30/50* (2023.02); *H01L 31/0481* (2013.01); *H10K 30/82* (2023.02)

(58) Field of Classification Search
CPC ............. H01L 51/0045; H01L 51/0046; H01L 51/424; H01L 51/442; H01L 31/02363; H10K 30/82; H10K 30/20; H10K 30/30; H10K 30/50
See application file for complete search history.

(56) References Cited

U.S. PATENT DOCUMENTS

2012/0097249 A1* 4/2012 Klenkler ................ H10K 30/20
136/263

OTHER PUBLICATIONS

Pan, Qing-Qing et al.; "Exploring what prompts ITIC to become a superior acceptor in organic solar cell by combining molecular dynamics simulation with quantum chemistry calculation"; Phys. Chem. Chem. Phys., 2017, 19, 31227-31235 (Year: 2017).*

(Continued)

*Primary Examiner* — Lindsey A Buck
(74) *Attorney, Agent, or Firm* — Riverside Law LLP

(57) ABSTRACT

Described is an active layer having a first surface region and a bulk region, the active layer comprising a small molecule component and a polymer component, wherein the relative concentration of the small molecule component is lower in the first surface than in the bulk region. Also described is a method of producing a surface-modified active layer comprising the steps of providing a pristine active layer comprising a small molecule component and a polymer component; applying an adhesive to the exposed surface of the pristine active layer to produce an adhesive-bound active layer; and removing the adhesive from the adhesive-bound active layer, and a method of producing electrical energy from sunlight, such as sunlight deposited over bodies of water.

12 Claims, 30 Drawing Sheets

(56) References Cited

OTHER PUBLICATIONS

Wang, Ing-Jye et al.; Improvement of inverted-type organic solar cells by mild oxygen plasma etching on polymer thin film; Solar Energy Materials & Solar Cells, 94, (2010), 1681-1685 (Year: 2010).*

Bao, et al., Oxygen☐ and Water☐Based Degradation in [6,6]☐Phenyl☐C61☐Butyric Acid Methyl Ester (PCBM) Films Adv. Energy Mater. 2014, 4 (6), 1301272, 7 pages.

Beaujuge, et al., Color Control in π-Conjugated Organic Polymers for Use in Electrochromic Devices, Chem. Rev. 2010, 110 (1), 268-320.

Carlé, et al., Overcoming the Scaling Lag for Polymer Solar Cells, Joule 2017, 1 (2), 274-289.

Distler, et al., Effect of PCBM on the Photodegradation Kinetics of Polymers for Organic Photovoltaics, J. Chem. Mater. 2012, 24 (22), 4397-4405.

Dupont, et al., Controlling Interdiffusion, Interfacial Composition, and Adhesion in Polymer Solar Cells, Adv. Mater. Interfaces 2014, 1 (7), 1400135, 8 pages.

Hansson, et al., Photo-degradation in air of the active layer components in a thiophene-quinoxaline copolymer:fullerene solar cell, Phys. Chem. Chem. Phys. 2016, 18, 11132-11138.

Hou, et al., Organic solar cells based on non-fullerene acceptors, Nat. Mater. 2018, 17 (2), 119-128.

Kim, T., et al., Flexible, highly efficient all-polymer solar cells, Nature Communications vol. 6, Article No. 8547 (2015) 7 pages.

Lee, et al., Air☐Stable Organic Solar Cells Using an Iodine☐Free Solvent Additive, Adv. Energy Mater. 2016, 6 (21), 1600970, 9 pages.

Lipomi, D. J., Tee, B. C.-K., Vosgueritchian, M., & Bao, Z. (2011). Stretchable Organic Solar Cells. Advanced Materials, 23(15), 1771-1775.

Liu, Z., You, P., Liu, S., & Yan, F. (2015). Neutral-Color Semi-transparent Organic Solar Cells with All-Graphene Electrodes. ACS Nano, 9(12), 12026-12034.

Norrman, et al., Degradation Patterns in Water and Oxygen of an Inverted Polymer Solar Cell, J. Am. Chem. Soc. 2010, 132 (47), 16883-16892.

Reese, et al., Photoinduced Degradation of Polymer and Polymer-Fullerene Active Layers: Experiment and Theory, Adv. Funct. Mater. 2010, 20 (20), 3476-3483.

Ying, et al., Regioregular narrow-bandgap-conjugated polymers for plastic electronics, Nat. Commun. 2017, 8, 14047, 13 pages.

* cited by examiner

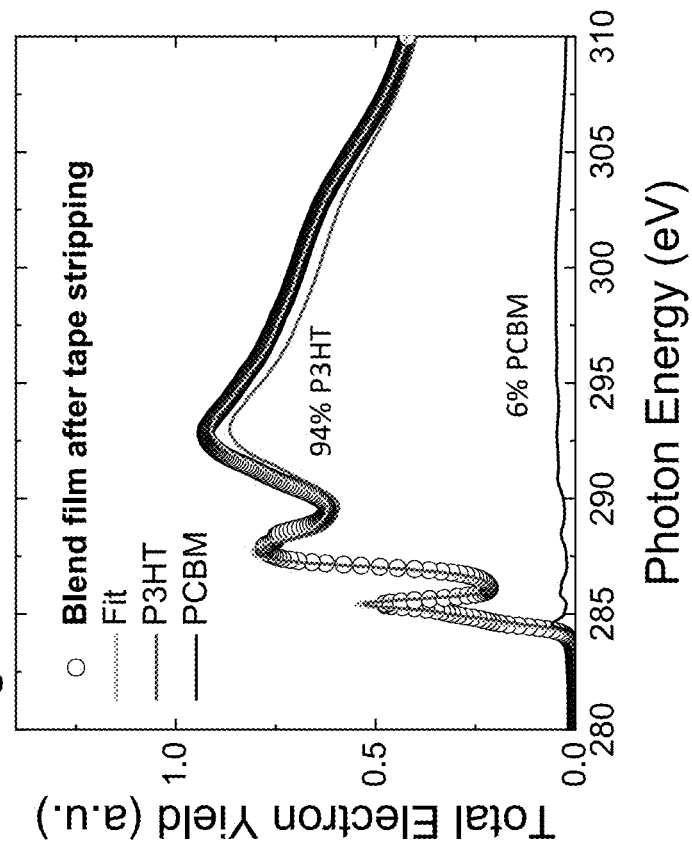
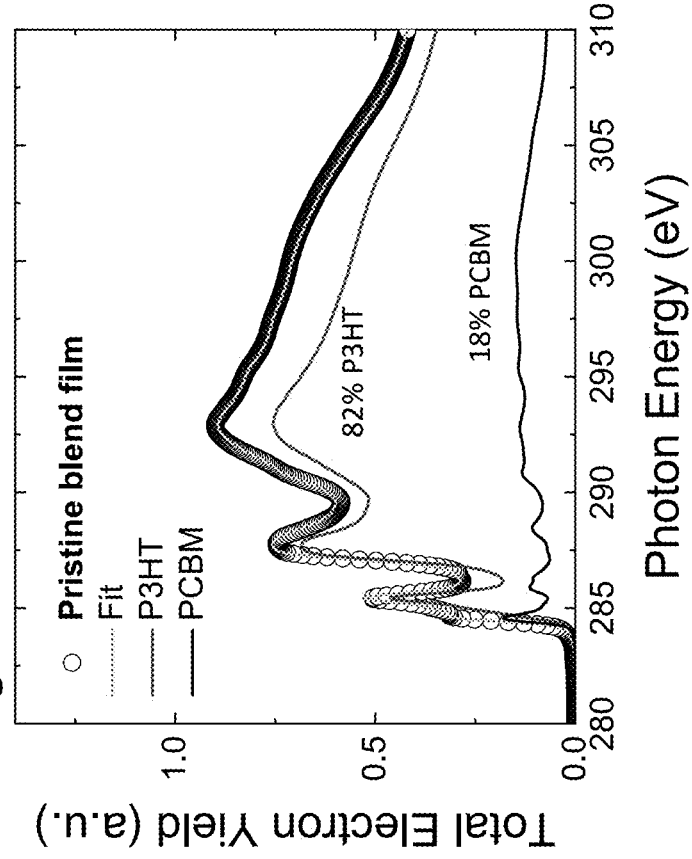
Fig. 6A
Fig. 6B

PBDB-T

IT-M

ORGANIC SOLAR CELLS AND METHODS OF MAKING THE SAME

CROSS-REFERENCE TO RELATED APPLICATIONS

The present application claims priority to U.S. Provisional Application No. 62/824,083, filed Mar. 26, 2019, which is incorporated by reference herein in its entirety.

BACKGROUND OF THE INVENTION

The emergence of new technologies such as flexible and ubiquitous devices demands that peripheral device units must conform to their various geometrical form factors while enduring harsh environments such as physical impact and water ingression (Owens, et al., Ieee Phot. Spec. Conf. 2015, 8, 2585-2587; Zhang, et al., Sci. Rep. 2017, 7, 1305; Mölken, et al., Energy Procedia 2012, 27, 167-172; Fairbrother, et al., Solar Energy 2018, 163, 62-69; Adams, et al., Adv. Energy Mater. 2015, 5 (20), 1501065; Schubert, et al., Materials Today 2006, 9 (6), 42-50; Ye, et al., J. Mater. Chem. A 2016, 4, 6755-6771). The same holds true for next generation solar cells which are deployable onto building surfaces or appliances without detracting from the main body aesthetics. From this perspective, organic solar cells (OSCs) are a promising solution because the main photoactive components, such as conjugated polymers, are intrinsically flexible and lightweight compared to those of conventional inorganic materials (Lipomi, et al., Adv. Mater. 2011, 23 (15), 1771-1775; Kim, et al., Nat. Commun. 2015, 6, 8547; Zheng, et al., Materials Today, 2018, 21 (1), 79-87; Goh, et al., Adv. Energy Mater. 2016, 6 (21), 1600660). In addition, the band gap of organic materials can be synthetically tuned by introducing various moieties in the backbone and/or the side chains of the molecules, which consequently enable the solar cells to be tuned in color (Liu, et al., ACS Nano 2015, 9 (12), 12026-12034; Kong, et al., Nano Energy 2017, 38, 36-42; Ying, et al., Nat. Commun. 2017, 8, 14047; Beaujuge, et al., Chem. Rev. 2010, 110 (1), 268-320).

Despite these advantages, the practical application of OSCs to existing and/or upcoming technologies has been stymied due to the low reliability under ambient conditions where solar cells typically are deployed (Carlé, et al., Joule 2017, 1 (2), 274-289; Norrman, et al., J. Am. Chem. Soc. 2010, 132 (47), 16883-16892; Reese, et al., Adv. Funct. Mater. 2010, 20 (20), 3476-3483).

There remains a need in the art for improved organic solar cells which can withstand ambient conditions. The present invention addresses this unmet need.

SUMMARY OF THE INVENTION

In one aspect, the present invention relates to an active layer comprising having a first surface, a bulk region and a second surface, the active layer comprising at least one small molecule component and at least one polymer component, wherein the weight ratio of the at least one small molecule component to the at least one polymer component is lower on the first surface than in the bulk region. In one embodiment, the weight ratio of the at least one small molecule component to at least one polymer component on the first surface is between 15:85 and 1:99. The present invention also relates to a submersible photovoltaic device comprising the active layer.

In one embodiment, the at least one small molecule component comprises a fullerene derivative. In one embodiment, the at least one small molecule component comprises an n-type small molecule selected from the group consisting of 3,9-bis(2-methylene-(3-(1,1-dicyanomethylene)-indanone))-5,5,11,11-tetrakis(4-hexylphenyl)-dithieno[2,3-d:2',3'-d']-s-indaceno[1,2-b:5,6-b']dithiophene (ITIC), 3,9-bis(2-methylene-((3-(1,1-dicyanomethylene)-6/7-methyl)-indanone))-5,5,11,11-tetrakis(4-hexylphenyl)-dithieno[2,3-d:2',3'-d']-s-indaceno[1,2-b:5,6-b']dithiophene (IT-M or ITIC-M), 3,9-bis(2-methylene-(3-(1,1-dicyanomethylene)-indanone))-5,5,11,11-tetrakis(5-hexylthienyl)-dithieno[2,3-d:2',3'-d']-s-indaceno[1,2-b:5,6-b']dithiophene (ITIC-Th), 3,9-bis(2-methylene-((3-(1,1-dicyanomethylene)-6,7-difluoro)-indanone))-5,5,11,11-tetrakis(4-hexylphenyl)-dithieno[2,3-d:2',3'-d' ]-s-indaceno[1,2-b: 5,6-b']dithiophene (ITIC-2F), and 3,9-bis(2-methylene-((3-(1,1-dicyanomethylene)-6,7-dimethyl)-indanone))-5,5,11,11-tetrakis(4-hexylphenyl)-dithieno[2,3-d:2',3'-d']-s-indaceno[1,2-b:5,6-b']dithiophene (ITIC-DM).

In one embodiment, the at least one polymer component comprises an electron donor polymer. In one embodiment, the at least one polymer component is selected from the group consisting of poly(3-hexylthiophene) (P3HT), poly[4,8-bis-(2-ethyl-hexyl-thiophene-5-yl)-benzo[1,2-b:4,5-b']dithiophene-2,6-diyl]-alt-[2-(2'-ethyl-hexanoyl)-thieno[3,4-b]thiophen-4,6-diyl](PBDTTT-CT), poly[N-9'-hepta-decanyl-2,7-carbazole-alt-5,5-(4',7'-di-2-thienyl-2',1',3'-enzothiadiazole)] (PCDTBT), poly[6-fluoro-2,3-bis-(3-octyloxyphenyl) quinoxaline-5,8-diyl-alt-thiophene-2,5-diyl] (FTQ), poly(3-octylthiophene) (P3 T), poly(3-hexyloxythiophene) (P3DOT), poly(3-methylthiophene) (PMeT), poly(3-dodecylthiophene) (P3DDT), poly(3-dodecylthienylenevinylene) (PDDTV), poly(3,3 dialkylquarterthiophene) (PQT), poly-dioctyl-fluorene-co-bithiophene (F8T2), Poly[[4,8-bis[(2-ethylhexyl)oxy]benzo[1,2-b:4,5-b']dithiophene-2,6-diyl][3-fluoro-2-[(2-ethylhexyl)carbonyl]thieno[3,4-b]thiophenediyl]](PTB7), poly-(2,5,-bis(3-alkylthiophene-2-yl)thieno[3,2-b]thiophene) (PBTTT-C12), poly[2,7-(9,9'-dihexylfluorene)-alt-2,3-dimethyl-5,7-dithien-2-yl-2,1,3-benzothiadiazole](PFDDTBT), poly {[2,7-(9, 9-bis-(2-ethylhexyl)-fluorene)]-alt-[5,5-(4,7-di-20-thienyl-2,1,3-benzothiadiazole)]} (BisEH-PFDTBT), poly {[2,7-(9, 9-bis-(3,7-dimethyl-octyl)-fluorene)]-alt-[5,5-(4,7-di-20-thienyl-2,3-benzothiadiazole)]} (BisDMO-PFDTBT), poly [N-9'''-hepta decanyl-2,7-carbazole-alt-5,5-(4',7'-di-2-thienyl-2',1',3'-benzothiadiazole)](PCDT3BT), poly[4,8-bis-substituted-benzo[1,2-b:4,5-b']dithiophene-2,6-diyl-alt-4-substituted-thieno[3,4-b]thio-phene-2,6-diyl] (PBDTTT-C-T), Poly(benzo[1,2-b:4,5-b']dithiophene-alt-thieno[3,4-c]pyrrole-4,6-dione (PBDTTPD), poly((4,4-dioctyldithieno(3, 2-b:2',3'-d)silole)-2,6-diyl-alt-(2,1,3-benzothiadiazole)-4,7-diyl) (PSBTBT), poly[(2,6-(4,8-bis(5-(2-ethylhexyl)thiophen-2-yl)-benzo[1,2-b:4,5-b']dithiophene))-alt-(5,5-(1',3'-di-2-thienyl-5',7'-bis(2-ethylhexyl)benzo[1',2'-c:4',5'-c']dithiophene-4,8-dione)]) (PBDB-T), poly[4,8-bis(5-(2-ethylhexyl)thiophen-2-yl)benzo[1,2-b;4,5-b']dithiophene-2,6-diyl-alt-(4-(2-ethylhexyl)-3-fluorothieno[3,4-b]thiophene-)-2-carboxylate-2-6-diyl)] (PTB7-Th), poly[(5,6-difluoro-2,1,3-benzothiadiazol-4,7-diyl)-alt-(3,3'''-di(2-octyldodecyl)-2,2',5',2'',5'',2'''-quaterthiophen-5,5'''-diyl)] (PffBT4T-20D), poly[(2,5-bis(2-hexyldecyloxy)phenylene)-alt-(5,6-difluoro-4,7-di(thiophen-2-yl)benzo[c]-[1,2,5]thiadiazole)] (PPDT2FBT), Poly[2-(5-(4,8-bis(5-((2-butyloctyl)thio)thiophen-2-yl)benzo[1,2-b:4,5-b']dithiophen-2-yl)-4-octylthiophen-2-yl)-5-(4-octylthiophen-2-yl)-1,3,4-thiadiazole] (PBDTS-TDZ), Poly[2,5-(2-decyltetradecyl)-3,6-diketopyrrolopyrrole-alt-5,5-(2,5-di(thien-2-yl)thieno[3,2-b]thiophene)] (PDPPTT), Poly[2,5-(2-octyldodecyl)-3,6- diketopyrrolopyrrole-alt-5,5-(2,5-di(thien-2-yl)thieno [3,2-b]thiophene)] (PDPP2T-TT-OD), and poly{1-(5-(4,8-bis((2-ethylhexyl)oxy)-6-methylbenzo[1,2-b:4,5-b0] dithiophen-2-yl)thiophen-2-yl)-5,7-bis-(2-ethylhexyl)-3-(5-methylthiophen-2-yl)benzo[1,2-c:4,5-c0]dithiophene-4,8-dione} (PDBD-O).

In another aspect, the present invention relates to a photovoltaic device comprising: a transparent or semi-transparent first electrode; an active layer of the present invention disposed over the first electrode; and a second electrode disposed over the first surface region of the active layer. In one embodiment, the photovoltaic device further comprises a charge transporting material between the second electrode and the first surface of the active layer. In one embodiment, the photovoltaic device maintains at least 80% of its power conversion efficiency (PCE) after 9,000 bend cycles under water at a bending radius of 15 mm.

In another aspect, the present invention relates to a method of converting sunlight deposited over bodies of water into electrical energy, the method comprising the steps of: providing a photovoltaic device of the present invention; submerging the photovoltaic device under water; and producing electrical energy using the submerged photovoltaic device. In one embodiment, the step of submerging the photovoltaic device under water further comprises the step of attaching the photovoltaic device to a submersible surface.

In another aspect, the present invention relates to a method of preparing a surface-modified active layer, the method comprising the steps of: providing a pristine active layer comprising a small molecule component and a polymer component; applying an adhesive to the exposed surface of the pristine active layer to produce an adhesive-bound active layer; and removing the adhesive from the adhesive-bound active layer. In one embodiment, the method further comprises the step of applying a pressure of between 100 Pa and 1000 Pa to the adhesive. In one embodiment, the method further comprises the step of heating the adhesive-bound active layer. In one embodiment, the adhesive-bound active layer is heated to a temperature of at least 50° C. In one embodiment, the step of removing the adhesive from the adhesive-bound active layer further comprises the step of removing at least a portion of the small molecule component from the surface of the pristine active layer. In one embodiment, the step of removing the adhesive from the adhesive-bound active layer further comprises the step of removing between 50% and 70% of the small molecule component from the surface of the pristine active layer. The present invention also relates to a surface-modified active layer produced by this method and to a photovoltaic device or an organic light-emitting diode comprising said surface-modified active layer.

BRIEF DESCRIPTION OF THE DRAWINGS

The following detailed description of preferred embodiments of the invention will be better understood when read in conjunction with the appended drawings. For the purpose of illustrating the invention, there are shown in the drawings embodiments which are presently preferred. It should be understood, however, that the invention is not limited to the precise arrangements and instrumentalities of the embodiments shown in the drawings.

FIG. 6A depicts NEXAFS spectra collected at 55° for a pristine blend film, and the fitting curves with scaled component spectra.

FIG. 6B depicts NEXAFS spectra collected at 55° for a blend film after the tape stripping process, and the fitting curves with scaled component spectra.

FIG. 8A is a phase image of a pristine blend film after a tape stripping process. FIG. 8B is a phase image of a blend film after a tape stripping process. FIG. 8C is a surface topology image of a pristine blend film after a tape stripping process. FIG. 8D is a surface topology image of a blend film after a tape stripping process. FIG. 8E is a depth histogram and bearing area ratio curve of the surface topologies of a pristine blend film. FIG. 8F of is a depth histogram and bearing area ratio curve of the surface topologies of a blend film after a tape stripping process.

FIG. 10A depicts the structure Glass/ITO/ZnO/Pristine P3HT:PCBM/($V_2O_5$ or no HTL)/Ag. FIG. 10B depicts the structure Glass/ITO/ZnO/surface-PCBM removed P3HT:PCBM/($V_2O_5$ or no HTL)/Ag. FIG. 10C depicts the structure Glass/ITO/ZnO/PCBM/($V_2O_5$ or no HTL)/Ag. FIG. 10D depicts the structure Glass/ITO/ZnO/P3HT/($V_2O_5$ or no HTL)/Ag.

DETAILED DESCRIPTION

Figure 1:
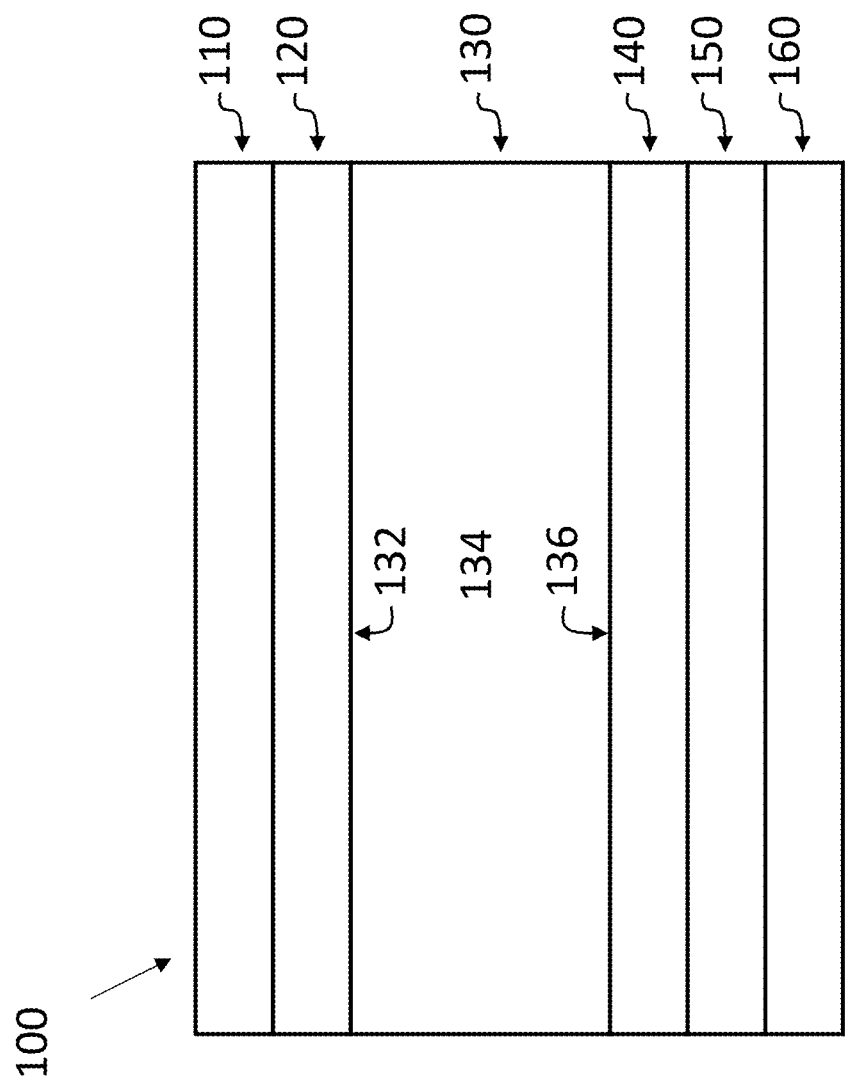
FIG. 1 is a schematic diagram of an exemplary photovoltaic device.

It is to be understood that the figures and descriptions of the present invention have been simplified to illustrate elements that are relevant for a clear understanding of the present invention, while eliminating, for the purpose of clarity, many other elements found in photovoltaic devices. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein. The disclosure herein is directed to all such variations and modifications to such elements and methods known to those skilled in the art.

As used herein, each of the following terms has the meaning associated with it in this section. Unless defined otherwise, all technical and scientific terms used herein generally have the same meaning as commonly understood by one of ordinary skill in the art to which this invention belongs.

The articles "a" and "an" are used herein to refer to one or to more than one (i.e. to at least one) of the grammatical object of the article. By way of example, "an element" means one element or more than one element.

As used herein, the term "about" will be understood by persons of ordinary skill in the art and will vary to some extent depending on the context in which it is used. As used herein when referring to a measurable value such as an amount, a temporal duration, and the like, the term "about" is meant to encompass variations of ±20% or ±10%, more preferably ±5%, even more preferably ±1%, and still more preferably ±0.1% from the specified value, as such variations are appropriate to perform the disclosed methods.

As used herein, the term "substrate" refers to a structural surface beneath a layered material or coating (e.g., polymer coating).

As used herein, the term fullerene, buckminsterfullerene ($C_{60}$) and associated, including "spherical" fullerenes and carbon nanotubes, include various cage-like molecules consisting only of carbon. For example, fullerenes can be selected by those skilled in the art in the range of $C_{20}$-$C_{1000}$. In some embodiments, the fullerene is selected from the range $C_{60}$ to $C_{96}$. In other embodiments, the fullerenes are $C_{60}$ or $C_{70}$. Chemically modified fullerenes typically have more preferable solubility characteristics and are thus applied in photovoltaic devices as would be understood by those skilled in the art.

Throughout this disclosure, various aspects of the invention can be presented in a range format. It should be understood that the description in range format is merely for convenience and brevity and should not be construed as an inflexible limitation on the scope of the invention. Accordingly, the description of a range should be considered to have specifically disclosed all the possible sub-ranges as well as individual numerical values within that range. For example, description of a range such as from 1 to 6 should be considered to have specifically disclosed sub-ranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, and 6. This applies regardless of the breadth of the range.

Description

The present invention is based in part on the unexpected discovery that removing at least a portion of a small molecule component from the surface of a photovoltaic active layer, such as through a tape stripping process, results in a surface-modified active layer having improved solar cell parameters and improved device durability relative to the unmodified (pristine) active layer. The present invention relates in part to active layers having a lower concentration of small molecules on the surface relative to the rest of the layer, to methods of producing such an active layer, and to methods of using the active layer. In certain aspects, the surface-modified active layer, as described herein, allows for more durable devices that can be used in underwater applications.

Active Layers

The present invention relates in part to an active layer having a first surface region and a bulk region, the active layer comprising a small molecule component and a polymer component, wherein the relative concentration of the small molecule component is lower in the surface region than in the bulk region.

In a solar cell, the active layer converts photons (incident light) to excitons, which comprise an electron and a hole. The potential between the electrodes drives the electrons to the cathode and the holes to the anode, thereby generating an electric current.

In one embodiment, the active layer comprises at least one polymer component and at least one small molecule component. In one embodiment, the active layer comprises a mixture of at least one polymer component and at least one small molecule component.

In one embodiment, the at least one polymer component comprises a combination, copolymer, block copolymer, and/or mixture of two or more polymers. In one embodiment, the at least one polymer component comprises a semiconductive organic polymer. In one embodiment, at least one the polymer component is a conductive polymer. Examples of conductive polymers include, but are not limited to, poly(fluorene)s, polyphenylenes, polypyrenes, polyazulenes, polynaphthalenes, poly(pyrrole)s, polycarbazoles, polyindoles, polyazepines, polyanilines, poly(thiophene)s, poly(p-phenylene sulfide)s, poly(acetylene)s, or poly(p-phenylene vinylene)s, benzothiadiazole, or any combination thereof. In one embodiment, the at least one polymer component is an electron donor polymer. Examples of electron donor polymers include, but are not limited to, poly(3-hexylthiophene) (P3HT), poly[4,8-bis-(2-ethyl-hexyl-thiophene-5-yl)-benzo[1,2-b:4,5-b']dithiophene-2,6-diyl]-alt-[2-(2'-ethyl-hexanoyl)-thieno[3,4-b]thiophen-4,6-diyl](PBDTTT-CT), poly[N-9'-hepta-decanyl-2,7-carbazole-alt-5,5-(4',7'-di-2-thienyl-2',1',3'-enzothiadiazole)] (PCDTBT), poly[6-fluoro-2,3-bis-(3-octyloxyphenyl) quinoxaline-5,8-diyl-alt-thiophene-2,5-diyl] (FTQ), poly(3-octylthiophene) (P3 T), poly (3-hexyloxythiophene) (P3DOT), poly(3-methylthiophene) (PMeT), poly(3-dodecylthiophene) (P3DDT), poly(3-dodecylthienylenevinylene) (PDDTV), poly(3,3 dialkylquarterthiophene) (PQT), poly-dioctyl-fluorene-co-bithiophene (F8T2), Poly[[4,8-bis[(2-ethylhexyl)oxy]benzo[1,2-b:4,5-b']dithiophene-2,6-diyl][3-fluoro-2-[(2-ethylhexyl)carbonyl]thieno[3,4-b]thiophenediyl]](PTB7), poly-(2,5,-bis(3-alkylthiophene-2-yl)thieno[3,2-b]thiophene) (PBTTT-C12), poly[2,7-(9,9'-dihexylfluorene)-alt-2,3-dimethyl-5,7-dithien-2-yl-2,1,3-benzothiadiazole](PFDDTBT), poly {[2,7-(9, 9-bis-(2-ethylhexyl)-fluorene)]-alt-[5,5-4,7-di-20-thienyl-2, 1,3-benzothiadiazole)]} (BisEH-PFDTBT), poly {[2,7-(9,9-bis-(3,7-dimethyl-octyl)-fluorene)]-alt-[5,5-(4,7-di-20-thienyl-2,3-benzothiadiazole)]} (BisDMO-PFDTBT), poly [N-9"-hepta-decanyl-2,7-carbazole-alt-5,5-(4',7'-di-2-thienyl-2',1',3'-benzothiadiazole)](PCDT3BT), poly[4,8-bis-substituted-benzo[1,2-b:4,5-b']dithiophene-2,6-diyl-alt-4-substituted-thieno[3,4-b]thio-phene-2,6-diyl] (PBDTTT-C-T), Poly(benzo[1,2-b:4,5-b']dithiophene-alt-thieno[3,4-c] pyrrole-4,6-dione (PBDTTPD), poly((4,4-dioctyldithieno(3, 2-b:2',3'-d)silole)-2,6-diyl-alt-(2,1,3-benzothiadiazole)-4,7-diyl) (PSBTBT), poly[(2,6-(4,8-bis(5-(2-ethylhexyl) thiophen-2-yl)-benzo[1,2-b:4,5-b']dithiophene))-alt-(5,5-(1',3'-di-2-thienyl-5',7'-bis(2-ethylhexyl)benzo[1',2'-c:4',5'-c']dithiophene-4,8-dione)]) (PBDB-T), poly[4,8-bis(5-(2-ethylhexyl)thiophen-2-yl)benzo[1,2-b;4,5-b']dithiophene-2, 6-diyl-alt-(4-(2-ethylhexyl)-3-fluorothieno[3,4-b] thiophene-)-2-carboxylate-2-6-diyl)] (PTB7-Th), poly[(5,6-difluoro-2,1,3-benzothiadiazol-4,7-diyl)-alt-(3,3'''-di(2-octyldodecyl)-2,2',5',2'',5'',2'''-quaterthiophen-5,5'''-diyl)] (PffBT4T-20D), poly[(2,5-bis(2-hexyldecyloxy)phenylene)-alt-(5,6-difluoro-4,7-di(thiophen-2-yl)benzo[c]-[1,2,5]thiadiazole)] (PPDT2FBT), Poly[2-(5-(4,8-bis(5-((2-butyloctyl) thio)thiophen-2-yl)benzo[1,2-b:4,5-b']dithiophen-2-yl)-4-octylthiophen-2-yl)-5-(4-octylthiophen-2-yl)-1,3,4-thiadiazole] (PBDTS-TDZ), Poly[2,5-(2-decyltetradecyl)-3, 6-diketopyrrolopyrrole-alt-5,5-(2,5-di(thien-2-yl)thieno[3, 2-b]thiophene)] (PDPPTT), Poly[2,5-(2-octyldodecyl)-3,6-diketopyrrolopyrrole-alt-5,5-(2,5-di(thien-2-yl)thieno [3,2-b]thiophene)] (PDPP2T-TT-OD), and poly{1-(5-(4,8-bis((2-ethylhexyl)oxy)-6-methylbenzo[1,2-b:4,5-b0]dithiophen-2-yl)thiophen-2-yl)-5,7-bis-(2-ethylhexyl)-3-(5-methylthiophen-2-yl)benzo[1,2-c:4,5-c0]dithiophene-4,8-dione} (PDBD-O).

In one embodiment, the at least one polymer component is an n-type polymer. Exemplary n-type polymers include, but are not limited to, poly(benzimidazobenzophenanthroline), diphenyl terminated poly[(2,5-didecyloxy-1,4-phenylene) (2,4,6-triisopropylphenylborane)], poly(2,5-di(3,7-dimethyloctyloxy)cyanoterephthalylidene), poly(2,5-di (hexyloxy)cyanoterephthalylidene), poly(5-(3,7-dimethyloctyloxy)-2-methoxy-cyanoterephthalylidene), poly(2,5-di(octyloxy)cyanoterephthalylidene), poly(5-(2-ethylhexyloxy)-2-methoxy-cyanoterephthalylidene), and the like.

In one embodiment, the at least one small molecule component is an electron acceptor. In one embodiment, the at least one small molecule component comprises two or more small molecule compounds. In one embodiment, the at least one small molecule component comprises one small molecule.

In one embodiment, the at least one small molecule component comprises a fullerene derivative. In one embodiment, the fullerene derivative is selected from the group consisting of [6,6]-phenyl-C61-butyric acid methyl ester (PCBM), [6,6]-(4-fluoro-phenyl)-$C_{61}$-butyric acid methyl ester (FPCBM), [6,6]-phenyl-C71 butyric acid methyl ester ($PC_{70}BM$), indene-C60 bisadduct ($IC_{60}BA$), indene-C70 bisadduct ($IC_{70}BA$), fullerene-C60, fullerene-C70, [5,6]-fullerene-C70, fullerene-C84, carbon nanotubes (CNT), a carbon onion, and combinations thereof.

In one embodiment, the at least one small molecule component comprises an n-type small molecule. Non-limiting examples of n-type small molecules include bisbenzimidazo[2,1-a:2',1'-a']anthra[2,1,9-def: 6,5,10-d'e'f']diisoquinoline-10,21-dione, 2,9-bis[2-(4-chlorophenyl)ethyl] anthra[2,1,9-def: 6,5,10-d'e'f']diisoquinoline-1,3,8,10(2H,9H)tetrone, N,N'-bis(2,5-di-tert-butylphenyl)-3,4,9,10-perylenedicarboximide, 2,9-bis[2-(4-fluorophenyl)ethyl] anthra[2,1,9-def:6,5,10-d'e'f']diisoquinoline-1,3,8,10(2H,9H)tetrone, 2,9-bis[(4-methoxyphenyl)methyl]anthra[2,1,9-def: 6,5,10-d'e'f']diisoquinoline-1,3,8,10(2H,9H)tetrone, 6,12-bis(2,3,4,5,6-pentafluorophenyl)indeno[1,2-b]fluorene, N,N'-bis(3-pentyl)perylene-3,4,9,10-bis(dicarboximide), 5,5'''-bis(tridecafluorohexyl)-2,2':5',2'':5'',2'''-quaterthiophene, 2,2'-bis[4-(trifluoromethyl)phenyl]-5,5'-bithiazole, 6,12-bis(2,4,6-trimethylphenyl)indeno[1,2-b] fluorene, copper(II) 1,2,3,4,8,9,10,11,15,16,17,18,22,23,24,25-hexadecafluoro-29H,31H-phthalocyanine, 1,7-dibromo-3,4,9,10-tetracarboxylic acid dianhydride, 2,9-diheptylanthra[2,1,9-def: 6,5,10-d'e'f']diisoquinoline-1,3,8,10(2H,9H)tetrone, 2,9-dihexylanthra[2,1,9-def:6,5,10-d'e'f'] diisoquinoline-1,3,8,10(2H,9H)tetrone, 2,7-dihexylbenzo [lmn][3,8]phenanthroline-1,3,6,8(2H,7H)-tetrone, 4-(2,3-dihydro-1,3-dimethyl-1H-benzimidazol-2-yl)-N,N-dimethylbenzenamine, 4-(1,3-dimethyl-2,3-dihydro-1H-benzoimidazol-2-yl)-N,N-diphenylaniline, N, N'-dimethyl-3,4,9,10-perylenedicarboximide, N,N'-dioctyl-3,4,9,10-perylenedicarboximide, N,N'-dipentyl-3,4,9,10-perylenedicarboximide, [6.6]diphenyl C62 bis(butyric acid methyl ester)(mixture of isomers), N,N'-diphenyl-3,4,9,10-perylenedicarboximide, 2,9-dipropylanthra[2,1,9-def:6,5,10-d'e'f']diisoquinoline-1,3,8,10(2H,9H)tetrone, N,N'-ditridecylperylene-3,4,9,10-tetracarboxylic diimide, indeno[1,2-b]fluorene-6,12-dione, 1,4,5,8-naphthalenetetracarboxylic dianhydride, 1,2,3,4,5,6,7,8-octafluoro-9,10-bis[4-(trifluoromethyl)phenyl]anthracene, 1,2,3,4,5,6,7,8-octafluoro-9,10-bis[2-(2,4,6-trimethylphenyl)ethynyl]anthracene, perylene-3,4,9,10-tetracarboxylic dianhydride, [6,6]-phenyl-C61 butyric acid butyl ester, [6,6]-phenyl C61 butyric acid methyl ester, [6,6]-phenyl-C61 butyric acid octyl ester, 7,7,8,8-tetracyanoquinodimethane, 2,3,5,6-tetrafluoro-7,7,8,8-tetracyanoquinodimethane, 5,10,15,20-tetrakis(pentafluorophenyl)-21H,23H-porphine palladium(II), 1,3,8,10 (2H,9H)-tetraone, 2,9-bis(2-phenylethyl)anthra[2,1,9-def:6,5,10-d'e'f']diisoquinoline, 1,3,6,8(2H,7H)-tetraone, 2,7-dicyclohexylbenzo[lmn][3,8]phenanthroline, [6,6]-thienyl C61 butyric acid methyl ester, 3,9-bis(2-methylene-(3-(1,1-dicyanomethylene)-indanone))-5,5,11,11-tetrakis(4-hexylphenyl)-dithieno[2,3-d:2',3'-d']-s-indaceno[1,2-b:5,6-b'] dithiophene (ITIC), 3,9-bis(2-methylene-((3-(1,1-dicyanomethylene)-6/7-methyl)-indanone))-5,5,11,11-tetrakis(4-hexylphenyl)-dithieno[2,3-d:2',3'-d']-s-indaceno [1,2-b:5,6-b']dithiophene (IT-M or ITIC-M), 3,9-bis(2-methylene-(3-(1,1-dicyanomethylene)-indanone))-5,5,11,11-tetrakis(5-hexylthienyl)-dithieno[2,3-d:2',3'-d']-s-indaceno[1,2-b:5,6-b']dithiophene (ITIC-Th), 3,9-bis(2-methylene-((3-(1,1-dicyanomethylene)-6,7-difluoro)-indanone))-5,5,11,11-tetrakis(4-hexylphenyl)-dithieno[2,3-d:2',3'-d' ]-s-indaceno[1,2-b: 5,6-b']dithiophene (ITIC-2F), 3,9-bis(2-methylene-((3-(1,1-dicyanomethylene)-6,7-dimethyl)-indanone))-5,5,11,11-tetrakis(4-hexylphenyl)-dithieno[2,3-d:2',3'-d' ]-s-indaceno[1,2-b:5,6-b']dithiophene (ITIC-DM), triperylene hexaimides (TPH), selenium-annulated triperylene hexaimides (TPH-Se), PDI-tetramers (TPC-PDI4, TPE-PDI4, TPPz-PDI4), FTTB-PDI4, and the like. Those skilled in the art of non-fullerene acceptors will recognize that modifications can be made these non-fullerene acceptor molecules by modifying the ligand functional groups, thereby tuning the electronic and structural parameters of the non-fullerene acceptor.

In one embodiment, the at least one small molecule component comprises a p-type small molecule component. Exemplary p-type small molecules include, but are not limited to, ADT, benz[b]anthracene, 2,4-bis[4-(N,N-dibenzylamino)-2,6-dihydroxyphenyl]squaraine, 5,5''''-bis(2'''', 2''''-dicyanovinyl)-2,2':5',2'':5'',2''':5''',2''''-quinquethiophene (DCV5T), 2,4-bis[4-(N,N-diisobutylamino)-2,6-dihydroxyphenyl]squaraine, 2,4-bis[4-(N,N-diphenylamino)-2,6-dihydroxyphenyl]squaraine, bis (ethylenedithio)tetrathiafulvalene, 2-[(7-{4-[N,N-bis(4-methylphenyl)amino]phenyl}-2,1,3-benzothiadiazol-4-yl) methylene]propanedinitrile, 6,13-bis((triethylsilyl)ethynyl) pentacene, 6,13-bis(triisopropylsilylethynyl)pentacene, C8-BTBT, copper(II) phthalocyanine, coronene, DH-FTTF, dibenzotetrathiafulvalene, 5,5'-di(4-biphenylyl)-2,2'-bithiophene, 3,3'''-didodecyl-2,2':5',2'':5'',2'''-quaterthiophene, diF-TES-ADT, 5,5'-dihexyl-2,2'-bithiophene, 3,3'''-dihexyl-2,2': 5',2'':5'',2'''-quaterthiophene, 5,5'''''-dihexyl-2,2':5',2'': 5'',2''':5''',2'''':5'''',2'''''-sexithiophene, dinaphtho[2,3-b:2',3'-f]thieno[3,2-b]thiophene, 2-[7-(4-diphenylaminophenyl)-2, 1,3-benzothiadiazol-4-yl]methylenepropanedinitrile, 2,6-diphenylbenzo[1,2-b:4,5-b']dithiophene, 2,7-diphenyl[1] benzothieno[3,2-b][1]benzothiophene, 6,13-diphenylpentacene, 2-{[7-(5-N,N-ditolylaminothiophen-2-yl)-2,1,3-benzothiadiazol-4-yl]methylene}malononitrile, 2,6-ditolylbenzo[1,2-b:4,5-b']dithiophene, DTS(FBTTh2)2, DTS(PTTh2)2, FTTF, merocyanine dye, HB 194, pentacene-N-sulfinyl-tert-butylcarbamate, platinum octaethylporphyrin, 2,2':5',2'':5'',2'''-quaterthiophene, rubrene, α-sexithiophene, SMDPPEH, SMDPPO, 13,6-N-sulfinylacetamidopentacene, TES-ADT, tetrathiafulvalene, tin(IV) 2,3-naphthalocyanine dichloride, tris[4-(5-dicyanomethylidenemethyl-2-thienyl)phenyl]amine, and the like.

In one embodiment, the active layer is a bulk heterojunction (BHJ). In one embodiment, the active layer comprises a nanoscale blend of at least one small molecule component and at least one polymer component. In one embodiment, the active layer has a gradient in the relative composition of one or more components, in a direction perpendicular to the plane of the layer, such that the relative composition of one or more components is lower nearer to the surface of the active layer.

In one embodiment, the active layer comprises a first surface, a bulk region, and a second surface. In one embodiment, the bulk region is the region of the active layer between the first surface and the second surface.

In one embodiment, the weight ratio of the at least one small molecule component to the at least one polymer component in the bulk region is between 90:10 and 10:90. In one embodiment, the weight ratio of the at least one small molecule component to the at least one polymer component in the bulk region is between 80:20 and 20:80. In one embodiment, the weight ratio of the at least one small molecule component to the at least one polymer component in the bulk region is between 75:25 and 25:75. In one embodiment, the weight ratio of the at least one small molecule component to the at least one polymer component in the bulk region is between 67:33 and 33:67. In one embodiment, the weight ratio of the at least one small molecule component to the at least one polymer component in the bulk region is between 60:40 and 40:60 In one embodiment, the weight ratio of the at least one small molecule component to the at least one polymer component in the bulk region is about 50:50.

In one embodiment, the weight ratio of the at least one small molecule component to the at least one polymer component in the first surface is between 50:50 and 1:99. In one embodiment, the weight ratio of the at least one small molecule component to the at least one polymer component in the first surface is between 35:65 and 1:99. In one embodiment, the weight ratio of the at least one small molecule component to the at least one polymer component in the first surface is between 25:75 and 1:99. In one embodiment, the weight ratio of the at least one small molecule component to the at least one polymer component in the first surface is between 20:80 and 1:99. In one embodiment, the weight ratio of the at least one small molecule component to the at least one polymer component in the first surface is between 15:85 and 1:99. In one embodiment, the weight ratio of the at least one small molecule component to the at least one polymer component in the first surface is between 10:90 and 1:99. In one embodiment, the weight ratio of the at least one small molecule component to the at least one polymer component in the first surface is between 9:91 and 1:99. In one embodiment, the weight ratio of the at least one small molecule component to the at least one polymer component in the first surface is between 8:92 and 1:99. In one embodiment, the weight ratio of the at least one small molecule component to the at least one polymer component in the first surface is between 7:93 and 1:99. In one embodiment, the weight ratio of the at least one small molecule component to the at least one polymer component in the first surface is between 6:94 and 1:99. In one embodiment, the weight ratio of the at least one small molecule component to the at least one polymer component in the first surface is about 6:94.

In one embodiment, the thickness of the active layer is between 10 and 500 nm. In one embodiment, the thickness of the active layer is between 20 and 400 nm. In one embodiment, the thickness of the active layer is between 30 and 300 nm. In one embodiment, the thickness of the active layer is between 50 and 200 nm. In one embodiment, the thickness of the active layer is between 75 and 150 nm. In one embodiment, the thickness of the active layer is about 100 nm.

Photovoltaic Devices

The present invention relates in part to photovoltaic devices comprising an active layer of the present invention. Referring to FIG. 1, exemplary photovoltaic device 100 is shown. In some embodiments, device 100 may include: first electrode 110, optional charge transporting layer 120, active layer 130, optional charge transporting layer 140, second electrode 150, and optional substrate 160. In some embodiments, active layer 130 comprises first surface 132, bulk region 134, and second surface 136.

In some embodiments, first electrode 110 is a cathode, transporting layer 120 is an electron transporting layer, transporting layer 140 is a hole transporting layer, and second electrode 150 is an anode. In other embodiments, first electrode 110 is a anode, transporting layer 120 is a hole transporting layer, transporting layer 140 is an electron transporting layer, and second electrode 150 is a cathode.

First electrode 110 and second electrode 150 may comprise any material capable of conducting electrons. In one embodiment, the cathode is a low work function metal or metal alloy, including, for example, barium, calcium, magnesium, indium, aluminum, ytterbium, silver, a calcium: silver alloy, an aluminum:lithium alloy, or a magnesium: silver alloy. In some embodiments, first electrode 110 and second electrode 150 comprise gold, silver, fluorine tin oxide (FTO) or indium tin oxide (ITO), or conductive polymer layers. In some embodiments, either of first electrode 110 and second electrode 150, or both of first electrode 110 and second electrode 150, are reflective, transparent, semi-transparent or translucent. In one embodiment, first electrode 110 comprises ITO. In one embodiment, second electrode 150 comprises silver.

In some embodiments, optional charge transporting layers 120 and 140 are independently an electron transporting layer and a hole transporting layer. In one embodiment, the electron transporting layer comprises a material capable of transporting electrons. In some embodiments, the hole transporting layer, when present, is in direct contact with the anode. In some embodiments, the electron transporting material, when present, is in direct contact with the cathode.

Exemplary electron transporting materials include, but are not limited to, semi-conductive metal oxides including oxides of titanium, tin, zinc, iron, tungsten, zirconium, hafnium, strontium, indium, cerium, yttrium, lanthanum, vanadium, caesium, niobium or tantalum, metal chelated oxinoid compounds, such as bis(2-methyl-8-quinolinolato) (para-phenyl-phenolato)aluminum(II) (BAlQ), tris(8-hydroxyquinolato)aluminum ($Alq_3$), and tetrakis(8-hydroxyquinolato)-aluminum (ZrQ); azole compounds such as 2-(4-biphenylyl)-5-(4-t-butylphenyl)-1,3,4-oxadiazole (PB D), 3-(4-biphenylyl)-4-phenyl-5-(4-t-butylphenyl)-1,2,4-triazole (TAZ), and 1,3,5-tri(phenyl-2-benzimidazole)benzene (TPBI); quinoxaline derivatives such as 2,3-bis(4-fluorophenyl)quinoxaline; and phenanthroline derivatives such as 9,10-diphenylphenanthroline (DPA) and 2,9-dimethyl-4,7-diphenyl-1,10-phenanthroline (DDPA). In one embodiment, the electron transporting layer comprises $TiO_2$, $SnO_2$, $Fe_2O_3$, $WO_3$, ZnO, $Nb_2O_5$, $SrTiO3$, $Ta2O_5$, $Cs_2O$, zinc stannate, complex oxides such as barium titanate, binary and ternary iron oxides, or indium gallium zinc oxide (IGZO).

Exemplary hole transporting materials include polymers, such as PEDOT:PSS, or metal oxides (e.g., oxides of molybdenum, vanadium, silver, nickel, and copper). In one embodiment, the hole transporting layer comprises vanadium oxide ($V_2O_5$). In one embodiment, the hole transporting layer comprises molybdenum oxide ($MoO_3$).

Active layer 130 may be any active layer disclosed herein. Active layer 130 comprises bulk region 134, first surface 132, and second surface 136. In one embodiment, first surface 132 is in direct contact with electrode layer 110 or optional transporting layer 120. In one embodiment, second surface 136 is in direct contact with electrode layer 150 or optional transporting layer 140. In one embodiment, bulk region 130 is not in direct contact with any other layer.

In certain embodiments, electrode 150 may be deposited on a substrate 160, which may be transparent, semi-transparent, translucent, or opaque. Substrate 160 may be rigid, for example quartz or glass, or may be a flexible polymeric substrate. Examples of flexible transparent semi-transparent or translucent substrates include, but are not limited to, polyimides, polytetrafluoroethylenes, polyethylene terephthalates, polyolefins such as polypropylene and polyethylene, polyamides, polyacrylonitrile and polyacrionitrile, polymethacrylonitrile, polystyrenes, polyvinyl chloride, and fluorinated polymers such as polytetrafluoroethylene.

In some embodiments, the photovoltaic device of the present invention has a power conversion efficiency of at least 1%. In one embodiment, the photovoltaic device of the present invention has a power conversion efficiency of at least 2%. In one embodiment, the photovoltaic device of the present invention has a power conversion efficiency of at least 3%. In one embodiment, the photovoltaic device of the present invention has a power conversion efficiency of at least 4%. In one embodiment, the photovoltaic device of the present invention has a power conversion efficiency of at least 5%. In one embodiment, the photovoltaic device of the present invention has a power conversion efficiency of at least 6%. In one embodiment, the photovoltaic device of the present invention has a power conversion efficiency of at least 7%. In one embodiment, the photovoltaic device of the present invention has a power conversion efficiency of at least 8%. In one embodiment, the photovoltaic device of the present invention has a power conversion efficiency of at least 9%. In one embodiment, the photovoltaic device of the present invention has a power conversion efficiency of at least 10%. In one embodiment, the photovoltaic device of the present invention has a power conversion efficiency of at least 11%.

In some embodiments, the photovoltaic device of the present invention has an enhanced fill factor. In one embodiment, the device has a fill factor of greater than 0.50. In one embodiment, the device has a fill factor of greater than 0.55. In one embodiment, the device has a fill factor of greater than 0.60. In one embodiment, the device has a fill factor of greater than 0.65. In one embodiment, the device has a fill factor of about 0.69.

In some embodiments, the photovoltaic device of the present invention is resistant to water. In some embodiments, the photovoltaic device is submersible. In one embodiment, the photovoltaic device is capable of being operated underwater. In one embodiment, the photovoltage of the device decreases by less than 40% after 30 seconds under constant load underwater. In one embodiment, the photovoltage of the device decreases by less than 30% after 30 seconds under constant load underwater. In one embodiment, the photovoltage of the device decreases by less than 20% after 30 seconds under constant load underwater. In one embodiment, the photovoltage of the device decreases by less than 10% after 30 seconds under constant load underwater. In one embodiment, the photovoltage of the device decreases by less than 5% after 30 seconds under constant load underwater. In one embodiment, the photovoltage of the device decreases by less than 4% after 30 seconds under constant load underwater. In one embodiment, the photovoltage of the device decreases by less than 3% after 30 seconds under constant load underwater.

In some embodiments, photovoltaic device 100 is flexible. In one embodiment, the photovoltaic device maintains at least 50% of its power conversion efficiency (PCE) after 9,000 bend cycles under water at a bending radius of 15 mm. In one embodiment, the photovoltaic device maintains at least 60% of its power conversion efficiency (PCE) after 9,000 bend cycles under water at a bending radius of 15 mm. In one embodiment, the photovoltaic device maintains at least 70% of its power conversion efficiency (PCE) after 9,000 bend cycles under water at a bending radius of 15 mm. In one embodiment, the photovoltaic device maintains at least 80% of its power conversion efficiency (PCE) after 9,000 bend cycles under water at a bending radius of 15 mm.

This concept can also be extended to other organic electronic devices such as organic light emitting diodes (OLEDs). Those skilled in the art of organic electronics understand that OLEDs have similar architectures and materials to organic photovoltaic (OPV) devices. In OPVs, incident light provides a bias voltage, whereas in OLEDs an applied voltage induces an outcoupled light. In one embodiment, the photovoltaic device is an organic light emitting diode. In one embodiment, the active layer of the present invention is incorporated into an organic light-emitting diode.

Production of a Surface-Modified Active Layer

Figure 2:
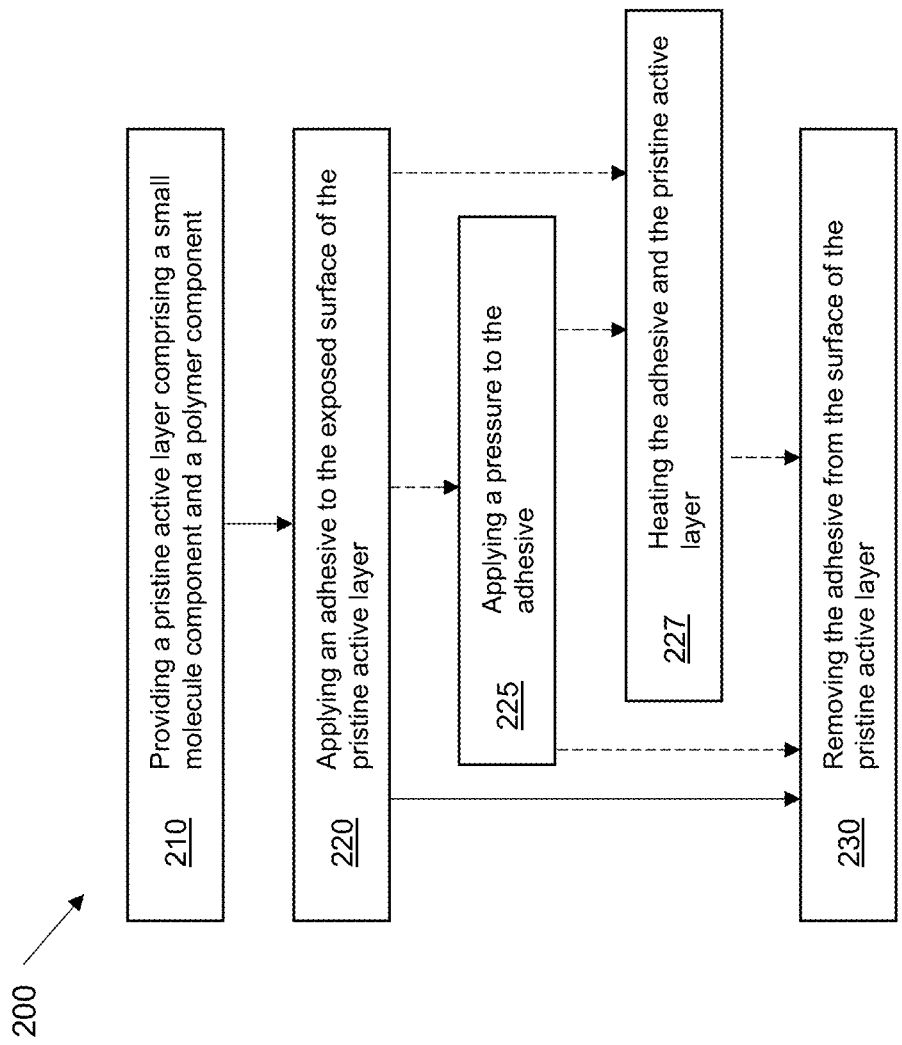
FIG. 2 is a flowchart depicting an exemplary method of preparing an active layer of the present invention.

The present invention relates in part to a method of producing a surface-modified active layer. Referring to FIG. 2, exemplary method 200 is described. The method begins with step 210, where a pristine active layer is provided, the pristine active layer comprising at least one small molecule component and at least one polymer component. Next, in step 220, an adhesive is applied to the exposed surface of the active layer to produce an adhesive-bound active layer. Optionally, in step 225, pressure may be applied to the adhesive. Optionally, in step 227, heat may be applied to the adhesive and the pristine active layer. In step 230, the adhesive is removed from the adhesive-bound active layer to provide a surface-modified active layer.

The pristine active layer provided in step 210 may be produced using any method known to those of skill in the art. The pristine active layer may comprise any small molecule component and any polymer component discussed elsewhere herein. In one embodiment, the at least one polymer component comprises an electron donor polymer. In one embodiment, the at least one small molecule component comprises an n-type small molecule. In one embodiment, the at least one small molecule comprises a fullerene derivative. In one embodiment, the pristine active layer is an active layer that has not been subjected to any surface modification steps described herein.

In some embodiments, the pristine layer may be disposed over a substrate. In one embodiment, additional layers may be present between the pristine layer and the substrate, including for example electrode(s), hole or electron transporting layers, and other functional layers know to those of skill in the art.

In one embodiment, the adhesive compound applied in step 220 is a pressure-sensitive adhesive. The term "pressure sensitive adhesive" refers to an adhesive which is aggressively and permanently tacky at room temperature and adheres to other surfaces upon the application of pressure, such as by hand, without requiring other forms of activation. Pressure sensitive adhesives may include, but are not limited to, synthetic or natural rubber or a synthetic polymer or copolymer compounded with compatible resin tackifiers such as terpene resins, ester gum, etc., and dispersed in an appropriate solvent such as an organic solvent or water. Also included are pressure sensitive adhesive materials described in *Adhesion and Bonding*, Encyclopedia of Polymer Science and Engineering, Vol. 1, pages 476-546, Interscience Publishers, 2nd Ed. 1985, the disclosure of which is hereby incorporated by reference. In one embodiment, the adhesive is Scotch® Magic Tape (model #: S-9782).

In one embodiment, the adhesive is applied as a tape or other thin film. In one embodiment, the adhesive applied via spraying or rolling the adhesive onto the pristine active layer, or other methods of adhesive application used with adhesives of the type described herein. Suitable methods for the application of the adhesive to the active layer may include any conventional methods for the application of adhesives to surfaces in general.

In some embodiments, the method includes optional step 225, where pressure is applied to the adhesive. In one embodiment, the depth of penetration and amount of material removed by the adhesive is dependent on the pressure applied during the application of the adhesive. In one embodiment, a pressure between 100 Pa and 1000 Pa is applied to the adhesive. In one embodiment, the applied pressure is between 100 Pa and 900 Pa. In one embodiment, the applied pressure is between 100 Pa and 750 Pa. In one embodiment, the applied pressure is between 200 Pa and 500 Pa. In one embodiment, the applied pressure is about 200 Pa. In one embodiment, the applied pressure is about 500 Pa.

In optional step 227, heat may be applied to the adhesive, the active layer, or both. The depth of penetration and amount of material removed by the adhesive can be dependent on heat applied during the application of the adhesive. In one embodiment, the heat serves to soften or tackify the adhesive. In one embodiment, the heat is applied using convection, forced air, microwave, ultrasonics, irradiation, or any other heating means. In one embodiment, the adhesive is locally heated or globally heated in an oven. In one embodiment, the adhesive is heated first, locally or globally, and laid up or placed on the active layer. In another embodiment, cold adhesive may be laid up or placed on the active layer, or on the photovoltaic device, followed by heating the active layer or photovoltaic device on which is laid the adhesive in an oven at a temperature sufficient to provide adhesion. In one embodiment, the adhesive may be passed under a stream of hot forced air. In one embodiment, the adhesive is heated to a temperature of at least 30° C. In one embodiment, the adhesive is heated to a temperature of at least 40° C. In one embodiment, the adhesive is heated to a temperature of at least 50° C. In one embodiment, the adhesive is heated to a temperature of at least 60° C. In one embodiment, the adhesive is heated to a temperature of at least 70° C. In one embodiment, the adhesive is heated to a temperature of at least 80° C. In one embodiment, the adhesive is heated to a temperature of at least 90° C. In one embodiment, the adhesive is heated to a temperature of at least 100° C.

As contemplated herein, the adhesive removal in step 230 may employ any standard techniques understood by those skilled in the art. In some embodiments, the adhesive-bound active layer is cooled, such as to room temperature, prior to removal of the adhesive. In some embodiments, the adhesive is removed slowly and gentle. In some embodiments, the adhesive is removed with a constant force. In some embodiments, the adhesive is removed via pulling the adhesive in a constant vector.

In some embodiments, the step of removing the adhesive from the adhesive-bound active layer may further comprise the step of removing at least a portion of the at least one small molecule component from the surface of the pristine active layer to produce a surface-modified active layer. In one embodiment, the step of removing the adhesive from the adhesive-bound active layer further comprises the step of removing at least 20%, 30%, 40%, 50%, 60%, or 70% of the at least one small molecule component from the surface of the pristine active layer. In one embodiment, the step of removing the adhesive from the adhesive-bound active layer further comprises the step of removing between 50% and 70% of the at least one small molecule component from the surface of the pristine active layer. In one embodiment, the step of removing the adhesive from the adhesive-bound active layer further comprises the step of removing about 67% of the at least one small molecule component from the surface of the pristine active layer.

Underwater Solar Cells

The present invention relates in part to a method of converting light into electrical energy, the method comprising the step of providing a photovoltaic device comprising an active layer described herein; exposing the photovoltaic device to light; and producing electrical energy.

In some embodiments, the light comprises light disposed over a body of water. In one embodiment, the light comprises sunlight. In one embodiment, the steps of exposing the photovoltaic device to light and producing electrical energy further comprise the steps of submerging the photovoltaic device under water; and producing electrical energy using the submerged photovoltaic device.

In some embodiments, the body of water may be any body of water known to those of skill in the art, including, but not limited to, freshwater, saltwater, estuarine, brackish, sea or other bodies of water.

The photovoltaic device can be submerged to any depth and at any temperature understood by those of skill in the art. In some embodiments, the photovoltaic device can be attached to a submerged or a submersible surface. In some embodiments, the submerged or submersible surface is a surface in a marine commercial, military, maritime, or industrial setting. Non-limiting examples of surfaces to which the photovoltaic device may be attached include berthing facilities, such as piers and pilings, deck surfaces, buoys, wharves, jetties, desalinization facilities, nautical beacons, floating beacons, floating breakwaters, docks, seaside industrial plants, fish preserving structures, aquatic constructions, port facilities, bridges, cranes, dredges, pontoons, barges, offshore rigging equipment, and decorative or functional cement or stone formations.

EXPERIMENTAL EXAMPLES

The invention is now described with reference to the following Examples. These Examples are provided for the purpose of illustration only, and the invention is not limited to these Examples, but rather encompasses all variations that are evident as a result of the teachings provided herein.

Example 1: Tape Stripping of Surface Small Molecule Components

One of the main culprits in the environmental degradation of organic solar cells is the photochemical instability of fullerene derivatives which are widely used as electron acceptors in the donor:acceptor blend photoactive layers (Lee, et al., Adv. Energy Mater. 2016, 6 (21), 1600970; Hansson, et al., Phys. Chem. Chem. Phys. 2016, 18, 11132-11138; et al., Brumboiu, et al., J. Chem. Phys. 2015, 142, 054306). Anselmo et al found that drastic changes at the surface of fullerene film happen when the film is exposed to ambient air with the presence of light, which could cause serious issues on solar cell performance (Anselmo, et al., Chem. Phys. Lett. 2016, 652, 220-224). Recently, Lee et al identified the effects of photo-oxidation of fullerene derivative on its chemical structure, and connected the result to specific changes in its electronic structure, which consequently influence the electron transport and recombination kinetics of the solar cells (Lee, et al., Energy Environ. Sci. 2018, 11, 417-428). Bao et al also noticed that when fullerene molecule is exposed to water under light irradiation, its electronic structure is irreversibly changed (Bao, et al., Adv. Energy Mater. 2014, 4 (6), 1301272).

Conversely, however, the electron acceptor is beneficial for the electron donor stability, because the electron acceptor quickly quenches the excited states of the electron donor within several hundred femtoseconds. As a result, the presence of electron acceptor slows down the photo-oxidation progress of electron donor polymer (Reese, et al., Adv. Funct. Mater. 2010, 20 (20), 3476-3483; Hansson, et al., Phys. Chem. Chem. Phys. 2016, 18, 11132-11138; Distler, et al., J. Chem. Mater. 2012, 24 (22), 4397-4405). Thus, in some embodiments, the donor and acceptor components should be well mixed inside the blend film, while on the surface the acceptor component should be minimized in order for electron acceptors to avoid direct contact with oxygen and/or water from the surface.

Described herein is a facile tape stripping technique that promotes the selective removal of the acceptor component from the surface of a donor:acceptor blend film, creating an optimized morphology which significantly enhances device performance and durability. Peeling after sticking adhesive tape onto the photoactive blend film surface selectively removes more than 60% of acceptor component (e.g., PCBM) from the blend film surface, resulting in a high concentration of donor component (~94%) on the surface. The strategic removal of PCBM from the surface circumvents the direct contact of PCBM to oxygen and/or water molecules in air and enhances the adhesion between the photoactive layer and the top electrode. This enhanced adhesion inhibits delamination of the top electrode from the photoactive layer, and enables the solar cell to retain about 70% of its initial power conversion efficiency (PCE) after 10,000 bending cycles under the water. Moreover, upon performing ultrasonic fatigue in a water bath, no macroscopic damage was observed on the electrode. This new approach is also applicable to non-fullerene-based organic solar cells, which also demonstrated enhanced PCE and underwater durability.

Materials and Methods

P3HT was purchased from Rieke Metals, and PCBM and $PC_{71}BM$ were purchased from Nano-C, respectively. PBDB-T, and IT-M were purchased from Brilliant Matters. All chemical reagents and solvents were purchased from Sigma-Aldrich. The purchased materials, reagents and chemicals were used as received. For the preparation of the photoactive blend solutions with P3HT and PCBM, two materials were mixed one to one by weight and they were dissolved in chlorobenzene (anhydrous, 99.8%) with 3 vol % of solvent additive, diphenyl ether (99%) to obtain a total concentration of 50 mg mL$^{-1}$. For PBDB-T:IT-M solution, 8 mg of PBDB-T and 8 mg of IT-M were dissolved in 1 mL of chlorobenzene with 10 µL of 1,8-diiodooctane. All solutions were stirred on the hot plate stirrers at 60° C. for 24 hours before being used. For the electron transporting layer, the ZnO sol-gel precursor was prepared by dissolving zinc acetate dihydrate (99.9%) and ethanolamine (99.5%) in isopropyl alcohol (99.8%). For the hole transporting material, vanadium oxide sol-gel precursor stock solution was first prepared by diluting 40 µL of vanadium (V) oxytriisopropoxide with 2 mL of isopropyl alcohol, and then the stock was diluted again with isopropyl alcohol to a concentration of 0.33% by volume (Kim, et al., Adv. Energy Mater. 2014, 4 (8), 1301502).

Indium tin oxide (ITO) (L×W×thickness=1.5 cm×1.0 cm×100 nm) sputtered glass substrates (L×W×thickness=1.5 cm×1.5 cm×1 mm) were ultra-sonicated in deionized water, acetone and isopropyl alcohol for 10 minutes, respectively, and were stored in a drying oven at 100° C. before being used. The ZnO layer was deposited by spin coating the ZnO sol-gel precursor solution onto the cleaned substrates at 5000 rpm for 30 seconds and then the ZnO coated substrates were dried at 150° C. on a hot plate for 30 minutes in air to form a 20-nm thick electron transporting layer. After the drying, the ZnO coated substrates were transferred into a $N_2$-filled glove box.

The photoactive layers were formed on the ZnO coated substrates by spincoating the photoactive blending solutions. Spinning rates of the spin coater are 800 rpm and 1500 rpm for P3HT:PCBM and PBDB-T:IT-M, respectively. The active layer coated substrates were put onto a hotplate at 140° C. for 10 minutes. After coating the photoactive layers, vanadium oxide layer was coated on the photoactive layer (3000 rpm for 30 seconds) in air. Then, the substrates were moved to hot plate to dry the vanadium oxide layer at 80° C. for 10 minutes. To have the surface PCBM removed blend film, a rubber roller was used. After the thermal annealing in $N_2$ glove box, the blend film coated substrates were moved out to air and the adhesive tape (model #: S-9782) was placed onto the blend film surface. The tape attached substrates were moved onto the hotplate set for 100° C., and were softly pressed by rolling a rubber roller 5 times back and forth (~500 Pa). For the PBDB-T:IT-M, much less pressure was exerted onto the substrate (~200 Pa). Then, the substrates were moved out to a working bench to cool down the substrates for 10 minutes. After cooling down the substrates, the tapes attached onto the surface of the blend films were gently removed. After removal of the tape, vanadium oxide layer was formed in the same way as aforementioned. Finally, silver electrodes were deposited using a thermal evaporator at $\sim 5 \times 10^{-7}$ Torr.

For the PBDB-T:IT-M solar cell, $MoO_3$ (5 nm) layer was deposited prior to the silver electrode in the same vacuum chamber. A patterned shadow mask was used to define the top electrode area. The device active area was determined by the intersectional area of the bottom ITO and the top silver electrode, which is 1.8 mm$^2$. For the electron-only device, the device structure was based on ITO/ZnO/P3HT:PCBM/ZnO/Al. For the hole-only device, the device structure was based on ITO/PEDOT:PSS/P3HT:PCBM/$V_2O_5$/Ag. For the flexible OSCs, ITO sputtered PET substrates (100 Ω/sq, 5 mil) which have the same size of the ITO sputtered glass substrates were used with the following device structure: PET/ITO/ZnO/(P3HT:PCBM or PBDB-T:IT-M)/($V_2O_5$ or $MoO_3$)/Ag.

To obtain J-V characteristics of the solar cells, a Keithley 2400 source measurement unit was used. During solar cell measurement, the devices were put under a simulated light source having 100 mW cm$^{-2}$ with AM 1.5G filters in an $N_2$-filled glove box. For the constant load discharge test, the characterization was performed using a Bio-Logic potentiostat controlled by EC-Lab software, and during the measurement the devices were kept in 15-cm deep water under 10 kΩ constant load and 1 sun condition, and the data was recorded every second. For the first 10 seconds, open circuit voltage was measured, and then operating voltage and current under 10 kΩ constant load and light irradiation with the intensity of 100 mW cm$^{-2}$ were measured for 1800 seconds. For the electron-only device, voltage was exerted to bottom electrode (forward bias), and for the hole-only device, voltage was exerted to top electrode (forward bias).

The 180° peel-off test was performed using Instron 3345 operated at a peeling rate of 5 mm s$^{-1}$ with an adhesive tape (3M™ Super Bond Film Tape 396) of 18 mm in width. The sample, which has 1.5×1.5 mm in size, was mounted on the 75 mm long slide glass for a better grip to the instrument using a 5 minute epoxy glue (Gorilla Epoxy, Gorilla Glue Inc).

Bending tests were conducted at two different bending radii of 15 mm (corresponding to ~0.4% bending strain, $\varepsilon_{bending}$) until 9000 times of bend cycle and 7 mm ($\varepsilon_{bending}$=~9%) after 9000 times of bend cycle to accelerate the degradation. The repeated cyclic bending was conducted using Instron 3345 operated at 1 Hz.

UV-Vis absorption data was obtained from Varian Cary 3E UV-Vis spectrophotometer. X-ray photoelectron spectroscopy (XPS) measurements were performed on a SPECS GmbH instrument under ultrahigh vacuum (UHV) conditions. The X-ray source was Al Kα at a power of 300 W. Carbon K-edge Near-Edge X-ray Absorption Spectroscopy (NEXAFS) was measured on the bending magnet beam line 8-2 at Stanford Synchrotron Radiation Laboratory (SSRL) (Dupont, et al., Adv. Mater. Interfaces 2014, 1 (7), 1400135). The spherical grating monochrblomator (500 1 mm$^{-1}$) was operated with 40 μm by 40 μm slit with a resulting energy resolution of about 0.3 eV. All samples were mounted on an aluminum sample bar and electrically connected with carbon tape. The spectra shown in the article were acquired in the Total Electron Yield (TEY) mode, measured via the drain current without bias, i0. The incoming flux was normalized by a gold grid with freshly evaporated gold, positioned upstream of the sample chamber, intercepting 10-20% of the beam intensity. The NEXAFS spectra were collected over the range 250-340 eV at 350 and 55°. The film surface topography and phase images were measured under the AFM tapping mode (Bruker Dimension Fastscan AFM). The ToF-SIMS depth profiles were performed on ION-TOF instrument. To sputter the device from the BHJ film surface, 1 keV Cs$^+$ ions were used (sputtering area: 300 μm×300 μm), whereas a 30 keV Bi 3$^+$ beam was employed to analyze the composition distribution along the vertical direction, acquiring mass-to-charge ratios (m/q) of negatively charged secondary ion, e.g., S$^-$ (m/q=32) from the analysis area (100 μm×100 μm) centered at the sputtered region.

The results of the experiments will now be discussed.

Figure 3A:
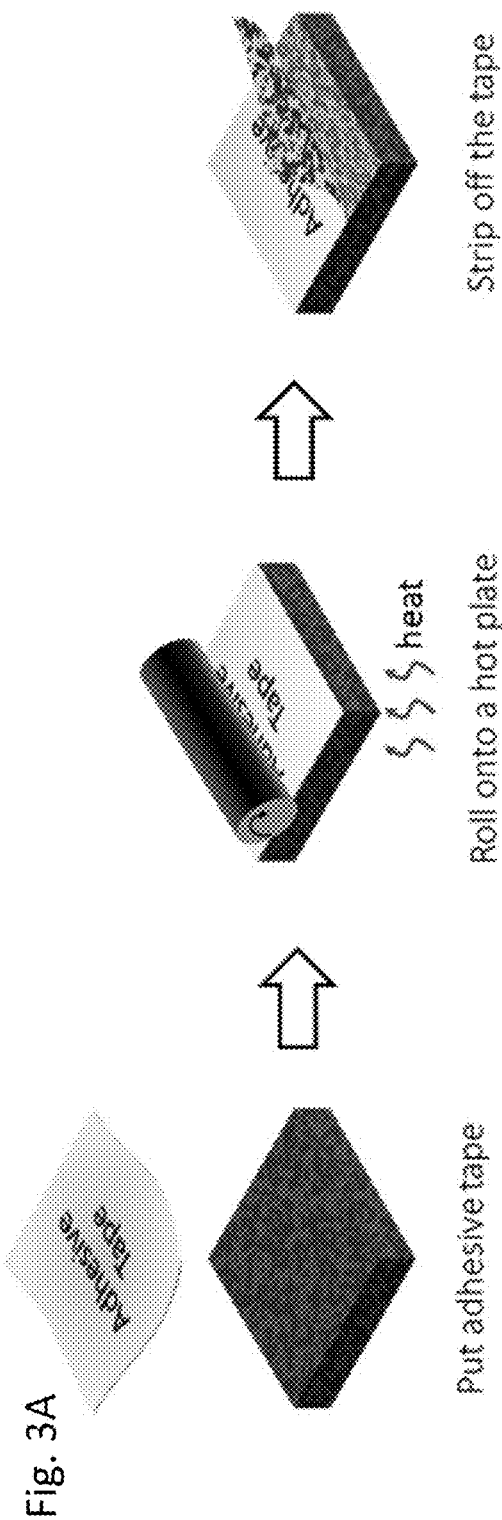
FIG. 3A is a schematic illustration for the application of a tape stripping method. The adhesive tape is a regular transparent Scotch tape (model #: S-9782).
Figure 3C:
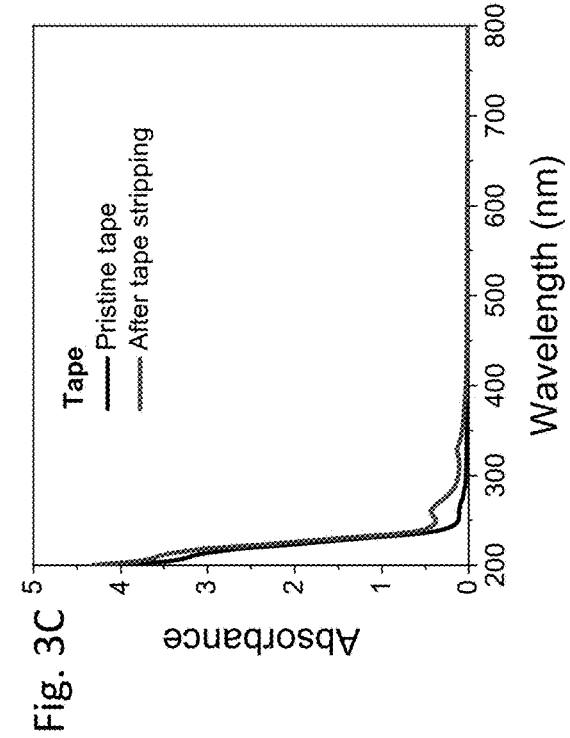
FIG. 3C depicts UV-Vis absorption data for the tape before and after tape stripping process.
Figure 3B:
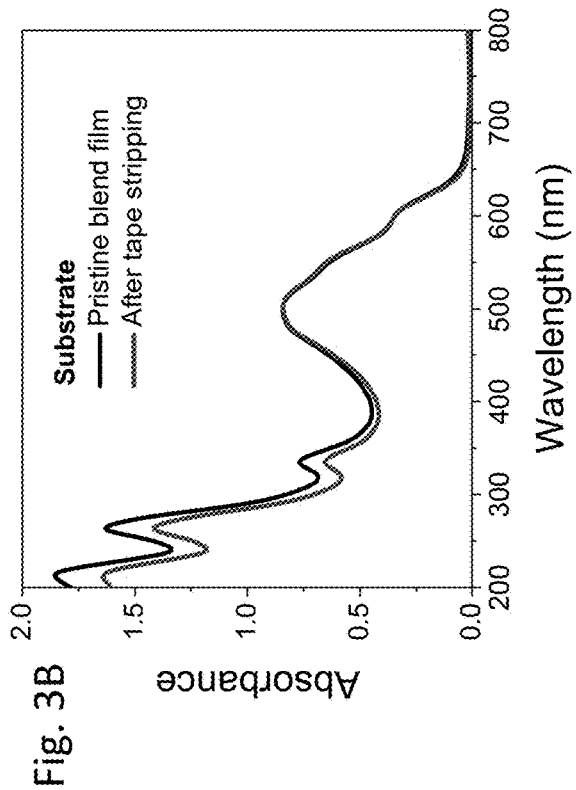
FIG. 3B depicts UV-Vis absorption data for the blend film before and after tape application.
Figure 4:
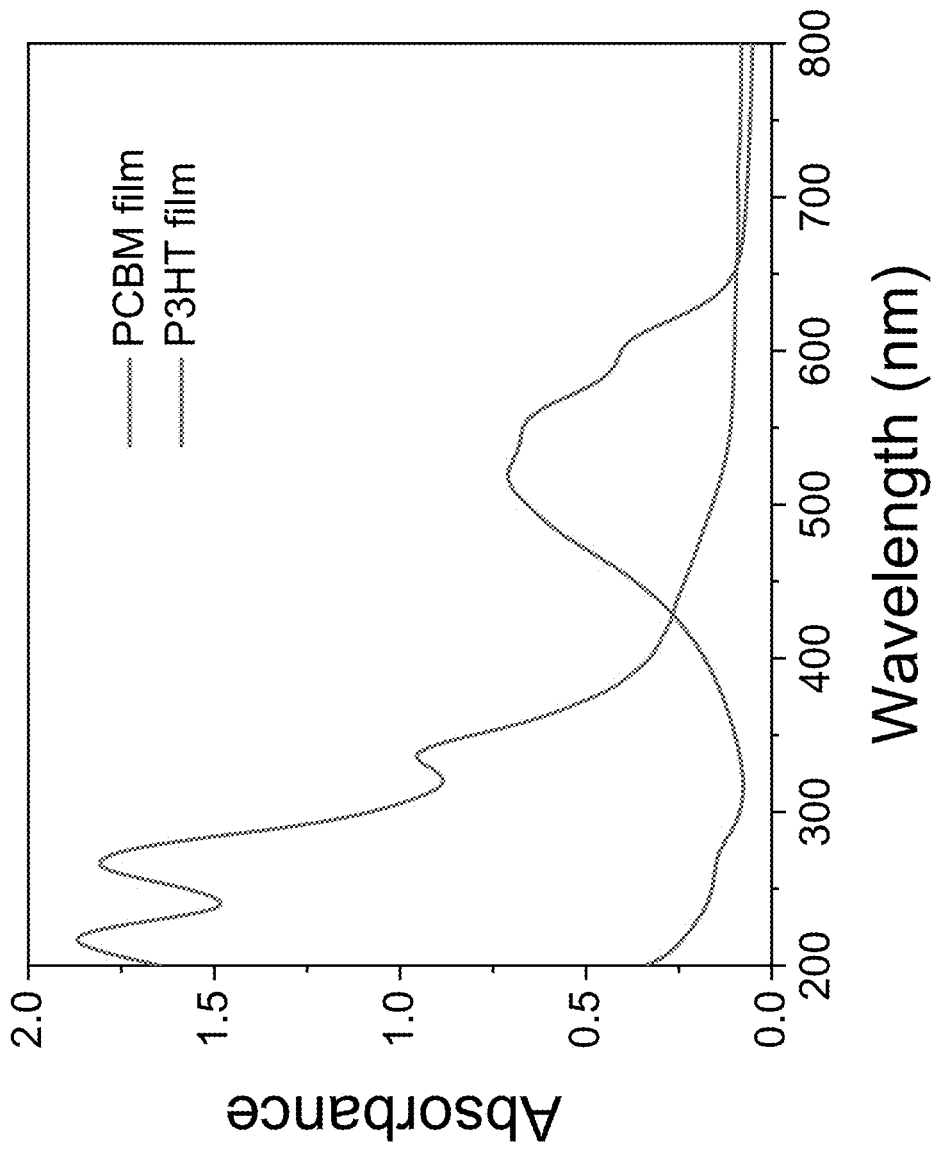
FIG. 4 depicts UV-Vis absorption spectra for neat P3HT and PCBM.

FIG. 3A illustrates the tape stripping process applied to a photoactive blend film consisting of electron-donating conjugated polymer, Poly(3-hexylthiophene) (P3HT), and electron-accepting conjugated small molecule, PCBM. First, the adhesive tape is applied onto the photoactive layer, and then the substrate is transferred to a hot plate set at 60° C. where a roller is used to gently press the tape onto the photoactive layer. After the substrate is cooled down to room temperature, the adhesive tape is slowly removed from the film surface. FIG. 3B and FIG. 3C are the UV-Vis absorption data for the substrate and tape before and after the application of tape stripping process, respectively. The absorbance of the photoactive layer in the 200 nm to 450 nm range is reduced after application of the adhesive tape (FIG. 3B), which corresponds to the increased absorption of the tape side in the same wavelength range (FIG. 3C). The spectral absorbance change of the blend film (tape side) largely matches with the PCBM absorption spectrum (FIG. 4).

Figure 5:
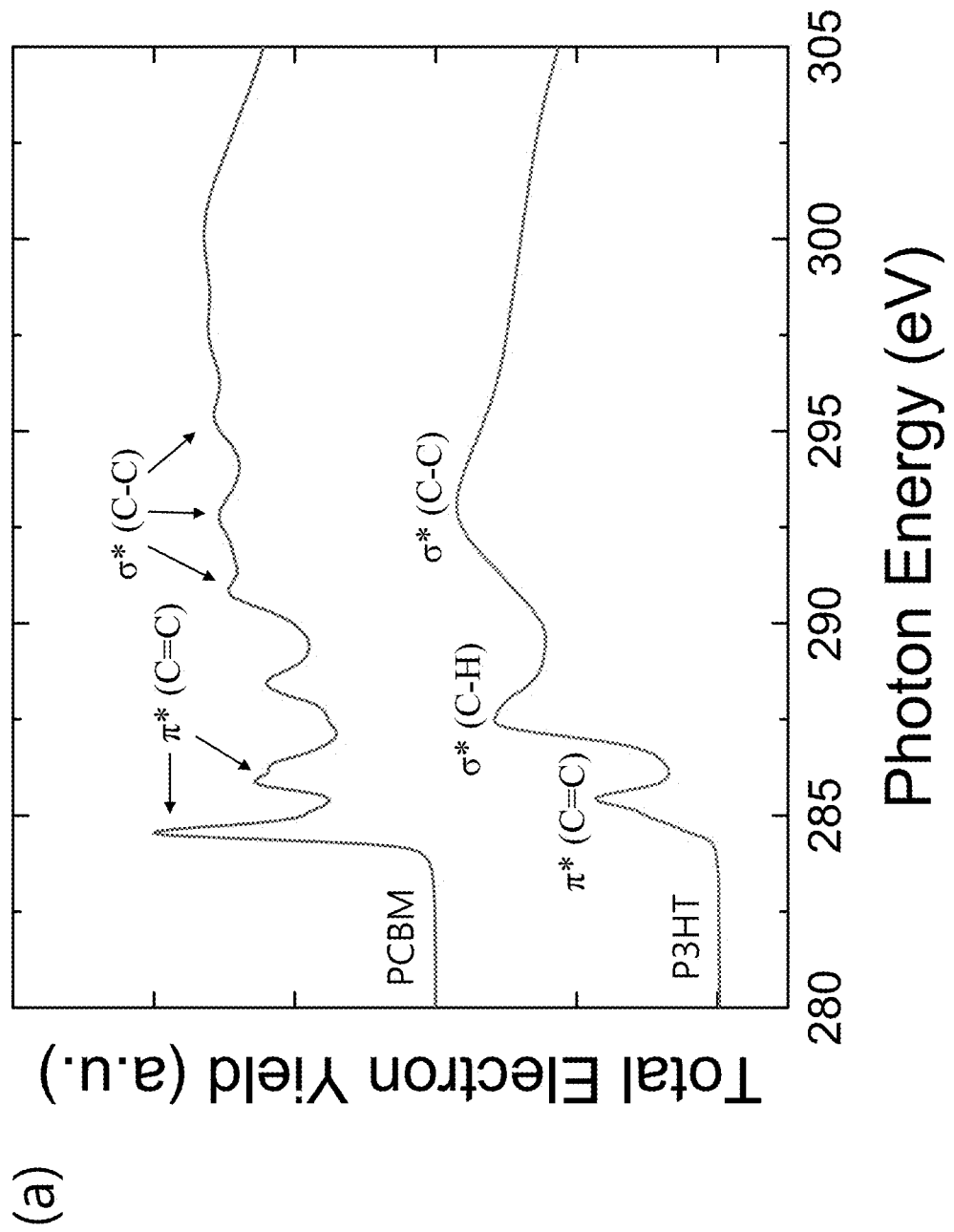
FIG. 5 depicts the NEXAFS spectra of individual components of PCBM and P3HT, respectively.
Figure 7A:
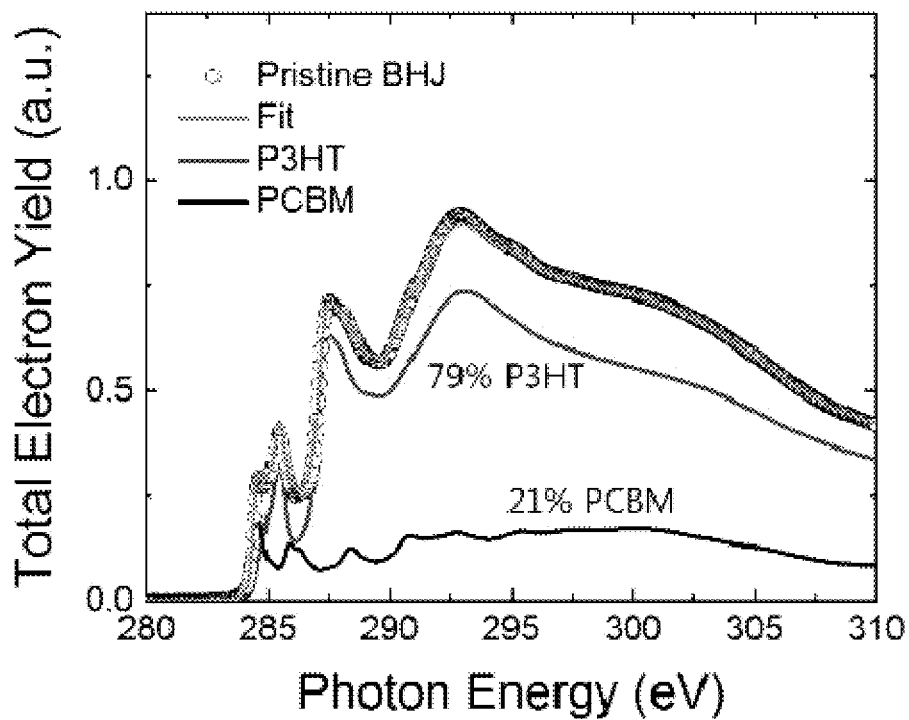
FIG. 7A depicts NEXAFS spectra collected over the range 250-340 eV at 35° for a pristine blend film with fits and scaled component spectra.
Figure 7B:
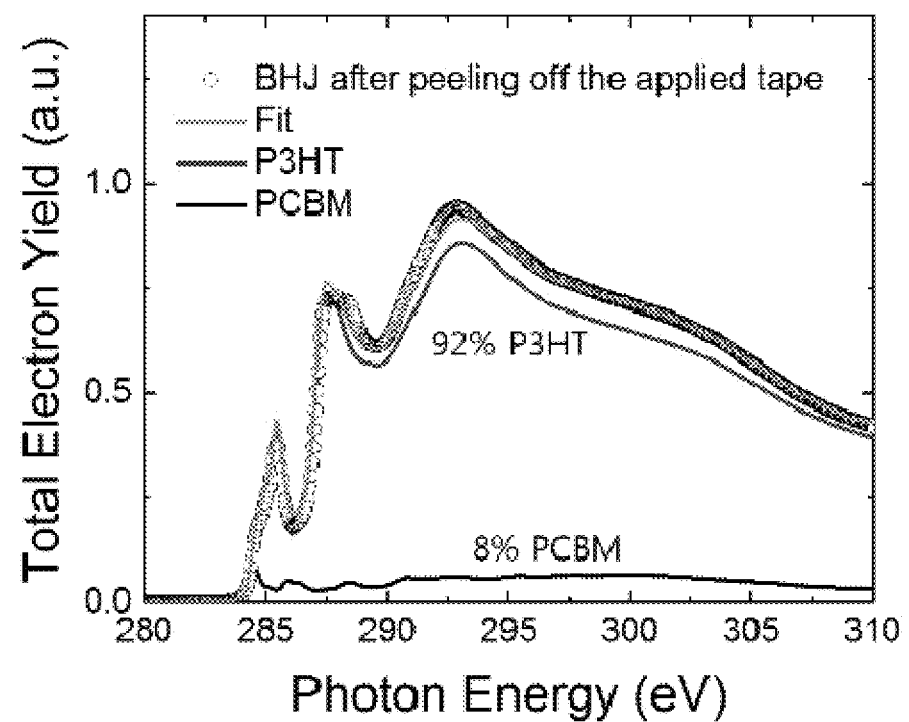
FIG. 7B depicts NEXAFS spectra collected over the range 250-340 eV at 350 for a blend film after peeling off the applied tape with fits and scaled component spectra.

To quantify the surface composition of the pristine and tape-peeled-off photoactive layer films, carbon K-edge Near Edge X-ray Absorption Fine Structure (NEXAFS) spectra of the neat PCBM and P3HT films as well as the blend films before and after the tape stripping process were measured (Dupont, et al., Adv. Mater. Interfaces 2014, 1 (7), 1400135). Because NEXAFS spectroscopy is an effective technique capable of detecting sub-nanometer depth variation in atomic concentrations (Krishnan, et al., Macromolecules 2010, 43 (10), 4733-4743), this technique was used to accurately analyze the composition of the topmost surface within a few nanometers of the sampling depth. The carbon K-edge NEXAFS spectra for the neat P3HT and PCBM are provided in the supplementary information and used to assign characteristic resonance peaks for each component in the blend films (FIG. 5). The surface composition of each film was achieved from the linear superposition of the pure P3HT and PCBM spectra, and fit numerically to the NEXAFS spectra of the blend films (Dupont, et al., Adv. Mater. Interfaces 2014, 1 (7), 1400135; Krishnan, et al., Macromolecules 2010, 43 (10), 4733-4743). The surface composition of the pristine blend film was found to be a sum of 82% P3HT and 18% PCBM, (FIG. 6A). Noticeably, after applying the adhesive tape on the blend film, the PCBM ratio on the surface significantly reduces to 6%, while the P3HT content on the surface increases to 94% (FIG. 6B). NEXAFS spectra collected at a different angle, 350, also confirmed the selective removal of the PCBM component on the surface (FIG. 7A and FIG. 7B).

Figure 8A:
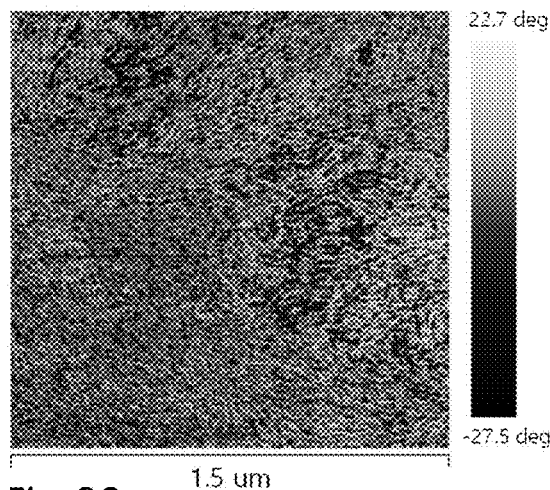
FIG. 8A through FIG. 8F depict surface morphology changes after tape stripping process on the P3HT:PCBM blend film.
Figure 8B:
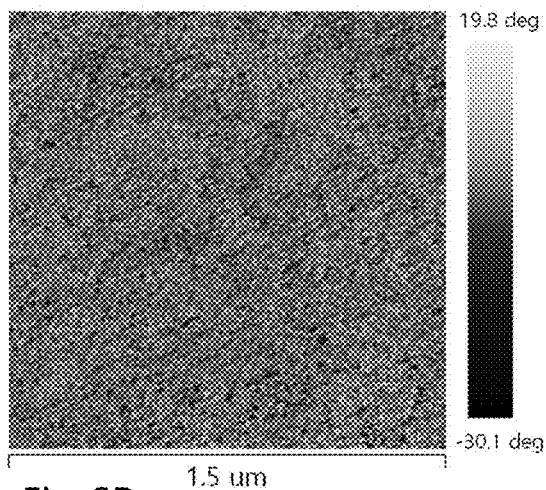
Figure 8C:
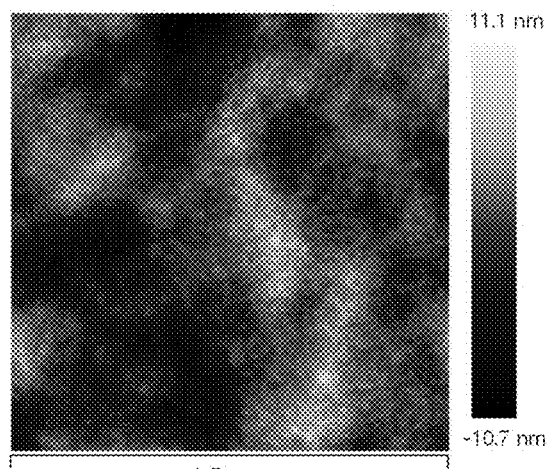
Figure 8D:
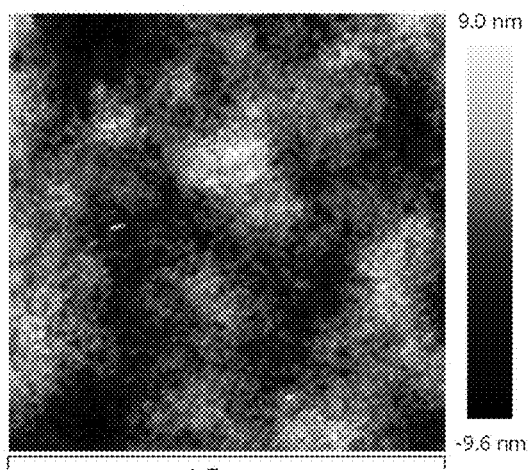
Figure 8E:
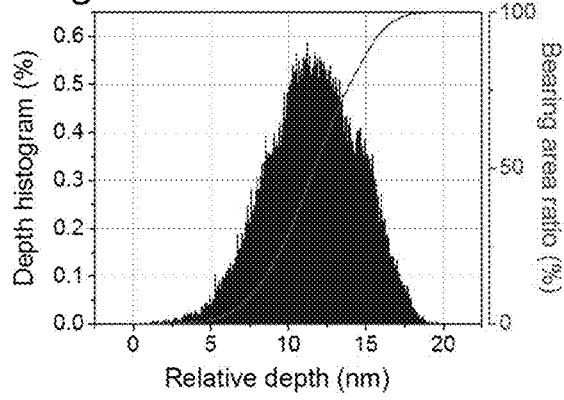
Figure 8F:
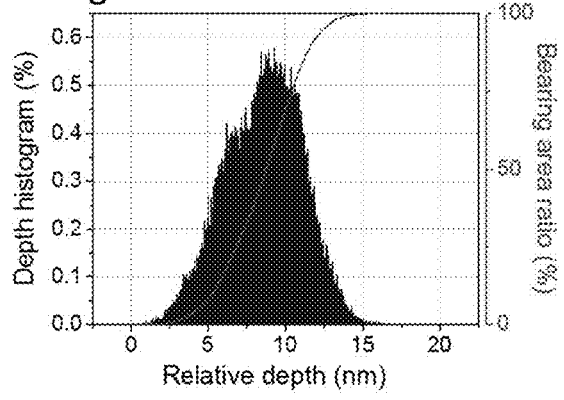
Figure 9:
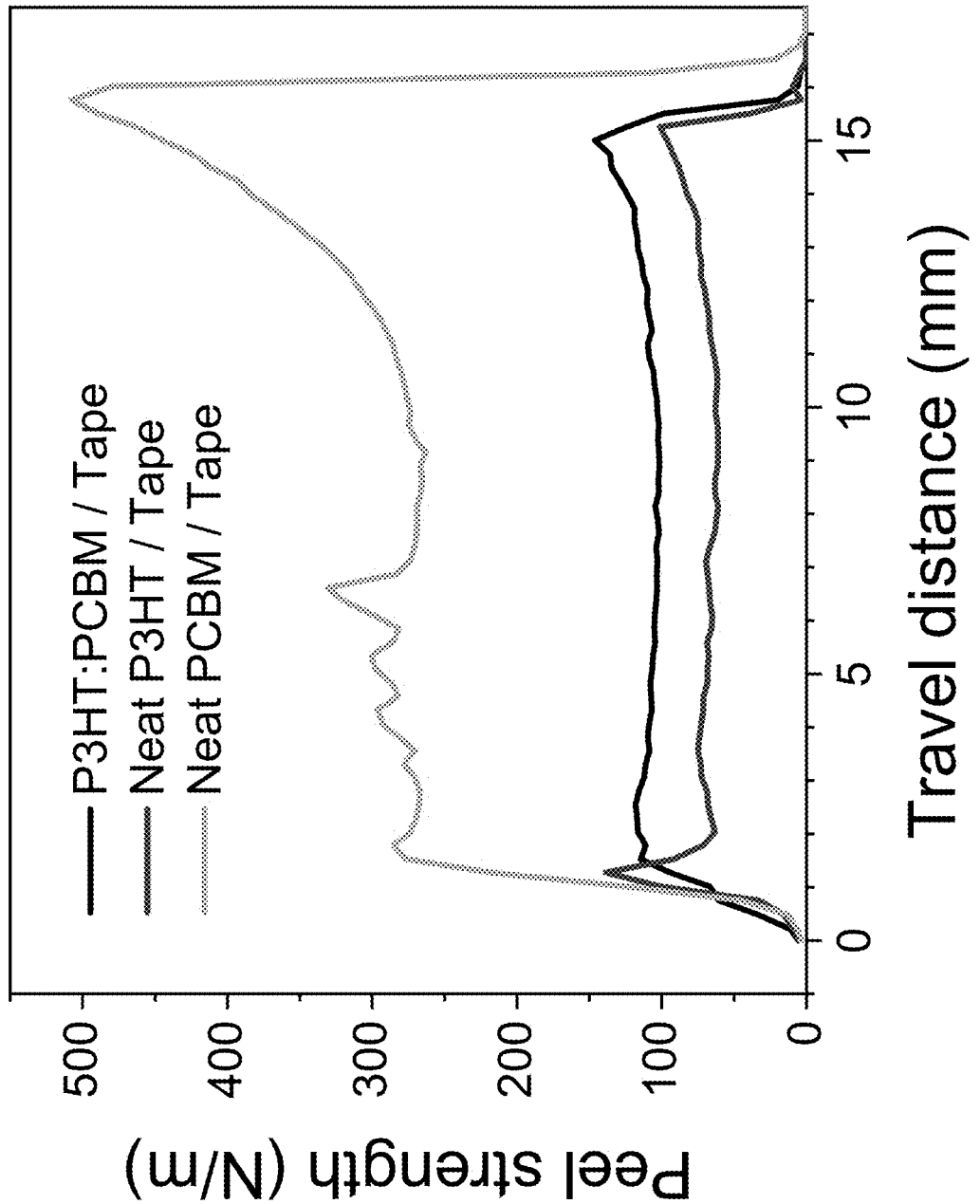
FIG. 9 is a plot of peel strength tests for Glass/ITO/ZnO/(P3HT:PCBM or P3HT or PCBM) with the same adhesive tape that was used for the stick-and-peel process during the solar cell fabrication.

Phase-contrast AFM analysis also supports that the PCBM is preferentially removed from the blend film surface after tape peel off (FIG. 8A and FIG. 8B). Dark dotted spots on the surface of the pristine blend film (FIG. 8A) are estimated to be PCBM molecules and clusters. In contrast, the surface where the adhesive tape was applied and removed rarely exhibits any dark dotted spots on it (FIG. 8B). Thus, the PCBM molecules and clusters are removed from the surface, leaving small pits in their place as shown in AFM topology images (FIG. 8C and FIG. 8D). In FIG. 8E and FIG. 8F, the depth profile shows that shallow dips are created at low depth range for the film after the tape stripping process. At the same time, the root mean square roughness reduces from 3.01 nm to 2.74 nm, and the bearing ratio profile curve also shifts toward a lower depth (FIG. 8E and FIG. 8F). These results suggest: (1) the pressure exerted during the rolling process flattens the photoactive layer, while enabling the tape to intimately adhere to the blend film surface, and (2) the component having a higher degree of freedom (e.g. PCBM) and/or higher adhesion force to the tape is removed from the photoactive layer. Indeed, the adhesion force between the tape and the neat PCBM film is about 5 times higher than that between the tape and the neat P3HT film (FIG. 9).

The adhesion of an electrode on an OSC device is crucial for reliability, especially for the devices created on flexible substrates. The electrode adhesion was examined for the pristine and the surface PCBM removed blend films created on the basic device structures: Glass/ITO/ZnO/(P3HT: PCBM or single component)/Ag or Glass/ITO/ZnO/(P3HT: PCBM or single component)/V$_2$O$_5$/Ag (FIG. 10).

Figure 10A:
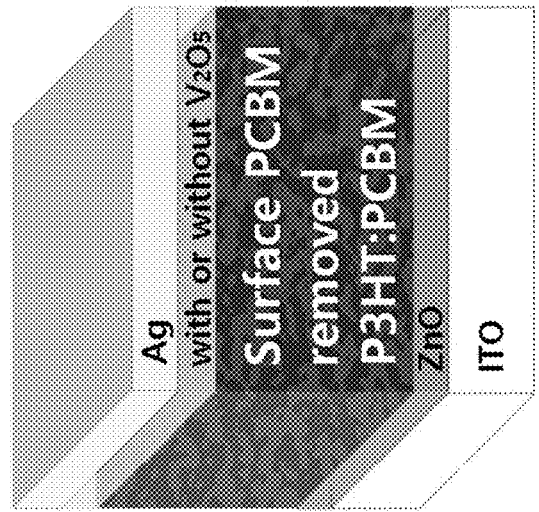
FIG. 10A through FIG. 10D depict tape peel test samples having basic device structures.
Figure 10B:
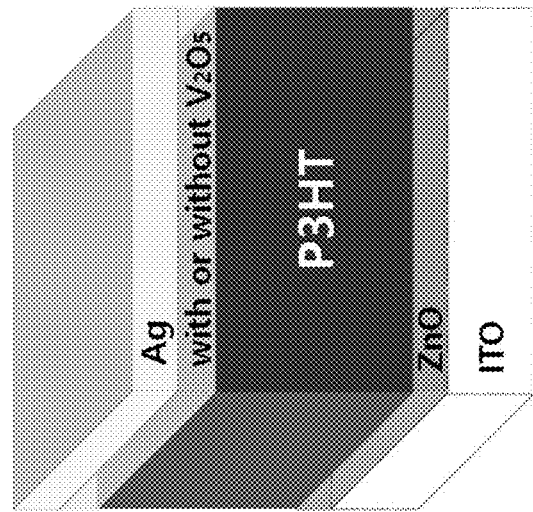
Figure 10C:
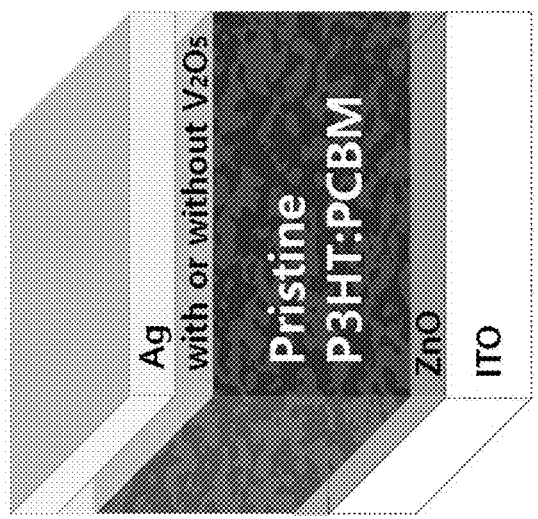
Figure 10D:
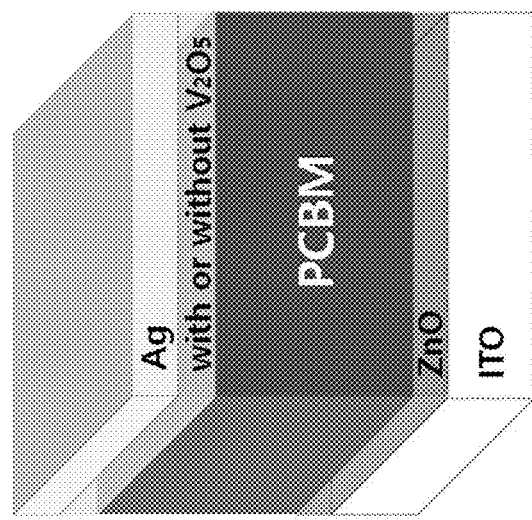
Figure 11:
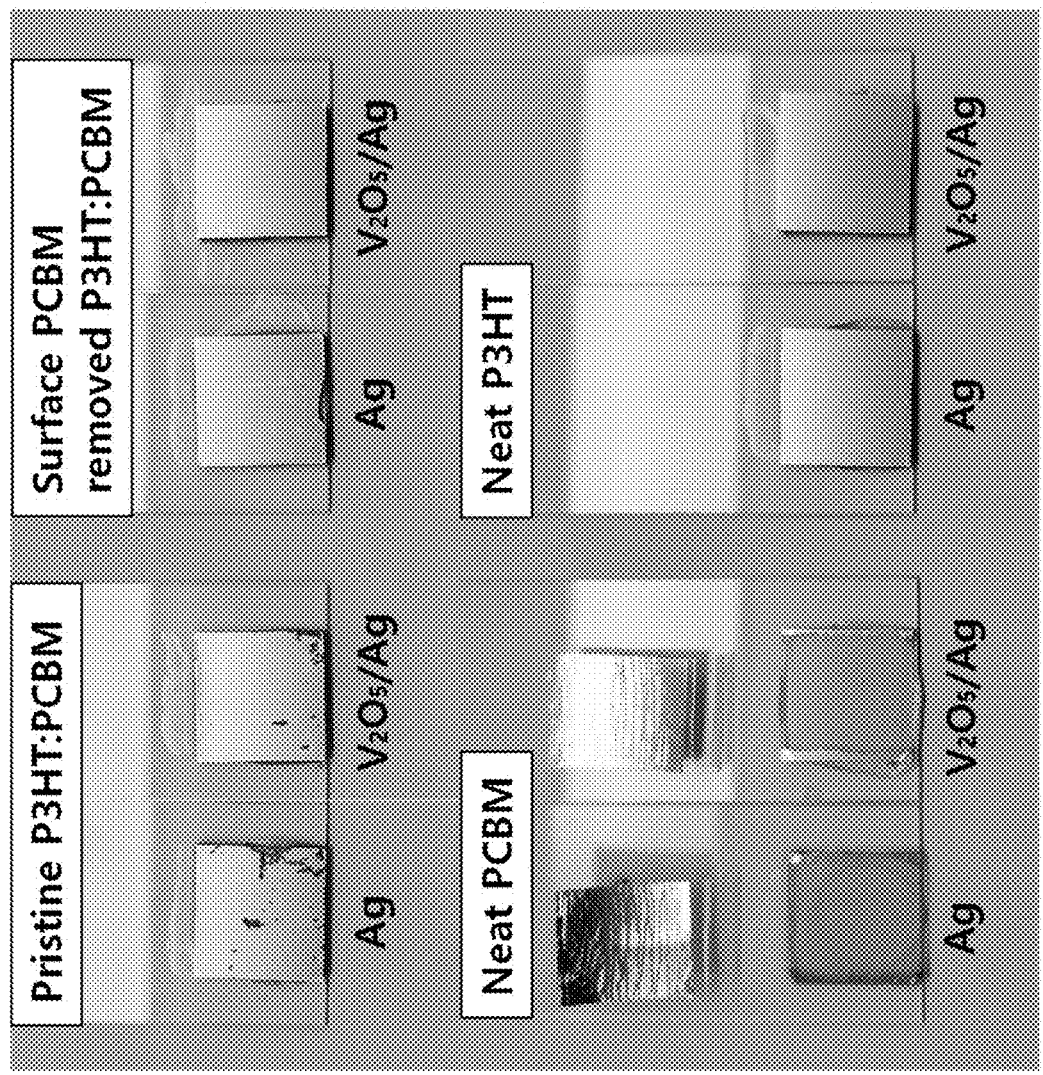
FIG. 11 is a series of photographs of resulting samples after tape peel tests. All samples have basic device structures: Glass/ITO/ZnO/(P3HT:PCBM or Single component)/Ag or Glass/ITO/(ZnO/P3HT:PCBM or Single component)/$V_2O_5$/Ag. The four samples on the upper row were prepared based on P3HT:PCBM blend films. Among them, the two samples on the upper left corner were prepared with pristine BHJ films, whereas the other two samples on the upper right corner were prepared using surface PCBM removed blend films. The four samples on the bottom row have a single component layer such as PCBM or P3HT, instead of P3HT:PCBM blend film.
Figure 12A:
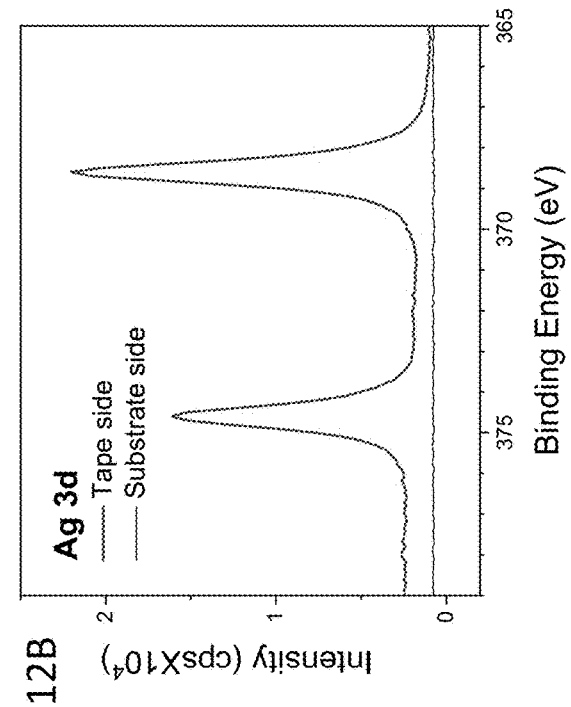
FIG. 12A depicts the XPS spectra in Ag 3d region for tape side and PCBM substrate side after tape peel test with Glass/ITO/ZnO/PCBM/Ag sample.
Figure 12B:
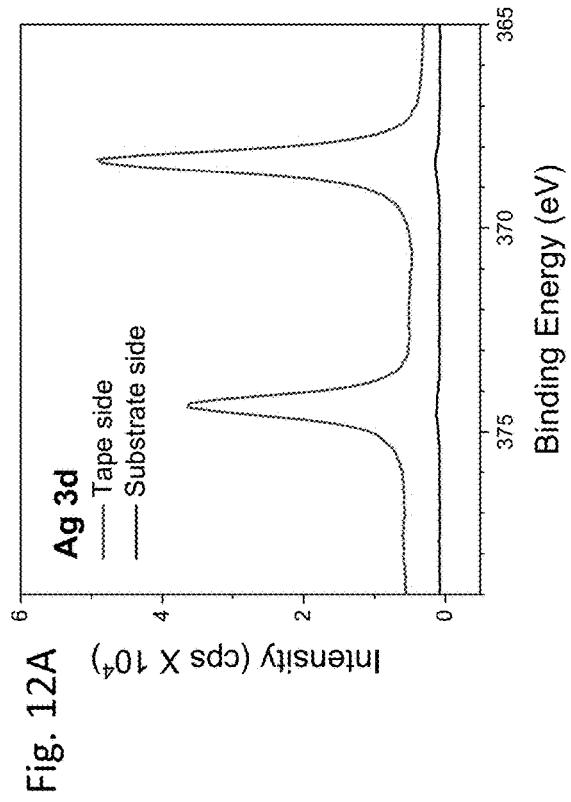
FIG. 12B depicts the XPS spectra in Ag 3d region for tape side and PCBM substrate side after tape peel test with Glass/ITO/ZnO/PCBM/$V_2O_5$/Ag sample.
Figure 12C:
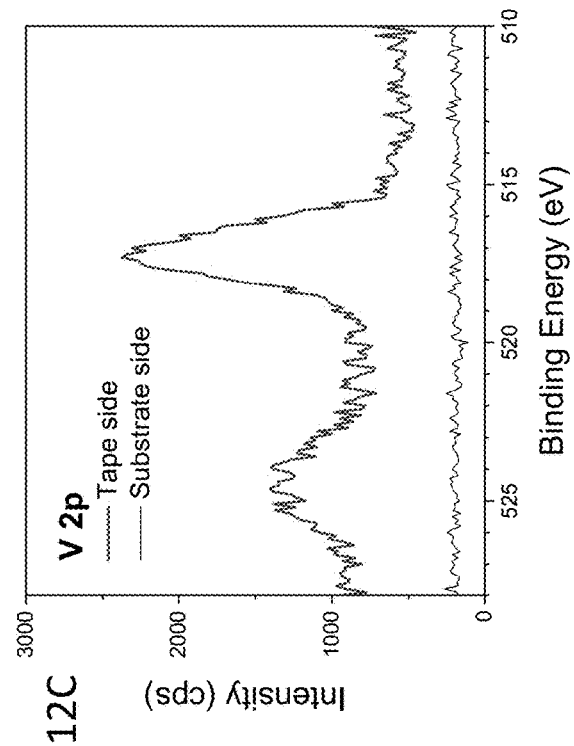
FIG. 12C depicts the XPS spectra in V 2p region for tape side and PCBM substrate side after tape peel test with Glass/ITO/ZnO/PCBM/$V_2O_5$/Ag sample.
Figure 13:
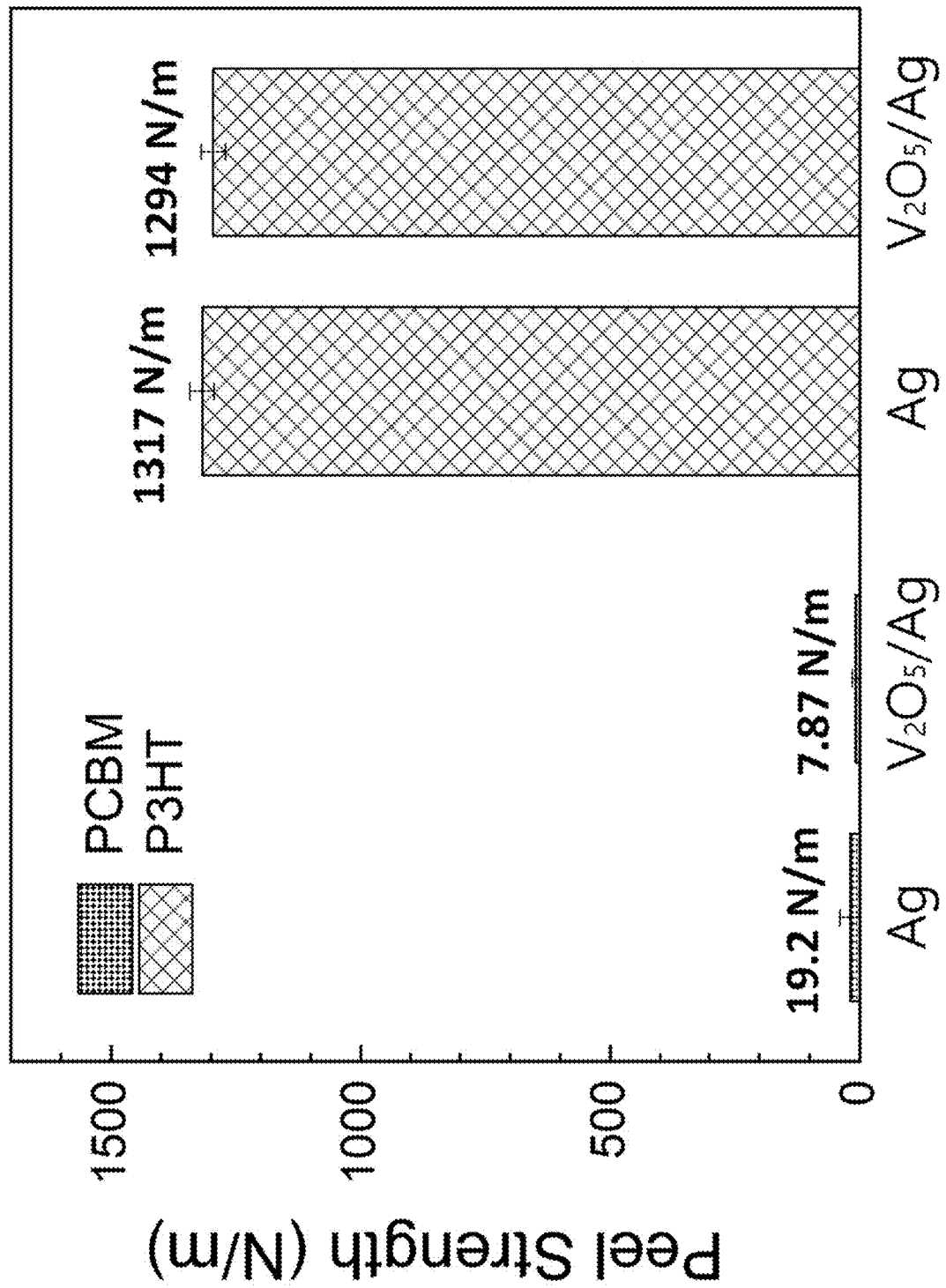
FIG. 13 is a plot of peel strengths for the four samples on the bottom row of FIG. 11. Large differences in peel strength are found between PCBM and P3HT groups.
Figure 14A:
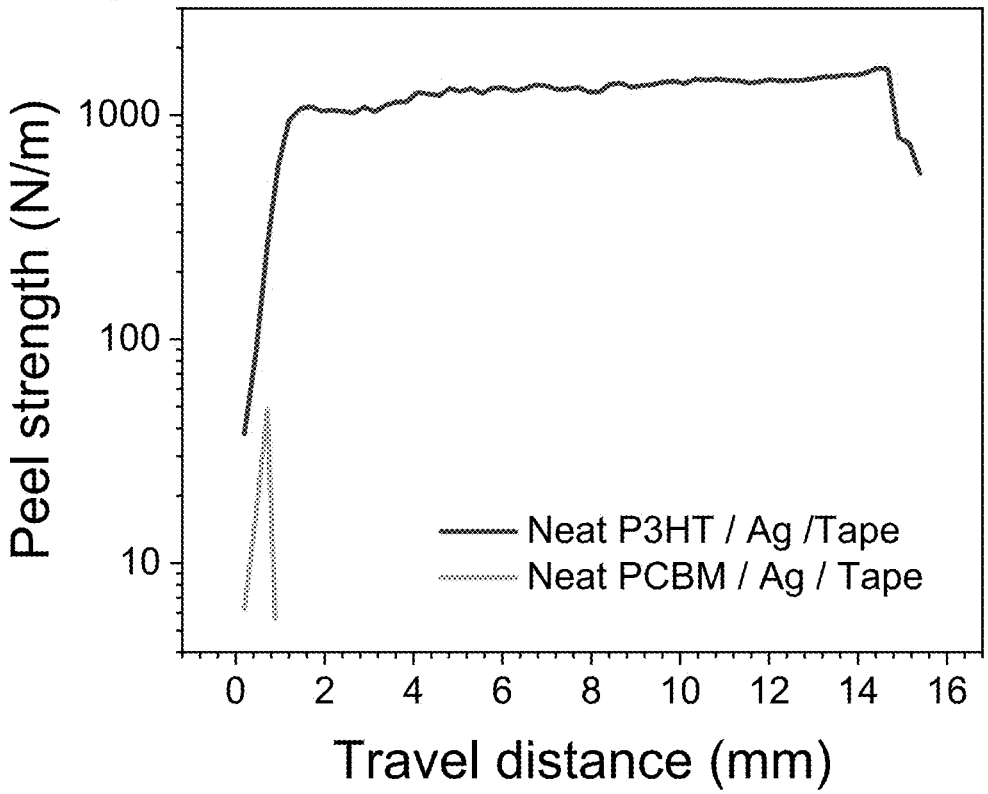
FIG. 14A is a plot of peel strength over the travel distance during tape peel test for Glass/ITO/ZnO/(P3HT or PCBM)/Ag samples.
Figure 14B:
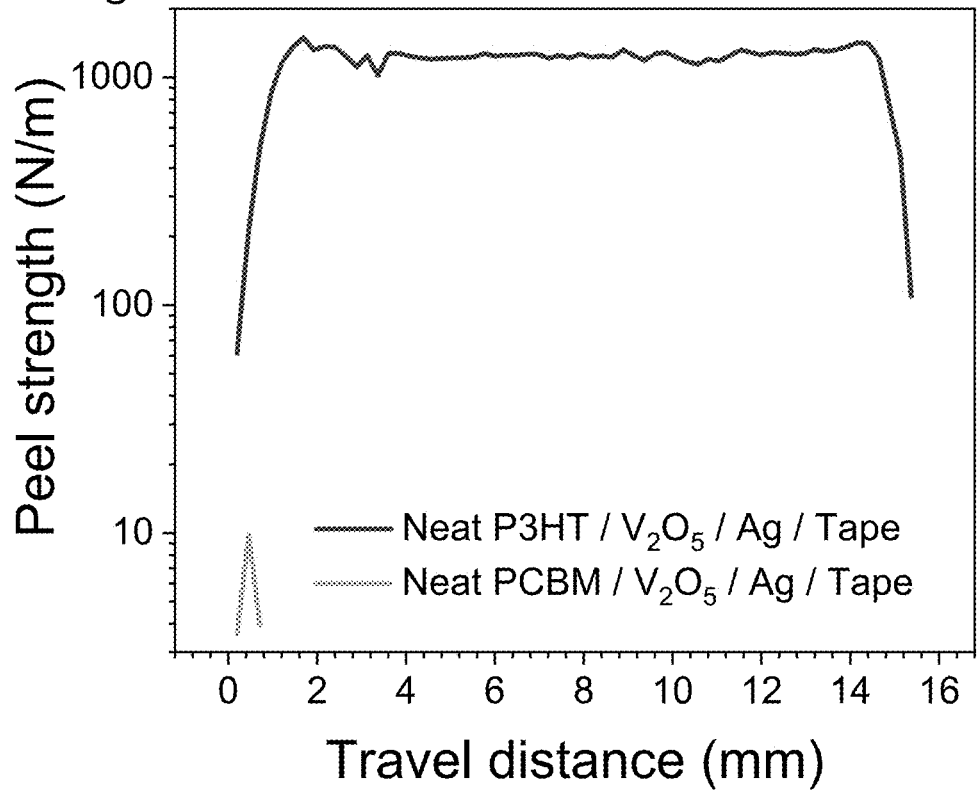
FIG. 14B is a plot of peel strength over the travel distance during tape peel test for Glass/ITO/ZnO/(P3HT or PCBM)/$V_2O_5$/Ag samples.

To qualitatively compare the electrode adhesions on the pristine and surface PCBM removed blend films, a strong adhesive tape (3M™ Super Bond Film Tape 396) was applied to the top surface of the samples and quickly peeled off, in order to see if the top electrodes were detached from the photoactive layers. In the pristine P3HT:PCBM samples (FIG. 10A), partial damage was observed on the top electrodes (FIG. 11; top left corner), whereas no apparent damage was found on the top electrodes of the surface PCBM removed P3HT:PCBM samples (FIG. 11; top right corner, FIG. 10B). This result suggests that removing the surface PCBM enhances the electrode adhesion regardless the intermediate layer (V$_2$O$_5$), which in turn suggests that PCBM may be a major contributor to the weakened electrode adhesion. To clearly demonstrate the impact of PCBM on the electrode adhesion, samples were prepared with neat PCBM and neat P3HT, respectively. For the neat PCBM samples (FIG. 11; bottom left corner) all the top electrodes were easily peeled off, being completely transferred to the adhesive tape. To identify the cleavage separating the two parts, the surfaces were analyzed using XPS spectra. In the XPS spectra of the Ag 3d region for the Glass/ITO/ZnO/PCBM/Ag sample (FIG. 10C), it was found that the silver electrode was completely transferred to the tape side after the tape peel test (FIG. 12A). For the Glass/ITO/ZnO/PCBM/$V_2O_5$/Ag sample (FIG. 10C), the silver and vanadium signals were only found on the tape side while no silver and vanadium peaks were detected on the surface of PCBM substrate side (FIG. 12B and FIG. 12C). Thus, Glass/ITO/ZnO/PCBM/Ag and Glass/ITO/ZnO/PCBM/$V_2O_5$/Ag samples were cleaved along the interface between the PCBM and Ag (or $V_2O_5$/Ag). To obtain a quantitative adhesion strength between the top electrode and the PCBM, 180° peel tests were conducted using a uni-axial tensile machine Instron 3345. The peel strength between the PCBM and the Ag electrode is about 19.2 N/m, while that between the PCBM and $V_2O_5$/Ag electrode is about 7.87 N/m (FIG. 3b**). On the other hand, the neat P3HT samples (FIG. 10D) show no apparent damage on the electrodes (FIG. 11; bottom right corner), and peel strengths obtained from the neat P3HT samples are two orders of magnitude higher (~1300 N/m) than those from the PCBM samples (FIG. 13, FIG. 14A, and FIG. 14B). The drastic difference between the cases of P3HT and PCBM might be attributed to the Lewis acid-based interaction. In the XPS data for silver (FIG. 12A and FIG. 12B), the silver electrode surface incorporates a certain portion of silver oxide ($Ag_2O$, 367.8 eV), which confirms that the natural oxide can be formed at the silver surface or interface (Waterhouse, et al., Surf. Interface Anal. 2002, 33, 401-409). In organic chemistry, silver oxide is used as a mild oxidizing agent which oxidizes aldehydes to carboxylic acids (Liu, et al., Sci. Adv. 2015, 1, e1500020) and is also considered a Lewis acid. Since the Lewis acid-base interaction is the major molecular interaction for bonding and adhesion (Lee, J. Adhes. 1994, 46, 15-38), Lewis acidic silver oxide will interact with a Lewis basic moiety such as the thiophene group in the P3HT polymer chains, and in turn the interaction gives a strong bonding in between P3HT and silver electrode (Wang, et al., J. Mater. Chem. C, 2017, 5 (10), 2686-2694). Vanadium oxide, which is used for a hole transport layer, has also been used as an oxidizing agent, so it would play a same role in the bonding between P3HT and silver electrode (Kim, et al., Adv. Energy Mater. 2014, 4 (8), 1301502). In contrast, PCBM contains a butyric acid methyl ester group, whose property may be considered closer to a Lewis acid, as a side chain, silver oxide or vanadium oxide might not preferentially react with the same type of Lewis acidic moiety of the PCBM; rather, a repulsive interaction may occur. Therefore, the silver electrode is tightly attached to the P3HT polymer layer but is easily peeled off the PCBM layer. However, there are a lot of factors which could affect the conclusion of the bonding mechanism; for instance, electrostatic, polarization, charge transfer, exchange repulsion and coupling of any of the four interactions between the two media. Therefore, this is one of the possible mechanisms which are open to be investigated theoretically and experimentally in the future. Besides that, in order to get the actual adhesion strength between P3HT and a top electrode, stronger tape or bond needs to be used. The top electrodes were not stripped off with the tape, suggesting that the actual adhesion strength between the P3HT and the top electrode should be higher than 1300 N/m.

Figure 15B:
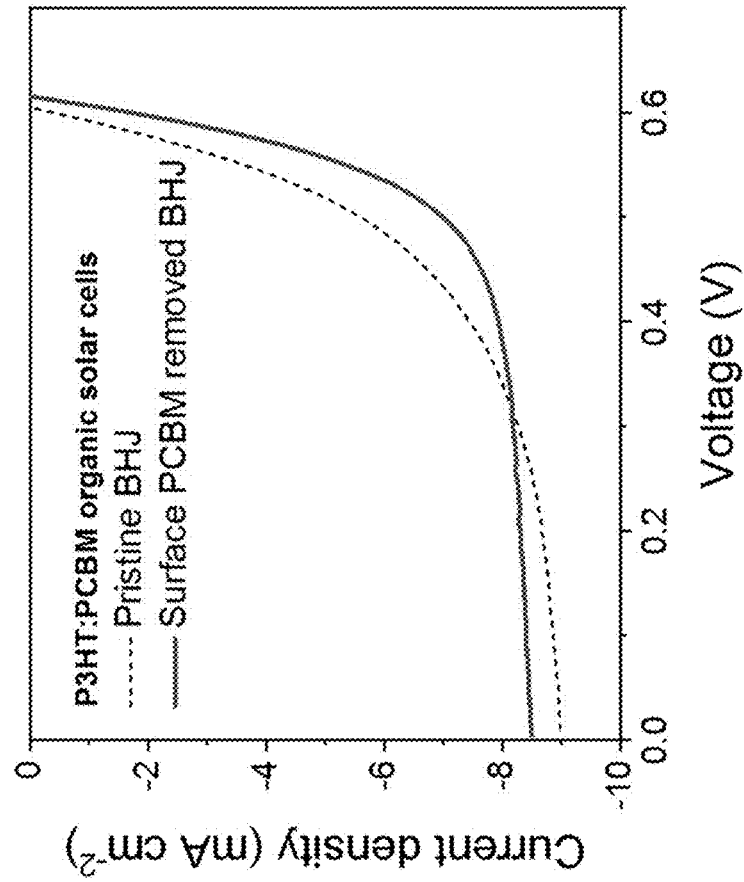
FIG. 15B depicts J-V characteristic curves for pristine and surface PCBM removed P3HT:PCBM blend films, respectively.
Figure 15A:
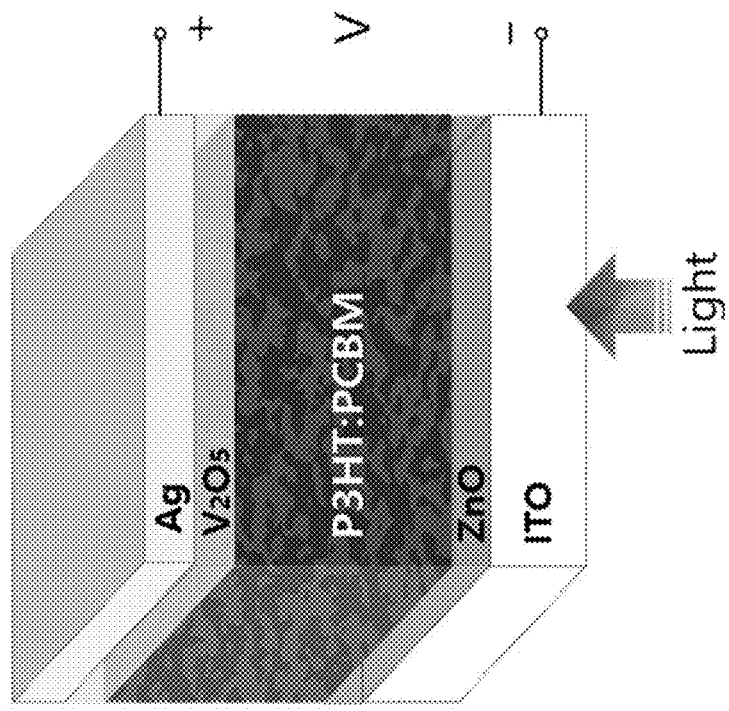
FIG. 15A is an exemplary device structure showing the direction of incident light.
Figure 16:
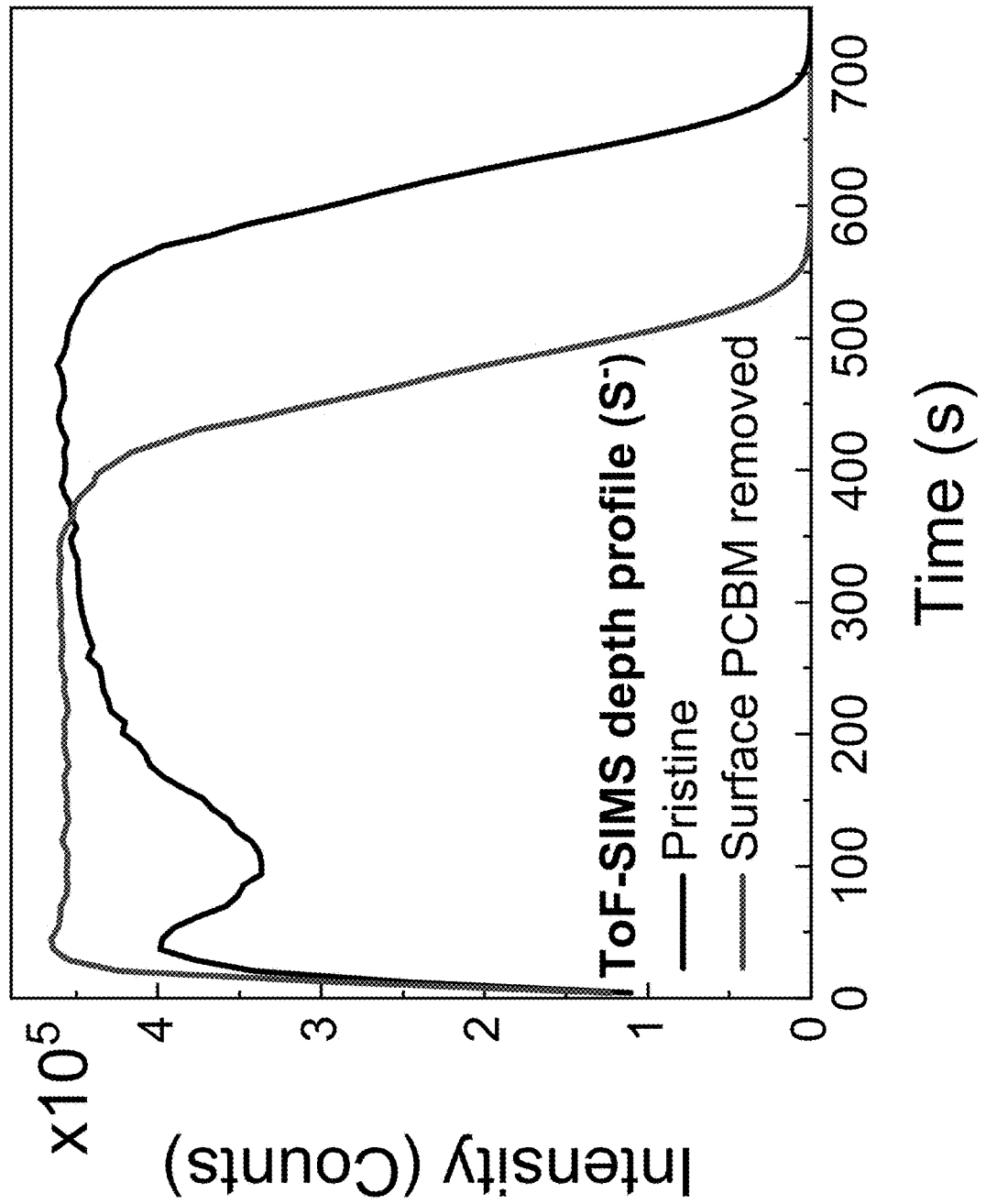
FIG. 16 depicts ToF-SIMS depth profiles of the pristine and the surface PCBM removed blend films. Depth profiling starts from the top surface of a blend film at 0 seconds.
Figure 17:
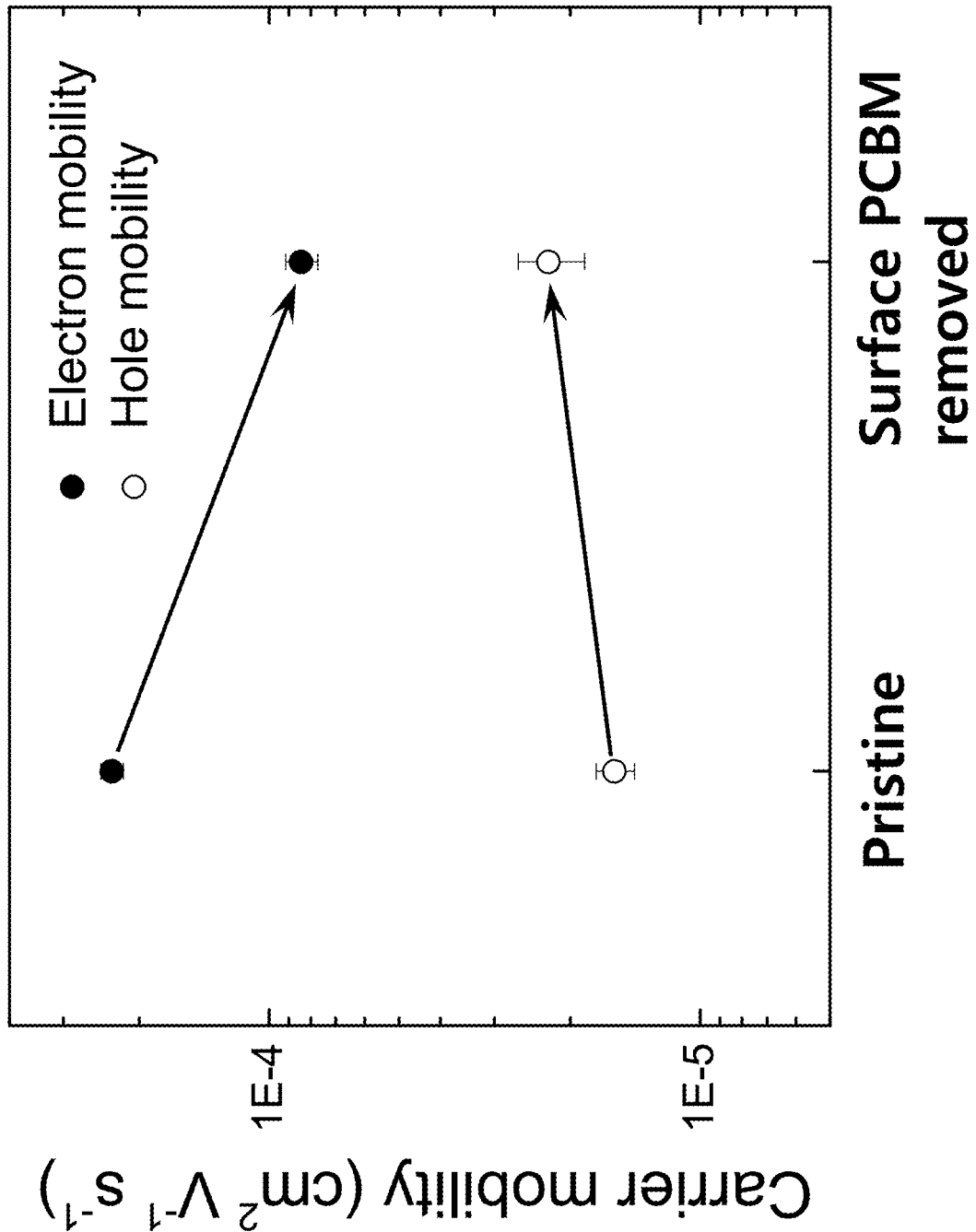
FIG. 17 depicts changes in charge carrier mobility of electron and hole between the devices using the pristine and the surface PCBM removed P3HT:PCBM blend films, respectively.

To investigate the influence of the surface-PCBM removal on the device performance, solar cells were fabricated using the pristine and the surface PCBM-removed blend films based on the inverted structure, respectively (FIG. 15A). A distinctive change in the fill factor, which increased from 0.56 to 0.69 (FIG. 15B), can be attributed to the enhanced charge carrier selectivity and Ohmic transition at the anode contact (Steim, et al., J. Mater. Chem. 2010, 20, 2499-2512; Ratcliff, et al., Adv. Energy Mater. 2013, 3 (5), 647-656). Typically, high selectivity of charge carriers is accomplished by blocking undesired charge carriers while consistently collecting energetically favorable charge carriers (Ratcliff, et al., Adv. Energy Mater. 2013, 3 (5), 647-656). The P3HT-rich surface layer, from which the PCBM was mostly removed, acts as an energetic barrier for electrons and at the same time ensures a better Ohmic contact toward the anode (Tan, et al., Nat. Commun. 2018, 9, 3269). The time-of-flight secondary ion mass spectrometry (ToF-SIMS) depth profiles of $S^-$, which represent the P3HT content, also confirm that the blend film after tape stripping has better compositional distribution for charge collection in the vertical direction (FIG. 16). In the pristine photoactive layer (FIG. 16) the dip near the top surface indicates that this layer is relatively rich in PCBM near the top surface. However, after the application of the tape stripping process (FIG. 16; solid line) the dip disappears, and the $S^-$ peak intensifies toward the top surface. Thus hole charge carriers can be efficiently collected by the anode without any traps. This finding is confirmed by the fact that the charge carrier mobility becomes balanced after the surface PCBM removal (FIG. 17). Conversely, the slight reduction in the $J_{SC}$ might be attributed to either the thickness decrease of the photoactive layer (i.e. the effective thickness decrease due to the lack of electron acceptor in the photoactive layer surface) or the $V_2O_5$-doped inactive P3HT in the photoactive layer surface, which is not contributing to photocurrent (Kim, et al., Adv. Energy Mater. 2014, 4 (8), 1301502).

Figure 18:
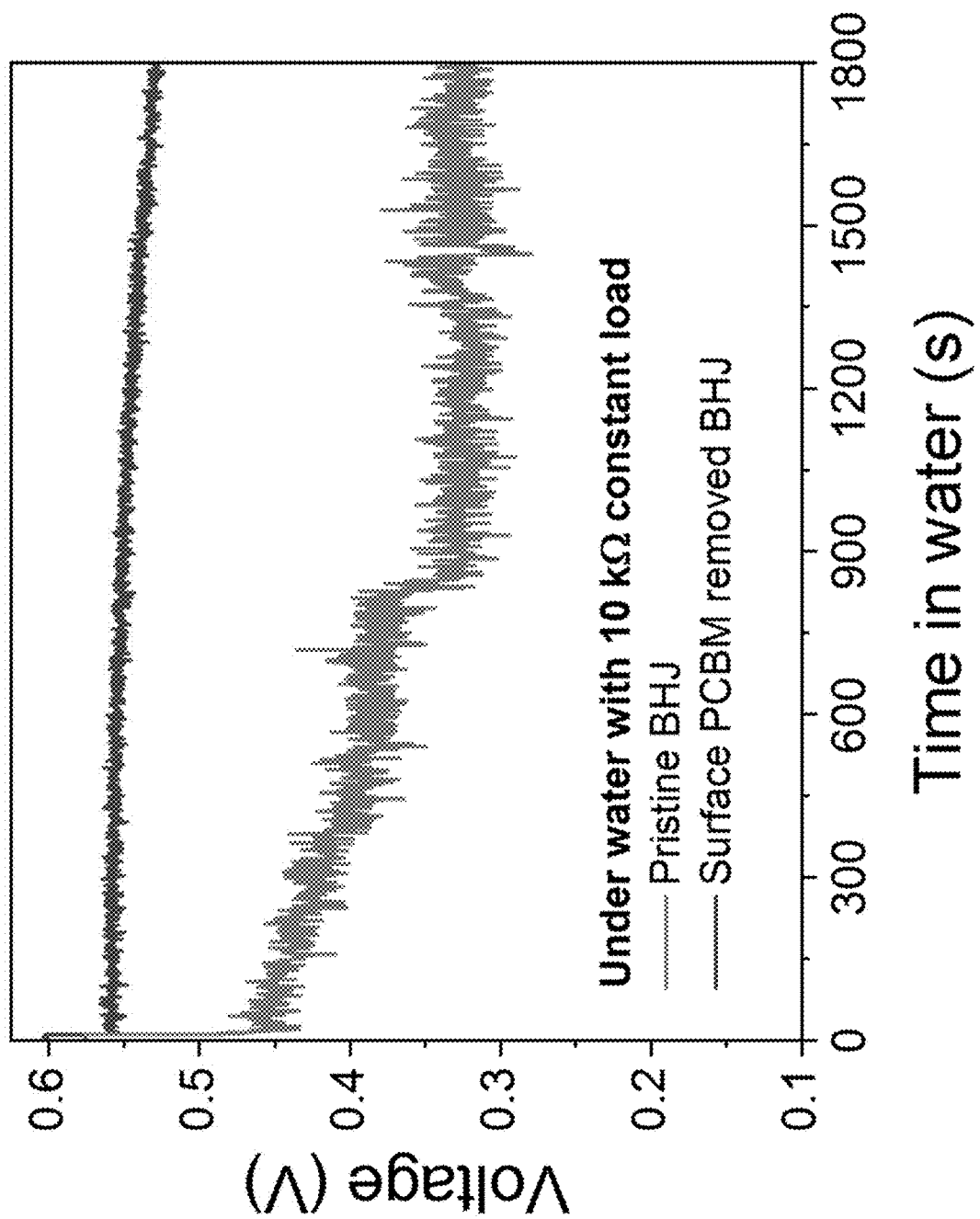
FIG. 18 shows the effect of water submersion on voltage. The constant load discharge technique was introduced for tracking the operating photovoltage variations of the solar cells respectively based on the pristine and the surface PCBM removed blend films. During the measurement, the devices were kept in 15-cm deep water with the constant load of 10 kΩ resistance under light irradiation (100 mW $cm^2$).
Figure 19:
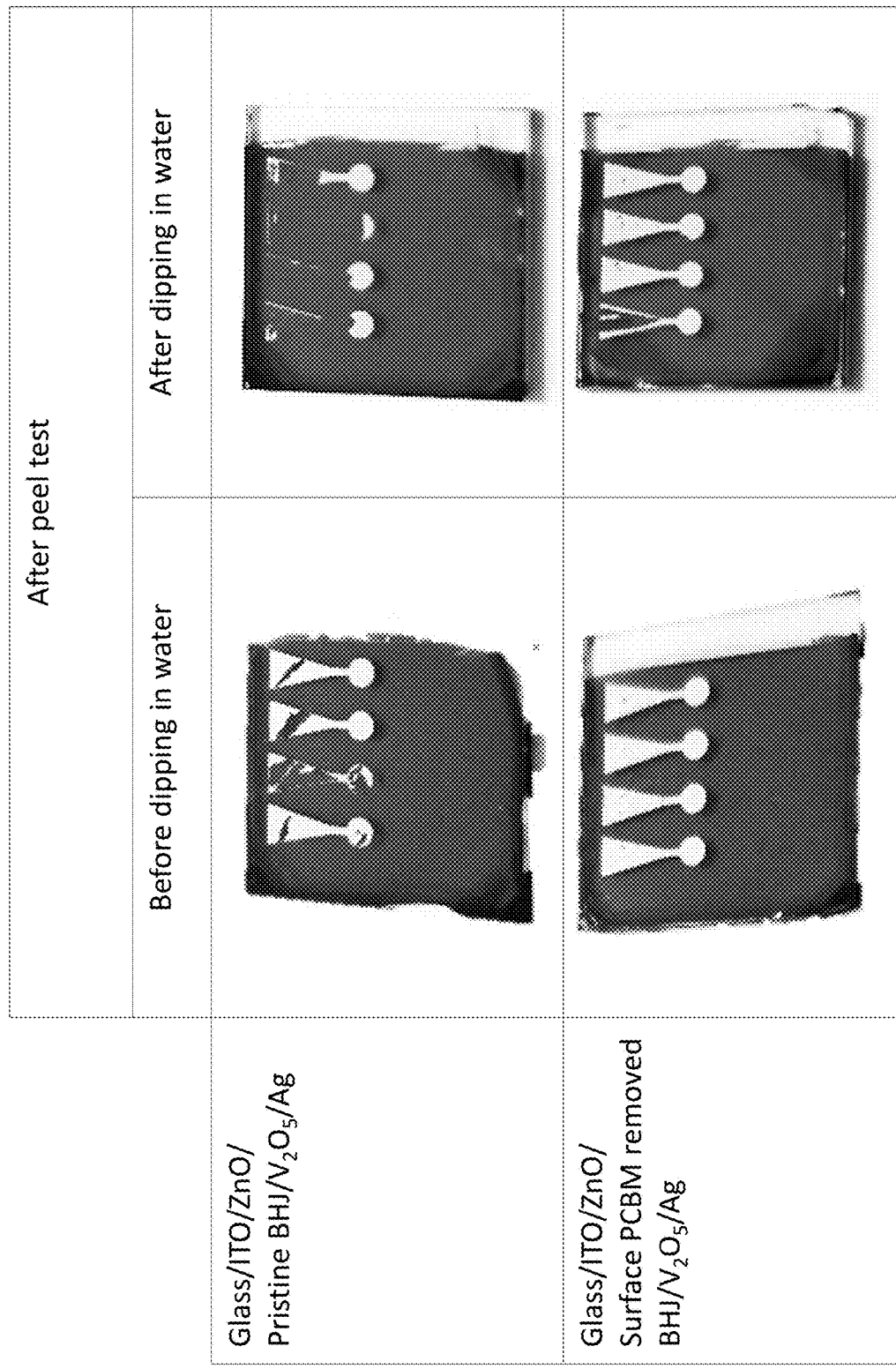
FIG. 19 is a table of photographs of peel test results for the pristine and surface PCBM removed P3HT:PCBM organic solar cells before and after the constant load discharge test under water, respectively.

Underwater constant load discharge tests were conducted to verify the reliability of the surface PCBM removed solar cell in practice. The solar cells were dipped in 15-cm deep water bath consistent with IPX7 requirements (Chalupper, et al., Hearing Review 2011, 18 (11), 56-61), and the photovoltage was continually measured under a constant load (10 kΩ) with light irradiation. The 10 kΩ resistance started to be loaded on the cells right after the first 10 seconds at open circuit voltage condition. For the pristine solar cell, the photovoltage measured under the constant load abruptly drops with stepwise decrease from 0.49 to 0.30 V over 30 minutes (FIG. 18). For the surface PCBM removed solar cell, the photovoltage measured under constant load only decreases slightly from 0.56 V to 0.55 V over the same period of time (FIG. 18). After the underwater constant load discharge tests, the top electrode of the surface PCBM removed solar cell remained robust while the top electrode of the control solar cell was easily exfoliated (FIG. 19). This exfoliation might be a reason for the abrupt device failure of the control cell.

Figure 20A:
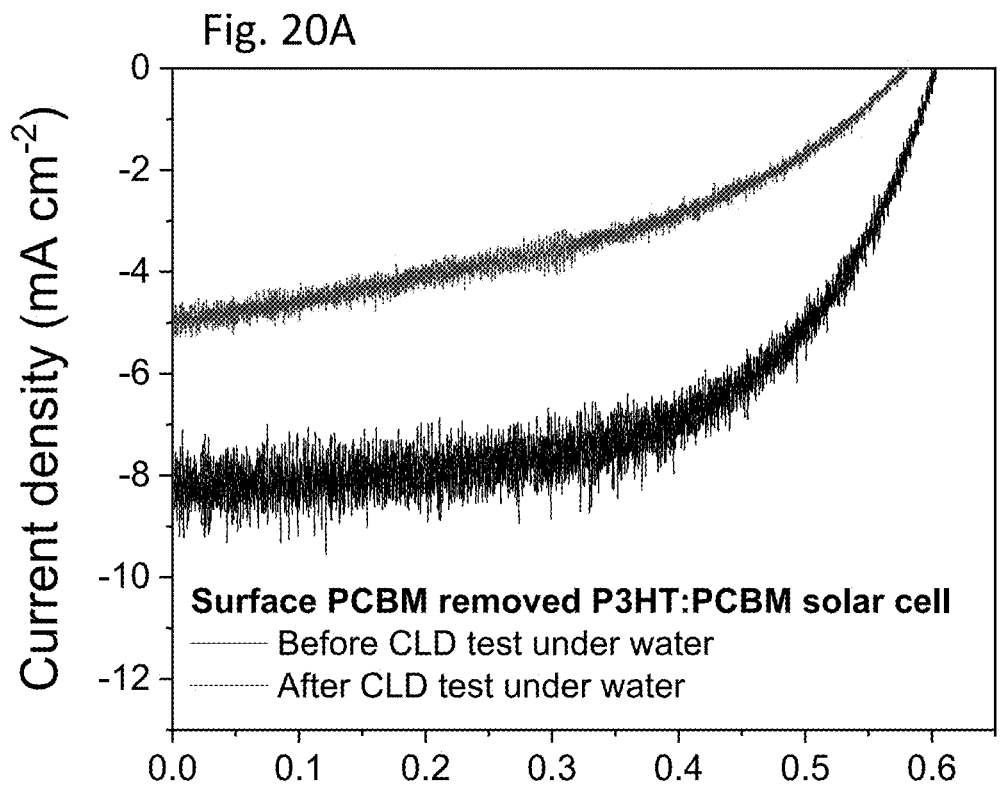
FIG. 20A depicts the changes in JV characteristics measured under water before and after constant load discharge (CLD) test under the water for a surface-PCBM-removed P3HT:PCBM solar cell.
Figure 20B:
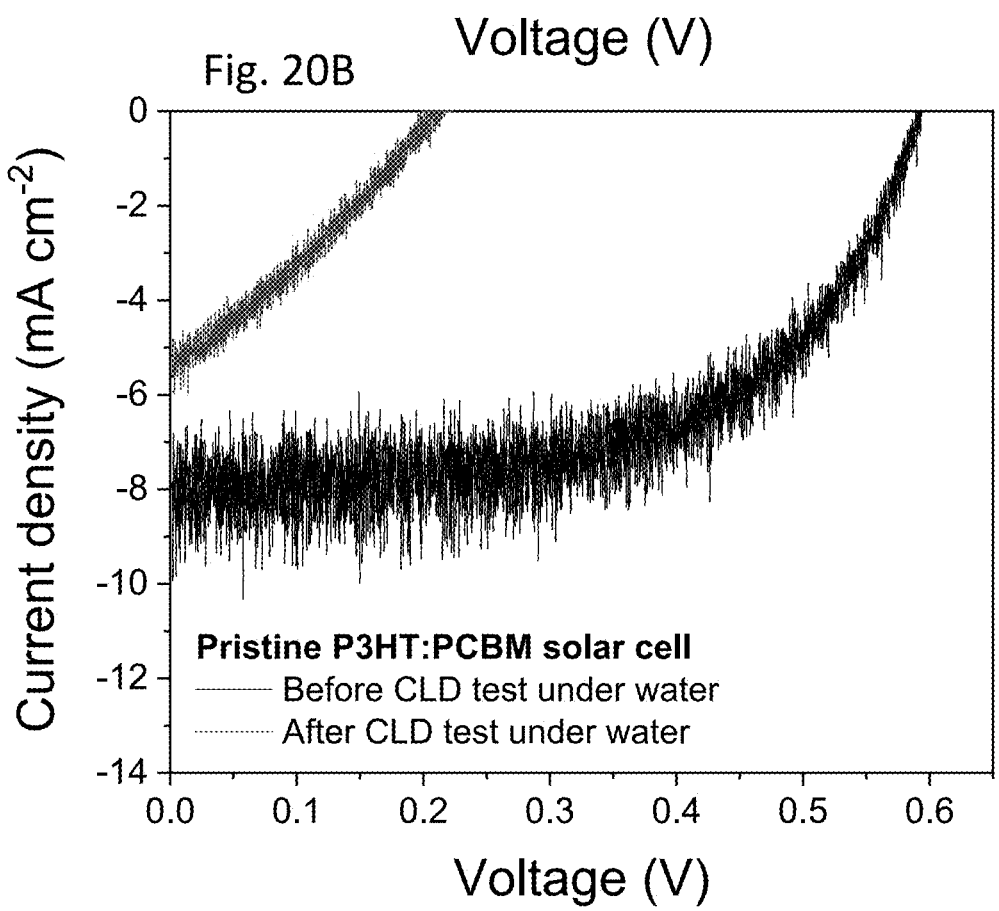
FIG. 20B depicts the changes in JV characteristics measured under water before and after constant load discharge (CLD) test under the water for a pristine P3HT:PCBM solar cell. After the CLD tests were done, the cells were stored in the water and then measured under the water again.
Figure 21:
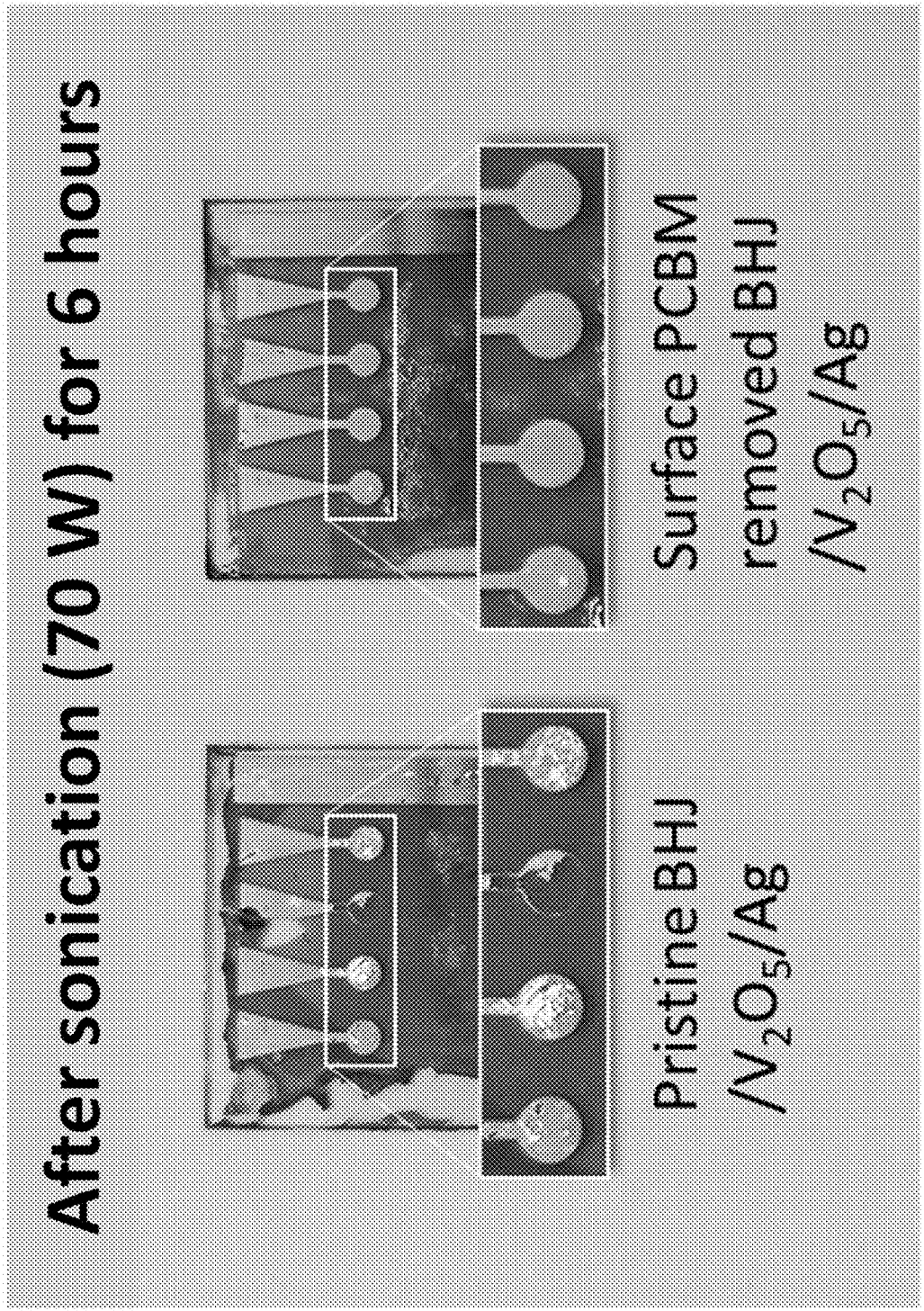
FIG. 21 shows photographs of P3HT:PCBM solar cells after sonication (42 kHz, 70 W) under the water for 6 hours.

After the constant load discharge tests under the water, the J-V characteristic curves were re-measured for the both solar cells. The surface-PCBM-removed solar cell still had a high $V_{OC}$ of ~0.58 V with a good J-V characteristic curve shape (FIG. 20A). In contrast, the control solar cell shows a significantly decreased $V_{OC}$ of ~0.21 V with a linear-like J-V characteristic curve (FIG. 20B). To simulate extremely harsh conditions, the solar cells were placed in an ultrasonic bath (42 kHz, 70 W) for 6 hours. After underwater sonication, the top electrodes of the pristine solar cell were severely damaged and exfoliated, whereas there was no macroscopic damage on the top electrodes of the surface PCBM removed solar cell. Damage was observed, however, in several spots on the exposed photoactive layer where the top electrode was not deposited (FIG. 21). These findings suggest that the surface PCBM removed solar cell has a stronger electrode adhesion even under water, and also suggest that the electrode adhesion or mechanical robustness between the photoactive layer and the top electrode is a critical attribute for underwater organic solar cell durability.

Figure 22:
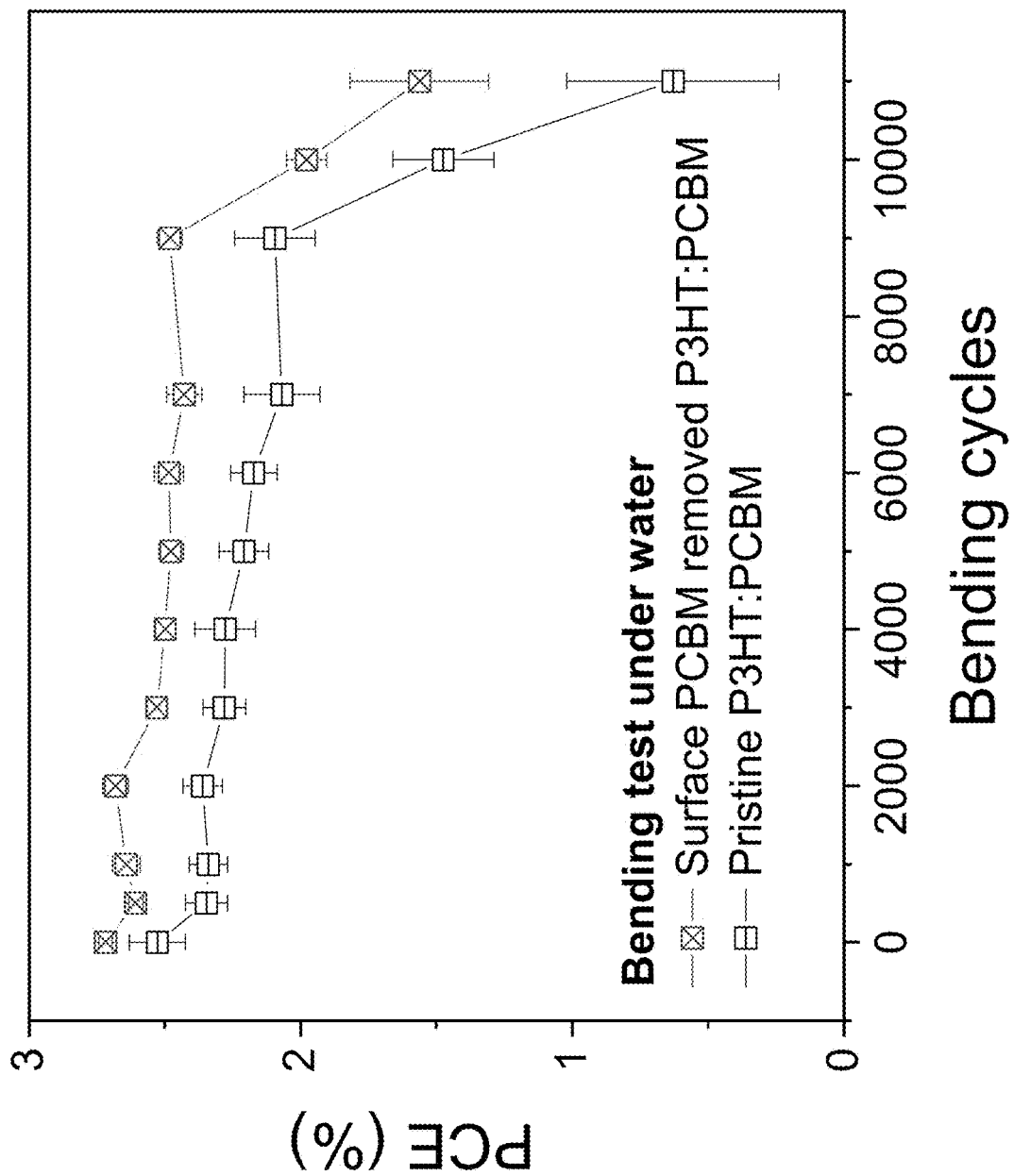
FIG. 22 depicts trends in power conversion efficiency of flexible solar cells based on P3HT:PCBM with respect to the number of bending cycle.
Figure 23A:
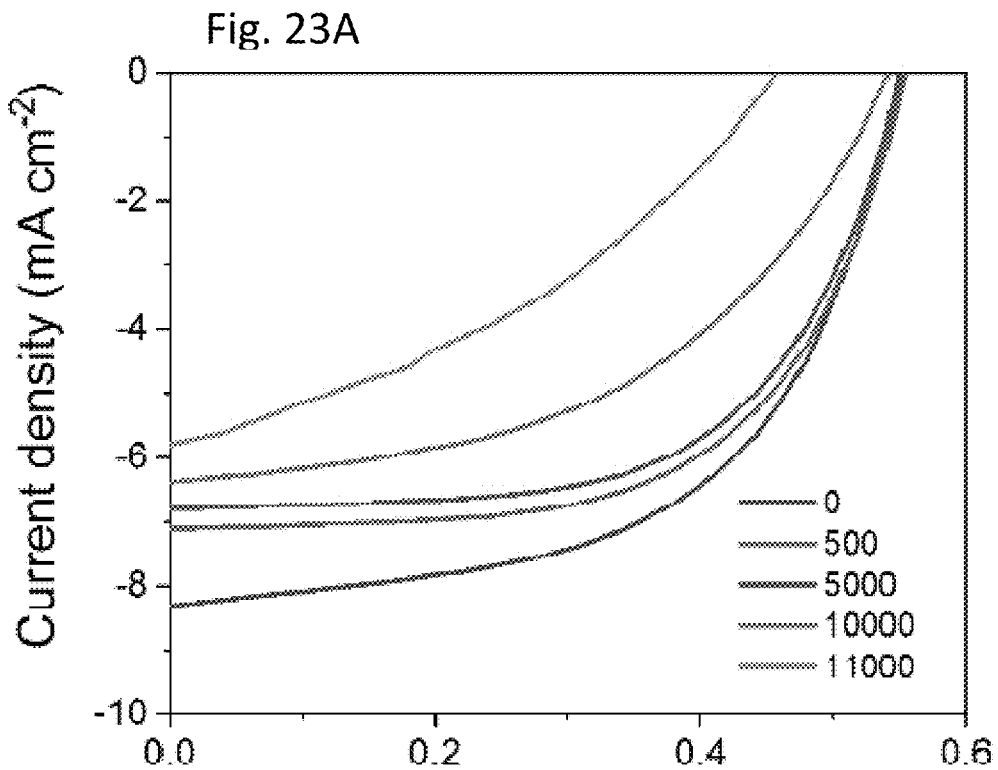
FIG. 23A shows changes in J-V characteristic curves of flexible solar cells based on pristine P3HT:PCBM with respect to the number of bending cycle.
Figure 23B:
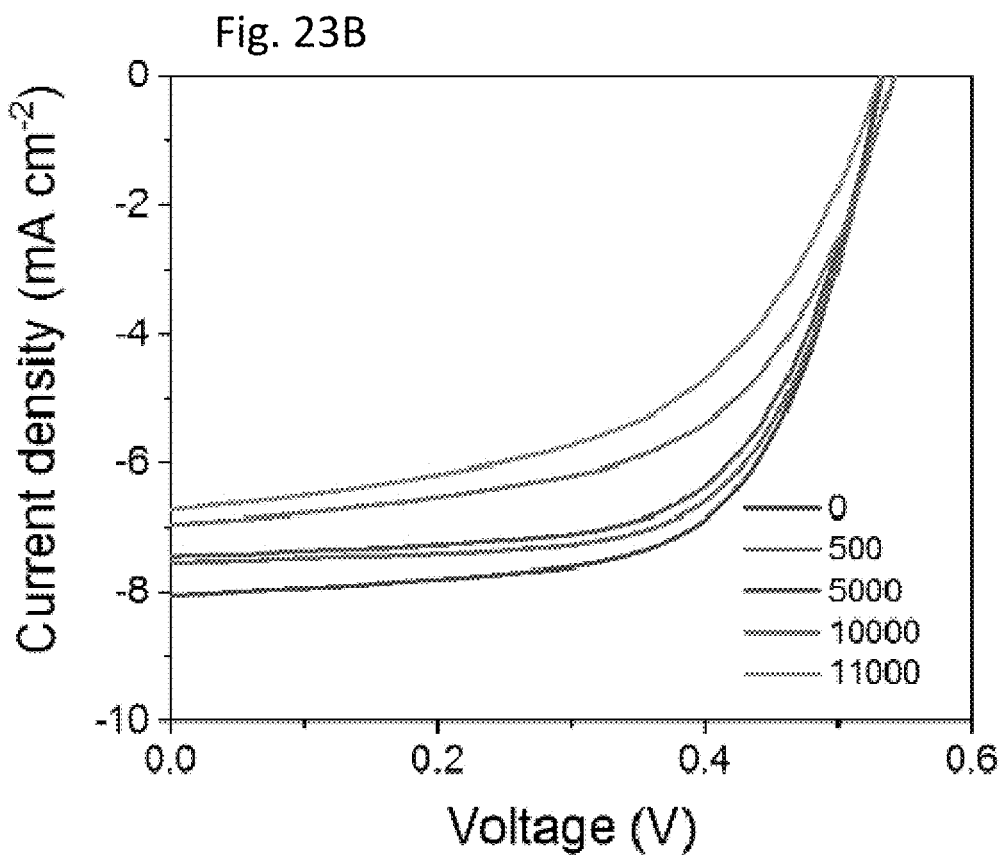
FIG. 23B shows changes in J-V characteristic curves of flexible solar cells based on surface PCBM removed P3HT:PCBM with respect to the number of bending cycle.

Flexible solar cells based on PET/ITO substrates were fabricated and subjected to cyclic bending tests under the water in order to assess the underwater mechanical durability. To avoid the cracking of the bottom ITO electrode during the bend cycle test, the bending radius was kept 15 mm (corresponding to ~0.4% of bending strain, $\varepsilon_{bending}$) until 9000 times of bend cycle, and then it was decreased up to 7 mm ($\varepsilon_{bending}$=~9%) after 9000 times of bend cycle to accelerate the degradation. FIG. 22 shows the decreases in PCE of the pristine and the surface PCBM removed solar cells with respect to the number of bending cycles. Over the first 9000 cycles, the difference in PCE between the pristine and the surface PCBM removed solar cells gradually increased by 3 times (from 6% to 18%). After 11,000 bending cycles, the difference in PCE between the two groups increased up to 148%. FIG. 23A and FIG. 23B clearly show the difference of the degradation tendencies in J-V characteristics of the two groups. The change in solar cell parameters is presented in Table 1. Notably, even after 10,000 bending cycles under the water, the surface PCBM removed solar cells maintained approximately 80% of its initial PCE while the PCE of the pristine solar cells dropped 40% under the same conditions.

TABLE 1

Flexible solar cell parameters for pristine and surface PCBM removed P3HT:PCBM blend films after bend cycle tests under water. The values in parentheses are the average of 4 cells for each case.

| | | $V_{oc}$ [V] | $J_{sc}$ [mA cm$^{-2}$] | FF | PCE [%] |
|---|---|---|---|---|---|
| P3HT:PCBM (Pristine) | 0 | 0.54 | 8.31 | 0.57 | 2.57 |
| | | (0.54) | (8.49 ± 0.30) | (0.55 ± 0.03) | (2.53 ± 0.10) |
| | 500 | 0.54 | 7.10 | 0.62 | 2.38 |
| | | (0.54 ± 0.01) | (7.40 ± 0.37) | (0.58 ± 0.05) | (2.35 ± 0.08) |
| | 1000 | 0.54 | 7.05 | 0.62 | 2.36 |
| | | (0.54) | (7.35 ± 0.38) | (0.59 ± 0.04) | (2.34 ± 0.07) |
| | 2000 | 0.54 | 7.11 | 0.62 | 2.39 |
| | | (0.54) | (7.40 ± 0.39) | (0.59 ± 0.04) | (2.36 ± 0.07) |
| | 3000 | 0.54 | 6.99 | 0.62 | 2.32 |
| | | (0.54) | (7.22 ± 0.33) | (0.59 ± 0.034) | (2.28 ± 0.08) |
| | 4000 | 0.54 | 6.93 | 0.62 | 2.32 |
| | | (0.55 ± 0.01) | (7.08 ± 0.189) | (0.53 ± 0.14) | (2.28 ± 0.11) |
| | 5000 | 0.54 | 6.79 | 0.62 | 2.28 |
| | | (0.55 ± 0.01) | (7.00 ± 0.39) | (0.58 ± 0.05) | (2.21 ± 0.05) |
| | 6000 | 0.54 | 6.80 | 0.61 | 2.24 |
| | | (0.54) | (6.95 ± 0.33) | (0.58 ± 0.04) | (2.17 ± 0.09) |
| | 7000 | 0.54 | 6.74 | 0.61 | 2.22 |
| | | (0.55 ± 0.01) | (7.07 ± 0.29) | (0.54 ± 0.06) | (2.07 ± 0.14) |
| | 9000 | 0.54 | 6.76 | 0.61 | 2.23 |
| | | (0.55 ± 0.01) | (6.78 ± 0.28) | (0.57 ± 0.06) | (2.10 ± 0.05) |
| | 10000 | 0.54 | 6.37831 | 0.49 | 1.67 |
| | | (0.52 ± 0.02) | (6.28 ± 0.25) | (0.45 ± 0.03) | (1.47 ± 0.19) |
| | 110000 | 0.44 | 5.79 | 0.38 | 0.98 |
| | | (0.33 ± 0.17) | (5.48 ± 0.36) | (0.33 ± 0.06) | (0.63 ± 0.39) |
| P3HT:PCBM (Surface PCBM removed) | 0 | 0.52 | 8.04 | 0.66 | 2.76 |
| | | (0.52) | (7.91 ± 0.2) | (0.66 ± 0.01) | (2.72 ± 0.02) |
| | 500 | 0.52 | 7.56 | 0.67 | 2.63 |
| | | (0.52) | (7.45 ± 0.5) | (0.67) | (2.61 ± 0.03) |
| | 1000 | 0.52 | 7.61 | 0.68 | 2.68 |
| | | (0.52) | (7.460 ± 0.2) | (0.68) | (2.64 ± 0.07) |
| | 2000 | 0.54 | 7.67 | 0.66 | 2.72 |
| | | (0.54) | (7.53 ± 0.2) | (0.66) | (2.68 ± 0.06) |
| | 3000 | 0.52 | 7.52 | 0.66 | 2.56 |
| | | (0.52) | (7.38 ± 0.2) | (0.66) | (2.53 ± 0.05) |
| | 4000 | 0.52 | 7.44 | 0.66 | 2.53 |
| | | (0.52) | (7.37 ± 0.2) | (0.66) | (2.50 ± 0.05) |
| | 5000 | 0.52 | 7.45 | 0.66 | 2.53 |
| | | (0.52) | (7.29 ± 0.2) | (0.66) | (2.48 ± 0.06) |
| | 6000 | 0.52 | 7.42 | 0.66 | 2.54 |
| | | (0.53 ± 0.01) | (7.23 ± 0.2) | (0.66 ± 0.01) | (2.48 ± 0.07) |
| | 7000 | 0.52 | 7.48 | 0.64 | 2.53 |
| | | (0.52) | (7.26 ± 0.3) | (0.64) | (2.43 ± 0.08) |
| | 9000 | 0.54 | 7.32 | 0.61 | 2.54 |
| | | (0.540) | (7.18 ± 0.2) | (0.64 ± 0.03) | (2.48 ± 0.06) |
| | 10000 | 0.54 | 6.93 | 0.57 | 2.02 |
| | | (0.53 ± 0.01) | (6.81 ± 0.2) | (0.55 ± 0.05) | (1.94 ± 0.1) |
| | 110000 | 0.52 | 6.73 | 0.54 | 1.89 |
| | | (0.50 ± 0.02) | (6.58 ± 0.2) | (0.48 ± 0.06) | (1.56 ± 0.3) |

Figure 24:
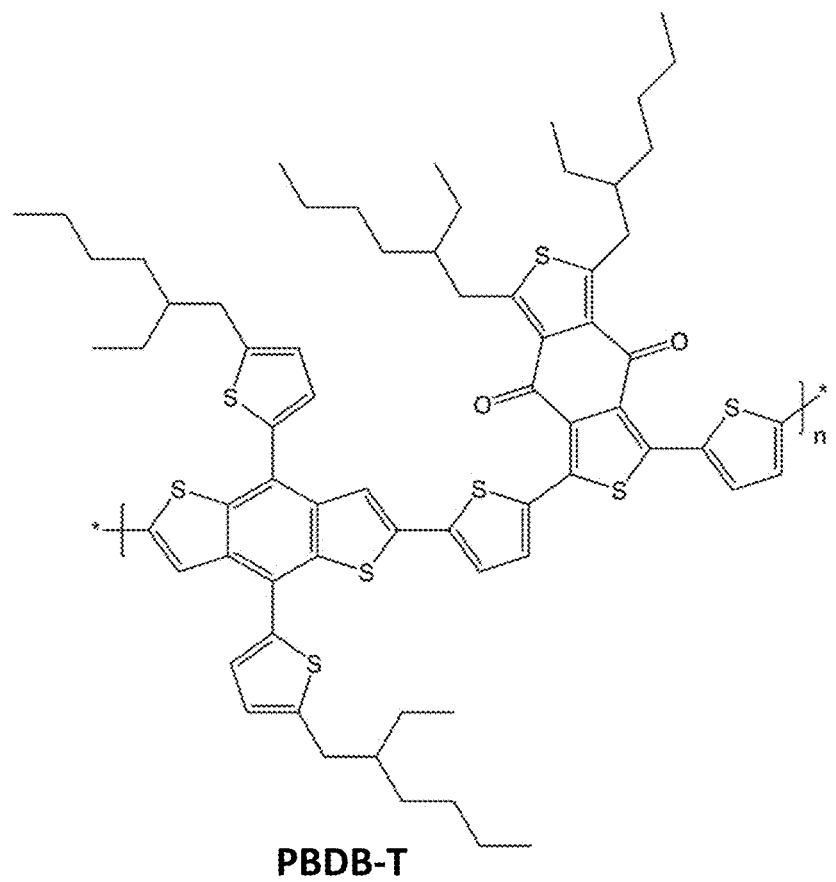
FIG. 24 shows the chemical structures of PBDB-T and IT-M.
Figure 24:
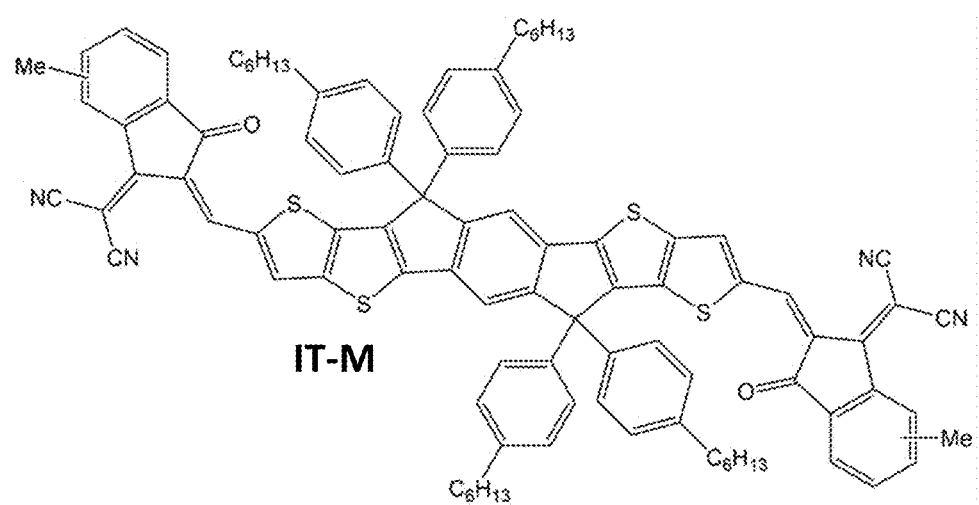
Figure 25:
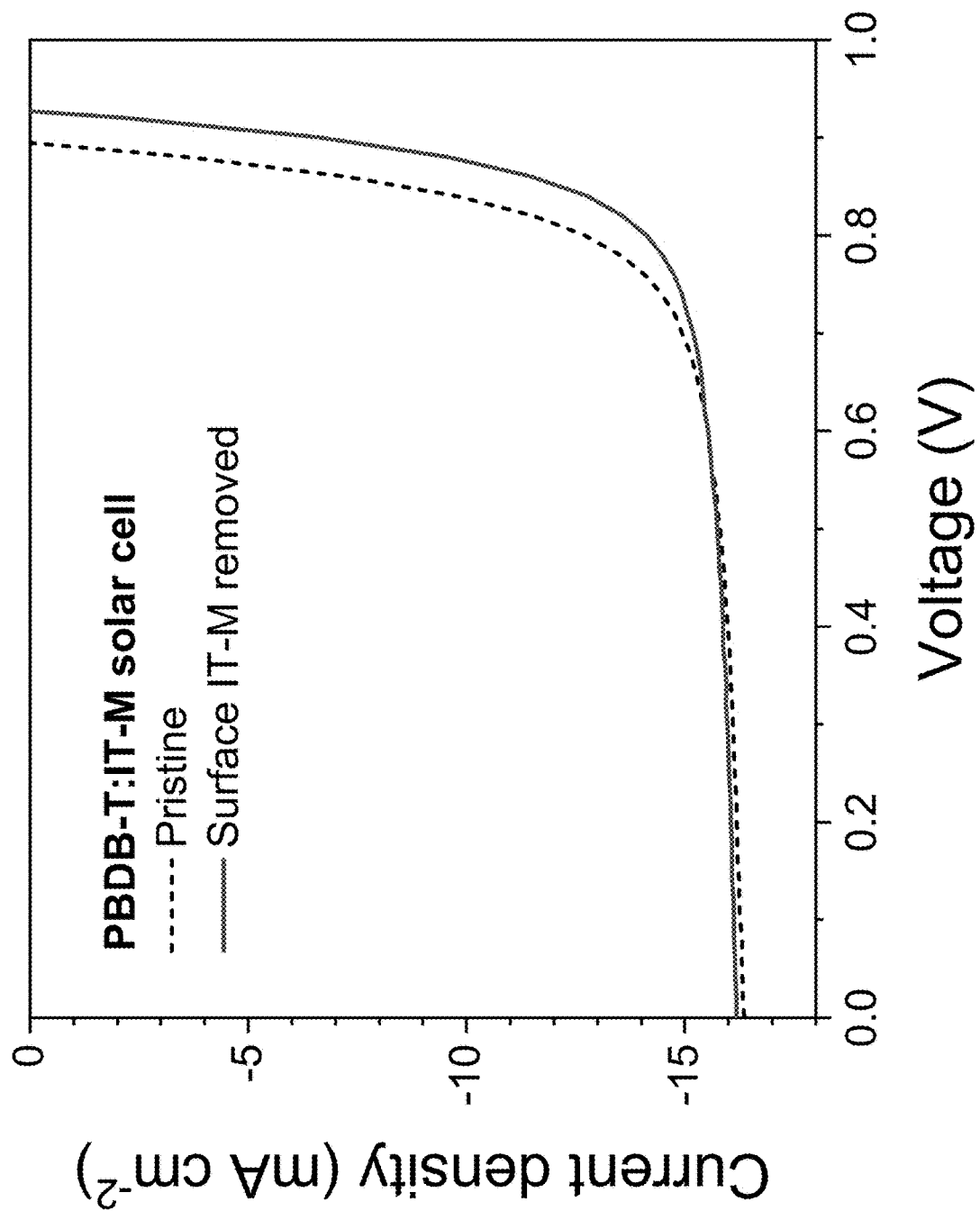
FIG. 25 shows JV characteristic curves of the pristine and the surface IT-M removed PBDB-T:IT-M solar cells. Device structure consists of glass/ITO/ZnO/PBDB-T:IT-M/$MoO_3$/Ag.

The tape stripping method can also be applied to non-fullerene-based organic solar cells. Poly[(2,6-(4,8-bis(5-(2-ethylhexyl)thiophen-2-yl)-benzo[1,2-b:4,5-b']dithiophene))-alt-(5,5-(1',3'-di-2-thienyl-5',7'-bis(2-ethylhexyl)benzo[1',2'-c:4',5'-c']dithiophene-4,8-dione)]) (PBDB-T) and 3,9-bis(2-methylene-((3-(1,1-dicyanomethylene)-6/7-methyl)-indanone))-5,5,11,11-tetrakis(4-hexylphenyl)-dithieno[2,3-d:2',3'-d']-s-indaceno[1,2-b:5,6-b']dithiophene (IT-M) (FIG. 24) were used in a representative non-fullerene based organic solar cell (Hou, et al., Nat. Mater. 2018, 17 (2), 119-128). In the PBDB-T:IT-M solar cells, a similar tendency to the P3HT:PBCM solar cells was found. When the tape stripping process was applied to the PBDB-T:IT-M solar cells, the PCE increases from 10.6±0.072% to 11.0±0.153% with an enhanced fill factor of 0.76±0.005 in the glass/ITO based solar cells (FIG. 25 and Table 2). In the flexible solar cells based on the blends, the PCE also increases from 7.36±0.187% to 8.07±0.198% upon the tape stripping process (Table 3).

TABLE 2

Solar cell parameters for pristine and surface electron acceptor removed blend films. The values in parentheses are the average of 12 cells for each case.

|  |  | $V_{oc}$ [V] | $J_{sc}$ [mA cm$^{-2}$] | FF | PCE [%] |
|---|---|---|---|---|---|
| P3HT:PCBM | Pristine | 0.60 | 9.00 | 0.56 | 3.02 |
|  |  | (0.59 ± 0.01) | (8.92 ± 0.78) | (0.54 ± 0.05) | (2.95 ± 0.21) |
|  | Surface PCBM removal | 0.61 | 8.51 | 0.69 | 3.58 |
|  |  | (0.60 ± 0.01) | (8.63 ± 0.33) | (0.66 ± 0.02) | (3.41 ± 0.11) |
| PBDB-T:IT-M | Pristine | 0.88 | 16.3 | 0.74 | 10.7 |
|  |  | (0.89 ± 0.01) | (15.7 ± 0.32) | (0.71 ± 0.03) | (10.1 ± 0.62) |
|  | Surface IT-M removal | 0.92 | 16.2 | 0.76 | 11.3 |
|  |  | (0.91 ± 0.01) | (15.9 ± 0.18) | (0.74 ± 0.02) | (10.6 ± 0.43) |

TABLE 3

Flexible solar cell parameters for pristine and surface electron acceptor removed blend films after bend cycle tests under water. The values in parentheses are the average of 3 cells for each case.

|  |  | $V_{oc}$ [V] | $J_{sc}$ [mA cm$^{-2}$] | FF | PCE [%] |
|---|---|---|---|---|---|
| PBDB-T:IT-M (Pristine) | 0 | 0.88 | 13.1 | 0.66 | 7.57 |
|  |  | (0.88) | (12.7 ± 0.3) | (0.65 ± 0.02) | (7.35 ± 0.2) |
|  | 200 | 0.88 | 12.89884 | 0.61 | 6.94 |
|  |  | (0.88) | (12.3 ± 0.5) | (0.60 ± 0.01) | (6.58 ± 0.3) |
|  | 500 | 0.88 | 12.1 | 0.57 | 6.12 |
|  |  | (0.88) | (11.8 ± 0.4) | (0.55 ± 0.05) | (5.78 ± 0.7) |
|  | 1000 | 0.88 | 10.0 | 0.46 | 4.02 |
|  |  | (0.88) | (8.77 ± 3) | (0.51 ± 0.06) | (3.39 ± 1) |
|  | 2000 | 0.82 | 6.56 | 0.40 | 2.14 |
|  |  | (0.77 ± 0.2) | (8.87 ± 2) | (0.41 ± 0.1) | (2.92 ± 1) |
| PBDB-T:IT-M (Surface IT-M removed) | 0 | 0.88 | 13.0 | 0.70 | 8.01 |
|  |  | (0.88) | (13.25 ± 0.4) | (0.69 ± 0.01) | (8.07 ± 0.2) |
|  | 200 | 0.88 | 12.5 | 0.66 | 7.30 |
|  |  | (0.88) | (12.7 ± 0.4) | (0.65 ± 0.01) | (7.3 ± 0.3) |
|  | 500 | 0.88 | 12.1 | 0.66 | 7.02 |
|  |  | (0.88) | (12.4 ± 0.4) | (0.66 ± 0.01) | (7.09 ± 0.2) |
|  | 1000 | 0.88 | 11.3 | 0.63 | 6.26 |
|  |  | (0.86 ± 0.02) | (11.5 ± 0.3) | (0.57 ± 0.06) | (5.68 ± 0.5) |
|  |  | 0.88 | 10.1 | 0.51 | 4.55 |
|  | 2000 | (0.87 ± 0.01) | (10.0 ± 1) | (0.50 ± 0.01) | (4.55 ± 0.6) |

Figure 26:
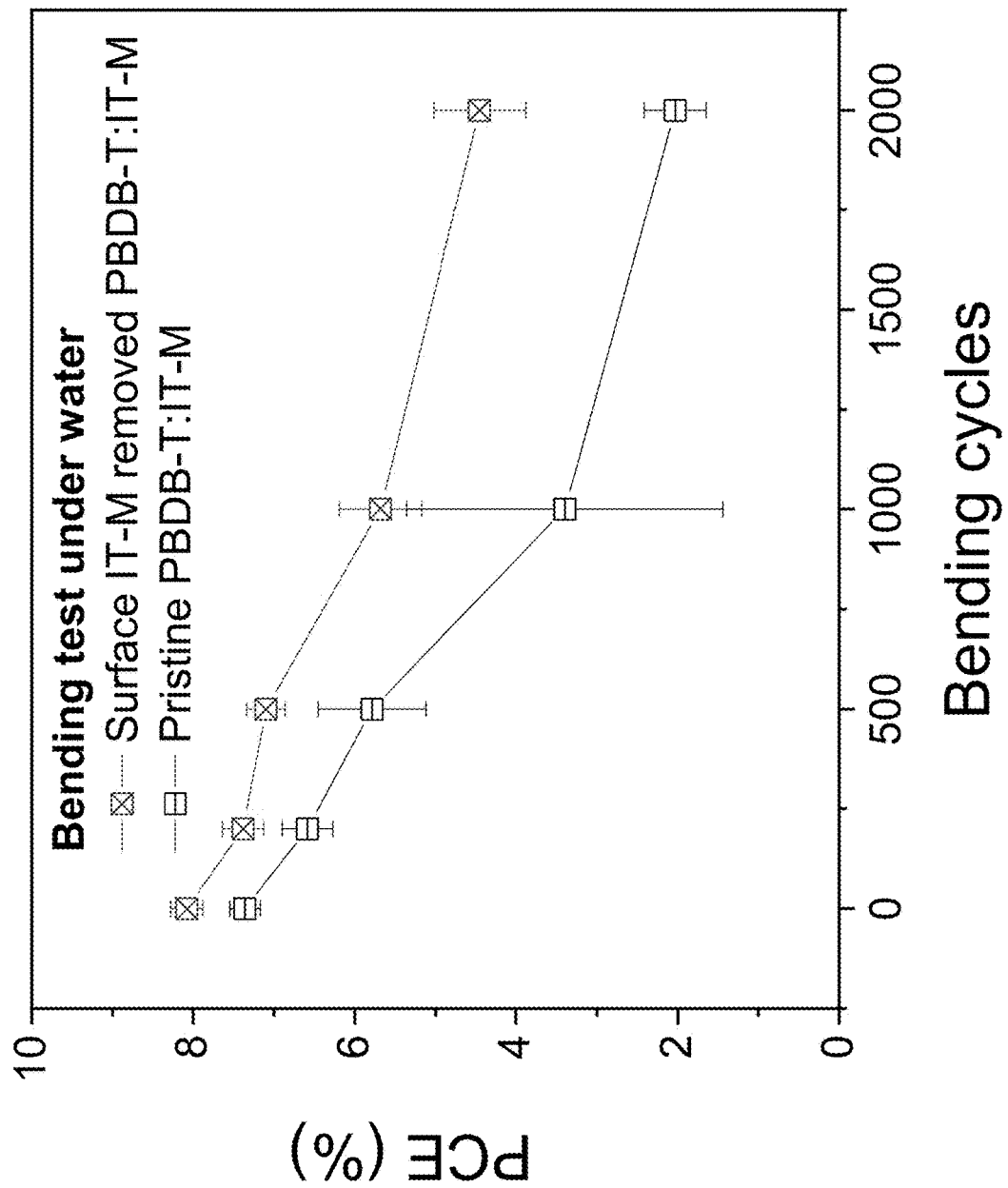
FIG. 26 depicts trends in power conversion efficiency of flexible solar cells based on PBDB-T:IT-M with respect to the number of bending cycle.
Figure 27A:
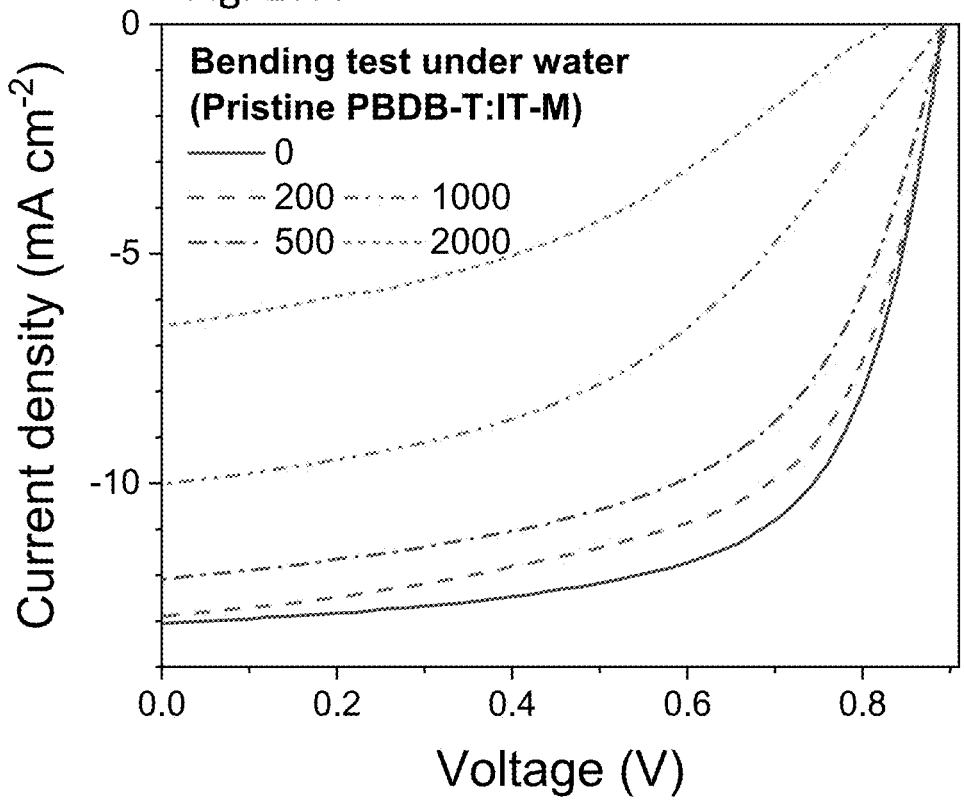
FIG. 27A shows changes in J-V characteristic curves of flexible solar cells based on pristine PBDB-T:IT-M with respect to the number of bending cycle.
Figure 27B:
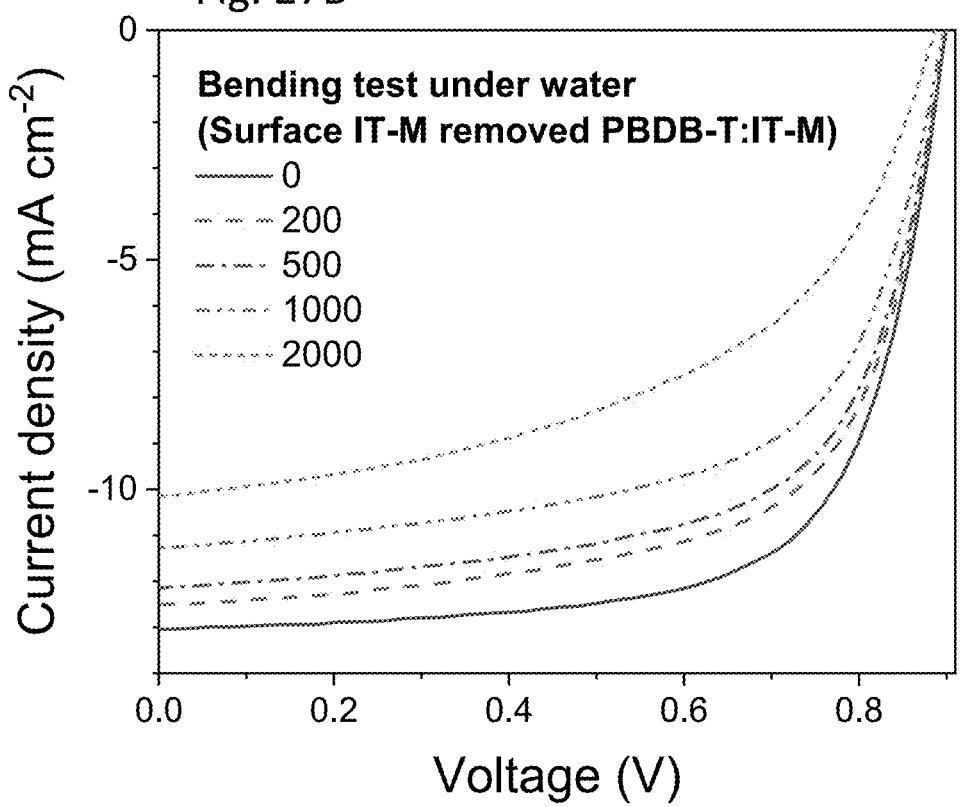
FIG. 27B shows changes in J-V characteristic curves of flexible solar cells based on surface IT-M removed PBDB-T:IT-M with respect to the number of bending cycle.
Figure 28:
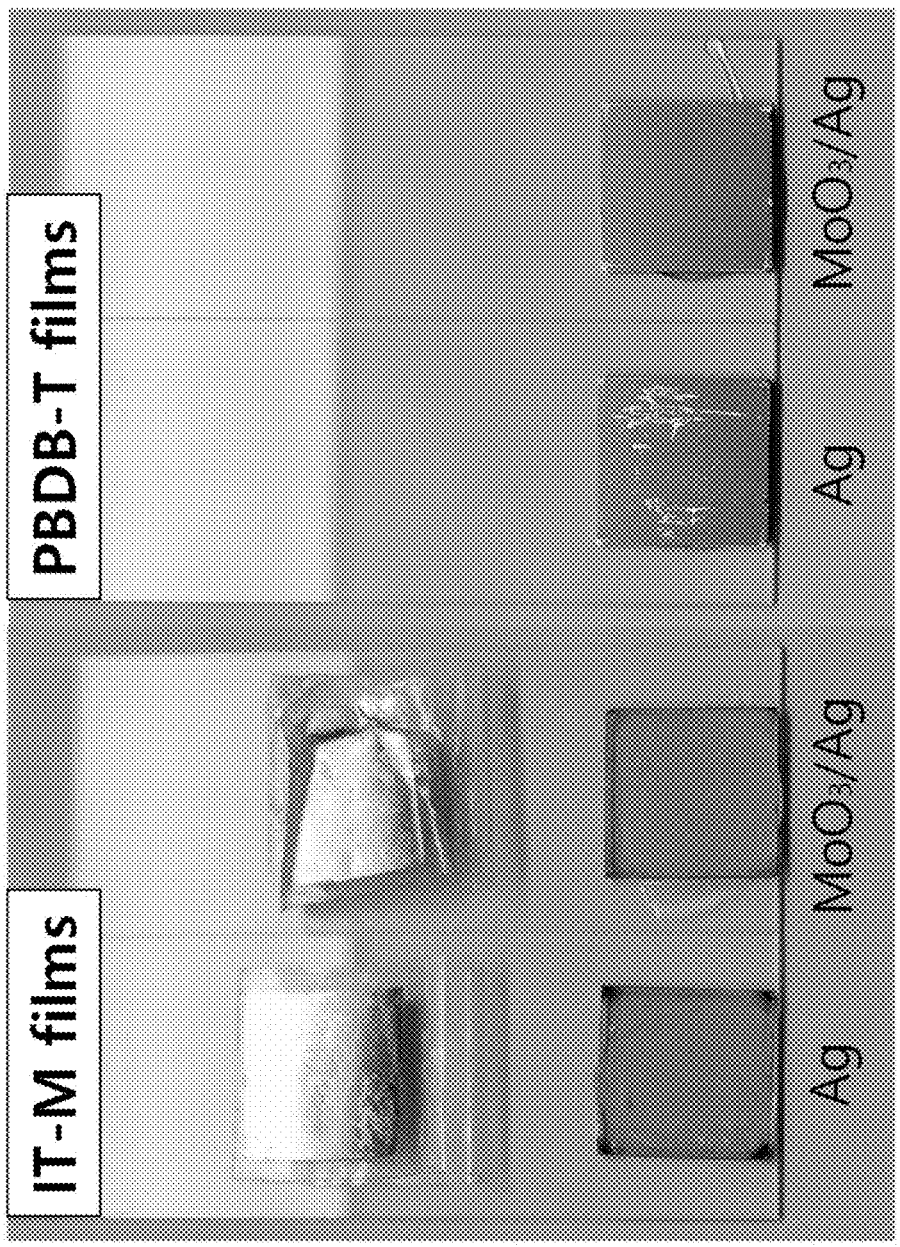
FIG. 28 is a series of photographs showing results after tape peel tests. All samples have basic device structures: Glass/ITO/ZnO/single component (IT-M or PBDB-T)/Ag or Glass/ITO/ZnO/single component (IT-M or PBDB-T)/$MoO_3$/Ag.
Figure 29:
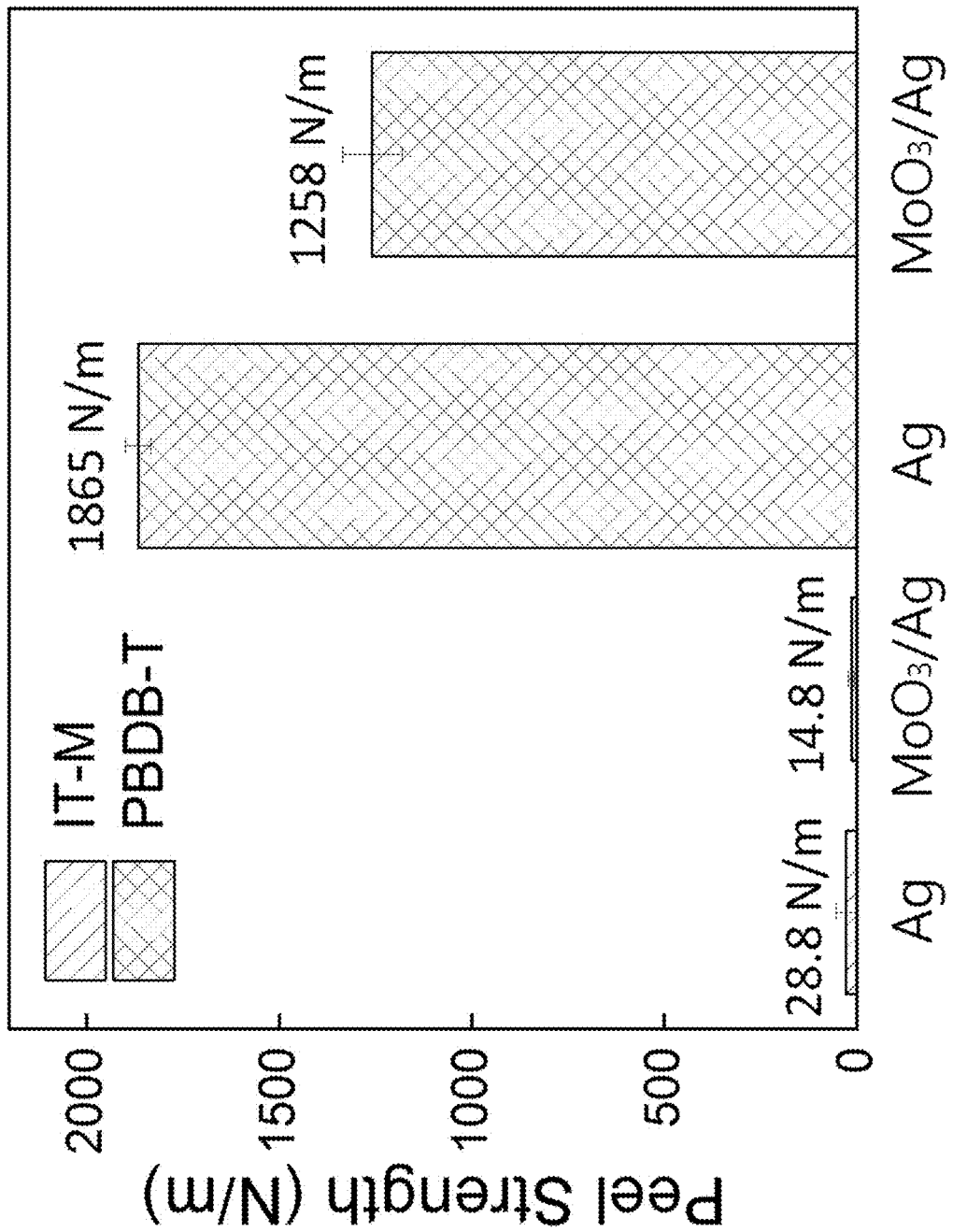
FIG. 29 is a plot showing peel strength test results for the four samples shown in FIG. 28. About 100 times differences in peel strength were found at each group of IT-M and PBDBT-T.
Figure 30:
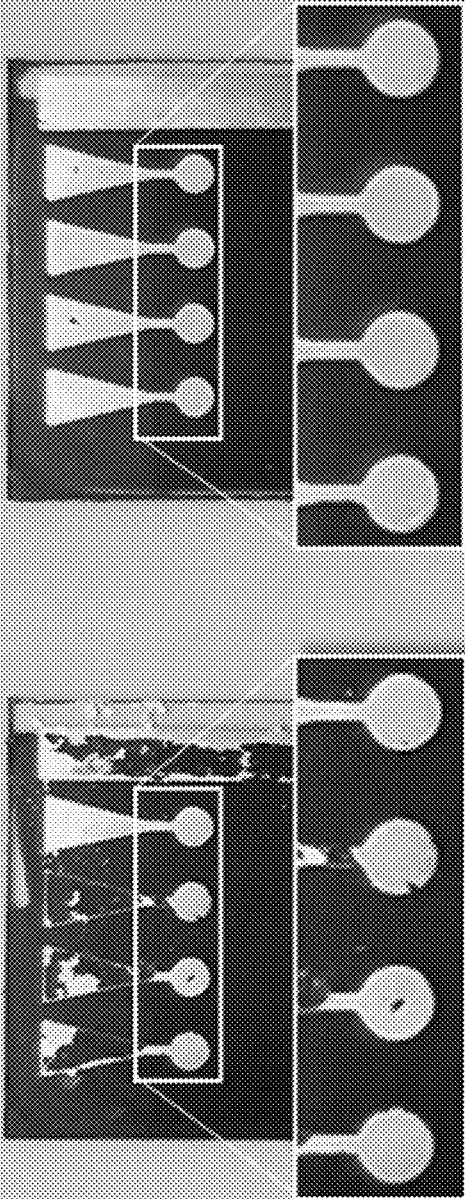
FIG. 30 is a series of photographs of PBDB-T:IT-M solar cells after sonication (42 KHz, 70 W) for 30 minutes under water.

The non-fullerene-based flexible solar cells were subjected to the previously-described underwater cyclic bending tests. FIG. 26 and Table 4 show decreasing tendencies in PCE of the pristine and the surface IT-M removed solar cells as the bending cycles increase. From both groups, the PCE decreased more rapidly compared to the P3HT:PCBM solar cells. Yet even in this non-fullerene system, the PCE slope for the surface IT-M removed group is relatively less gradual compared to that for the pristine group. As the bending cycle increases, the gap in the PCE between the pristine and the surface IT-M removed groups widens by 17 times, from 9% to 155%. After 1000 bending cycles, the surface IT-M removed solar cell group maintains about 80% of its initial PCE, whereas for the pristine solar cell group, more than half of the initial PCE is lost under the same conditions. FIG. 27A and FIG. 27B are the representative J-V characteristic curves for the pristine and surface IT-M removed solar cells, which show that the significant PCE decrease in the pristine solar cell is attributed to the reduced current and fill factor with increased series resistance. The poor durability of the pristine PBDB-T:IT-M solar cells can be attributed to the presence of the IT-M in the pristine PBDB-T:IT-M film surface, which weakens the electrode adhesion and causes exfoliation and disconnection. This finding can be further supported by the fact that the peel strength between IT-M and the top electrode (14.8 N/m) is much weaker than that between PBDB-T and top electrode (>1258 N/m) (FIG. 28 and FIG. 29). Further, ultrasonic fatigue tests in the water bath reveal that the surface IT-M removed solar cell has higher electrode adhesion durability than the pristine solar cell (FIG. 30).

tical direction, which results in higher fill factors in the inverted solar cell structure. This approach will initiate a new frontier for the development of highly durable, all-weather organic solar cells that can be operable even under the water.

The disclosures of each and every patent, patent application, and publication cited herein are hereby incorporated herein by reference in their entirety. While this invention has been disclosed with reference to specific embodiments, it is apparent that other embodiments and variations of this invention may be devised by others skilled in the art without departing from the true spirit and scope of the invention. The appended claims are intended to be construed to include all such embodiments and equivalent variations.

We claim:

1. An active layer comprising: a first surface, a bulk region and a second surface, the active layer comprising at least one small molecule component and at least one polymer component,
    wherein a weight ratio of the at least one small molecule component to the at least one polymer component the active layer is less than 1.0,
    wherein the root mean square surface roughness of the first surface between 2.74 nm and 3.01 nm; wherein the weight ratio of the at least one small molecule component to the at least one polymer component is lower on the first surface than in the bulk region; and
    wherein the weight ratio of the at least one small molecule component to the at least one polymer component on the first surface is between 15:85 and 1:99.

TABLE 4

Flexible solar cell parameters for pristine and surface electron acceptor removed blend films after bend cycle tests under water. The values in parentheses are the average of 3 cells for each case.

| | | $V_{oc}$ [V] | $J_{sc}$ [mA cm$^{-2}$] | FF | PCE [%] |
|---|---|---|---|---|---|
| PBDB-T: IT-M (Pristine) | 0 | 0.88 | 13.1 | 0.66 | 7.57 |
| | | (0.88) | (12.7 ± 0.3) | (0.65 ± 0.02) | (7.35 ± 0.2) |
| | 200 | 0.88 | 12.89884 | 0.61 | 6.94 |
| | | (0.88) | (12.3 ± 0.5) | (0.60 ± 0.01) | (6.58 ± 0.3) |
| | 500 | 0.88 | 12.1 | 0.57 | 6.12 |
| | | (0.88) | (11.8 ± 0.4) | (0.55 ± 0.05) | (5.78 ± 0.7) |
| | 1000 | 0.88 | 10.0 | 0.46 | 4.02 |
| | | (0.88) | (8.77 ± 3) | (0.51 ± 0.06) | (3.39 ± 1) |
| | 2000 | 0.82 | 6.56 | 0.40 | 2.14 |
| | | (0.77 ± 0.2) | (8.87 ± 2) | (0.41 ± 0.1) | (2.92 ± 1) |
| PBDB-T: IT-M (Surface IT-M removed) | 0 | 0.88 | 13.0 | 0.70 | 8.01 |
| | | (0.88) | (13.25 ± 0.4) | (0.69 ± 0.01) | (8.07 ± 0.2) |
| | 200 | 0.88 | 12.5 | 0.66 | 7.30 |
| | | (0.88) | (12.7 ± 0.4) | (0.65 ± 0.01) | (7.3 ± 0.3) |
| | 500 | 0.88 | 12.1 | 0.66 | 7.02 |
| | | (0.88) | (12.4 ± 0.4) | (0.66 ± 0.01) | (7.09 ± 0.2) |
| | 1000 | 0.88 | 11.3 | 0.63 | 6.26 |
| | | (0.86 ± 0.02) | (11.5 ± 0.3) | (0.57 ± 0.06) | (5.68 ± 0.5) |
| | 2000 | 0.88 | 10.1 | 0.51 | 4.55 |
| | | (0.87 ± 0.01) | (10.0 ± 1) | (0.50 ± 0.01) | (4.55 ± 0.6) |

In summary, the selective removal of the electron acceptor component (e.g., PCBM or non-fullerene acceptor IT-M) from a photoactive blend film surface using a facile tape stripping technique not only minimizes the direct exposure of the electron acceptors to the oxygen or water molecules, but also significantly enhances the adhesion between the photoactive layer and the top electrode. The optimized blend films after the tape stripping exhibits higher durability under harsh ultrasonic conditions and bending stress tests under the water. Moreover, removing the surface electron acceptor component optimizes the blend film morphology in a ver- 2. The active layer of claim 1, wherein the at least one small molecule component comprises a fullerene derivative.

3. The active layer of claim 1, wherein the at least one small molecule component comprises an n-type small molecule selected from the group consisting of 3,9-bis(2-methylene-(3-(1,1-dicyanomethylene)-indanone))-5,5,11,11-tetrakis(4-hexylphenyl)-dithieno[2,3-d:2',3'-d']-s-indaceno[1,2-b:5,6-b']dithiophene (ITIC), 3,9-bis(2-methylene-((3-(1,1-dicyanomethylene)-6/7-methyl)-indanone))-5,5,11,11-tetrakis(4-hexylphenyl)-dithieno[2,3-d:2',3'-d']-s-indaceno[1,2-b:5,6-b']dithiophene (IT-M or ITIC-M), 3,9-bis(2- methylene-(3-(1,1-dicyanomethylene)-indanone))-5,5,11,11-tetrakis(5-hexylthienyl)-dithieno[2,3-d:2',3'-d']-s-indaceno[1,2-b:5,6-b']dithiophene (ITIC-Th), 3,9-bis(2-methylene-((3-(1,1-dicyanomethylene)-6,7-difluoro)-indanone))-5,5,11,11-tetrakis(4-hexylphenyl)-dithieno[2,3-d:2',3'-d']-s-indaceno[1,2-b:5,6-b']dithiophene (ITIC-2F), and 3,9-bis(2-methylene-((3-(1,1-dicyanomethylene)-6,7-dimethyl)-indanone))-5,5,11,11-tetrakis(4-hexylphenyl)-dithieno[2,3-d:2',3'-d']-s-indaceno[1,2-b:5,6-b']dithiophene (ITIC-DM).

4. The active layer of claim 1, wherein the at least one polymer component comprises an electron donor polymer.

5. The active layer of claim 1, wherein the at least one polymer component is selected from the group consisting of poly(3-hexylthiophene) (P3HT), poly[4,8-bis-(2-ethyl-hexyl-thiophene-5-yl)-benzo[1,2-b:4,5-b']dithiophene-2,6-diyl]-alt-[2-(2'-ethyl-hexanoyl)-thieno[3,4-b]thiophen-4,6-diyl](PBDTTT-CT), poly[N-9'-hepta-decanyl-2,7-carbazole-alt-5,5-(4',7'-di-2-thienyl-2',1',3'-enzothiadiazole)] (PCDTBT), poly[6-fluoro-2,3-bis-(3-octyloxyphenyl) quinoxaline-5,8-diyl-alt-thiophene-2,5-diyl] (FTQ), poly(3-octylthiophene) (P3 T), poly(3-hexyloxythiophene) (P3DOT), poly(3-methylthiophene) (PMeT), poly(3-dodecylthiophene) (P3DDT), poly(3-dodecylthienylenevinylene) (PDDTV), poly(3,3 dialkylquarterthiophene) (PQT), poly-dioctyl-fluorene-co-bithiophene (F8T2), Poly[[4,8-bis[(2-ethylhexyl)oxy]benzo[1,2-b:4,5-b']dithiophene-2,6-diyl][3-fluoro-2-[(2-ethylhexyl)carbonyl]thieno[3,4-b]thiophenediyl]](PTB7), poly-(2,5,-bis(3-alkylthiophene-2-yl)thieno[3,2-b]thiophene) (PBTTT-C12), poly[2,7-(9,9'-dihexylfluorene)-alt-2,3-dimethyl-5,7-dithien-2-yl-2,1,3-benzothiadiazole](PFDDTBT), poly{[2,7-(9,9-bis-(2-ethylhexyl)-fluorene)]-alt-[5,5-4,7-di-20-thienyl-2,1,3-benzothiadiazole)]} (BisEH-PFDTBT), poly {[2,7-(9,9-bis-(3,7-dimethyl-octyl)-fluorene)]-alt-[5,5-(4,7-di-20-thienyl-2,3-benzothiadiazole)]} (BisDMO-PFDTBT), poly[N-9'''-hepta-decanyl-2,7-carbazole-alt-5,5-(4',7'-di-2-thienyl-2',1',3'-benzothiadiazole)](PCDT3BT), poly[4,8-bis-substituted-benzo[1,2-b:4,5-b']dithiophene-2,6-diyl-alt-4-substituted-thieno[3,4-b]thio-phene-2,6-diyl] (PBDTTT-C-T), Poly(benzo[1,2-b:4,5-b']dithiophene-alt-thieno[3,4-c]pyrrole-4,6-dione (PBDTTPD), poly((4,4-dioctyldithieno(3,2-b:2',3'-d)silole)-2,6-diyl-alt-(2,1,3-benzothiadiazole)-4,7-diyl) (PSBTBT), poly[(2,6-(4,8-bis(5-(2-ethylhexyl)thiophen-2-yl)-benzo[1,2-b:4,5-b']dithiophene))-alt-(5,5-(1',3'-di-2-thienyl-5',7'-bis(2-ethylhexyl)benzo[1',2'-c:4',5'-c']dithiophene-4,8-dione)]) (PBDB-T), poly[4,8-bis(5-(2-ethylhexyl)thiophen-2-yl)benzo[1,2-b;4,5-b]dithiophene-2,6-diyl-alt-(4-(2-ethylhexyl)-3-fluorothieno[3,4-b]thiophene-)-2-carboxylate-2-6-diyl)] (PTB7-Th), poly[(5,6-difluoro-2,1,3-benzothiadiazol-4,7-diyl)-alt-(3,3'''-di(2-octyldodecyl)-2,2',5',2''',5''',2''''-quaterthiophen-5,5'''-diyl)] (PffBT4T-20D), poly[(2,5-bis(2-hexyldecyloxy)phenylene)-alt-(5,6-difluoro-4,7-di(thiophen-2-yl)benzo[c]-[1,2,5]thiadiazole)] (PPDT2FBT), Poly[2-(5-(4,8-bis(5-((2-butyloctyl)thio)thiophen-2-yl)benzo[1,2-b:4,5-b']dithiophen-2-yl)-4-octylthiophen-2-yl)-5-(4-octylthiophen-2-yl)-1,3,4-thiadiazole] (PBDTS-TDZ), Poly[2,5-(2-decyltetradecyl)-3,6-diketopyrrolopyrrole-alt-5,5-(2,5-di(thien-2-yl)thieno[3,2-b]thiophene)] (PDPPTT), Poly[2,5-(2-octyldodecyl)-3,6-diketopyrrolopyrrole-alt-5,5-(2,5-di(thien-2-yl)thieno [3,2-b]thiophene)] (PDPP2T-TT-OD), and poly {1-(5-(4,8-bis((2-ethylhexyl)oxy)-6-methylbenzo[1,2-b:4,5-b0]dithiophen-2-yl)thiophen-2-yl)-5,7-bis-(2-ethylhexyl)-3-(5-methylthiophen-2-yl)benzo[1,2-c:4,5-c0]dithiophene-4,8-dione} (PDBD-O).

6. A submersible photovoltaic device comprising the active layer of claim 1.

7. A photovoltaic device comprising: a transparent or semi-transparent first electrode;
the active layer of claim 1 disposed over the transparent or semi-transparent first electrode; and
a second electrode disposed over the first surface of the active layer.

8. The photovoltaic device of claim 7, further comprising a charge transporting material between the second electrode and the first surface of the active layer.

9. The photovoltaic device of claim 7, wherein the photovoltaic device maintains at least 80% of its power conversion efficiency (PCE) after 9,000 bend cycles under water at a bending radius of 15 mm.

10. A method of converting sunlight deposited over bodies of water into electrical energy, the method comprising the steps of:
providing the photovoltaic device of claim 8;
submerging the photovoltaic device under water; and
producing electrical energy using the submerged photovoltaic device.

11. The method of claim 10, wherein the step of submerging the photovoltaic device under water further comprises the step of attaching the photovoltaic device to a submersible surface.

12. The active layer of claim 1, wherein the at least one polymer component is selected from the group consisting of poly[4,8-bis-(2-ethyl-hexyl-thiophene-5-yl)-benzo[1,2-b:4,5-b']dithiophene-2,6-diyl]-alt-[2-(2'-ethyl-hexanoyl)-thieno [3,4-b]thiophen-4,6-diyl](PBDTTT-CT), poly[N-9'-hepta-decanyl-2,7-carbazole-alt-5,5-(4',7'-di-2-thienyl-2',1',3'-enzothiadiazole)] (PCDTBT), poly[6-fluoro-2,3-bis-(3-octyloxyphenyl) quinoxaline-5,8-diyl-alt-thiophene-2,5-diyl] (FTQ), poly(3-octylthiophene) (P3 T), poly(3-hexyloxythiophene) (P3DOT), poly(3-methylthiophene) (PMeT), poly(3-dodecylthiophene) (P3DDT), poly(3-dodecylthienylenevinylene) (PDDTV), poly(3,3 dialkylquarterthiophene) (PQT), poly-dioctyl-fluorene-co-bithiophene (F8T2), Poly[[4,8-bis[(2-ethylhexyl)oxy]benzo[1,2-b:4,5-b']dithiophene-2,6-diyl][3-fluoro-2-[(2-ethylhexyl)carbonyl]thieno[3,4-b]thiophenediyl]](PTB7), poly-(2,5,-bis(3-alkylthiophene-2-yl)thieno[3,2-b]thiophene) (PBTTT-C12), poly[2,7-(9,9'-dihexylfluorene)-alt-2,3-dimethyl-5,7-dithien-2-yl-2,1,3-benzothiadiazole](PFDDTBT), poly{[2,7-(9,9-bis-(2-ethylhexyl)-fluorene)]-alt-[5,5-4,7-di-20-thienyl-2,1,3-benzothiadiazole)]} (BisEH-PFDTBT), poly {[2,7-(9,9-bis-(3,7-dimethyl-octyl)-fluorene)]-alt-[5,5-(4,7-di-20-thienyl-2,3-benzothiadiazole)]} (BisDMO-PFDTBT), poly[N-9''-hepta-decanyl-2,7-carbazole-alt-5,5-(4',7'-di-2-thienyl-2',1',3'-benzothiadiazole)](PCDT3BT), poly[4,8-bis-substituted-benzo[1,2-b:4,5-b']dithiophene-2,6-diyl-alt-4-substituted-thieno[3,4-b]thio-phene-2,6-diyl] (PBDTTT-C-T), Poly(benzo[1,2-b:4,5-b']dithiophene-alt-thieno[3,4-c]pyrrole-4,6-dione (PBDTTPD), poly((4,4-dioctyldithieno(3,2-b:2',3'-d)silole)-2,6-diyl-alt-(2,1,3-benzothiadiazole)-4,7-diyl) (PSBTBT), poly[(2,6-(4,8-bis(5-(2-ethylhexyl)thiophen-2-yl)-benzo[1,2-b:4,5-b']dithiophene))-alt-(5,5-(1',3'-di-2-thienyl-5',7'-bis(2-ethylhexyl)benzo[1',2'-c:4',5'-e]dithiophene-4,8-dione)]) (PBDB-T), poly[4,8-bis(5-(2-ethylhexyl)thiophen-2-yl)benzo[1,2-b;4,5-b]dithiophene-2,6-diyl-alt-(4-(2-ethylhexyl)-3-fluorothieno[3,4-b]thiophene-)-2-carboxylate-2-6-diyl)] (PTB7-Th), poly[(5,6-difluoro-2,1,3-benzothiadiazol-4,7-diyl)-alt-(3,3'''-di(2-octyldodecyl)-2,2',5',2''',5''',2''''-quaterthiophen-5,5'''-diyl)]

(PffBT4T-20D), poly[(2,5-bis(2-hexyldecyloxy)phenylene)-alt-(5,6-difluoro-4,7-di(thiophen-2-yl)benzo[c]-[1,2,5]thiadiazole)] (PPDT2FBT), Poly[2-(5-(4,8-bis(5-((2-butyloctyl)thio)thiophen-2-yl)benzo[1,2-b:4,5-b']dithiophen-2-yl)-4-octylthiophen-2-yl)-5-(4-octylthiophen-2-yl)-1,3,4-thiadiazole] (PBDTS-TDZ), Poly[2,5-(2-decyltetradecyl)-3,6-diketopyrrolopyrrole-alt-5,5-(2,5-di(thien-2-yl)thieno[3,2-b]thiophene)] (PDPPTT), Poly[2,5-(2-octyldodecyl)-3,6-diketopyrrolopyrrole-alt-5,5-(2,5-di(thien-2-yl)thieno [3,2-b]thiophene)] (PDPP2T-TT-OD), and poly{1-(5-(4,8-bis((2-ethylhexyl)oxy)-6-methylbenzo[1,2-b:4,5-b0]dithiophen-2-yl)thiophen-2-yl)-5,7-bis-(2-ethylhexyl)-3-(5-methylthiophen-2-yl)benzo[1,2-c:4,5-c0]dithiophene-4,8-dione} (PDBD-O).

\* \* \* \* \*